United States Patent
Reinert et al.

(10) Patent No.: US 9,912,115 B2
(45) Date of Patent: Mar. 6, 2018

(54) METHOD OF PRODUCING A CAP SUBSTRATE, AND PACKAGED RADIATION-EMITTING DEVICE

(71) Applicant: Fraunhofer-Gesellschaft zur Foerderung der angewandten Forschung e.V., Munich (DE)

(72) Inventors: Wolfgang Reinert, Nindorf (DE); Hans Joachim Quenzer, Itzehoe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/173,110

(22) Filed: Jun. 3, 2016

(65) Prior Publication Data

US 2016/0285232 A1    Sep. 29, 2016

Related U.S. Application Data

(63) Continuation of application No. PCT/EP2014/076271, filed on Dec. 2, 2014.

(30) Foreign Application Priority Data

Dec. 3, 2013    (DE) .................. 10 2013 113 364
Feb. 6, 2014    (DE) .................. 10 2014 202 220

(51) Int. Cl.
*H01L 21/00*    (2006.01)
*H01L 21/30*    (2006.01)
(Continued)

(52) U.S. Cl.
CPC .......... *H01S 5/02208* (2013.01); *C03B 23/02* (2013.01); *C03B 23/20* (2013.01);
(Continued)

(58) Field of Classification Search
CPC ......... H01L 33/58; H01L 24/32; H01L 33/00; H01L 33/56
(Continued)

(56) References Cited

U.S. PATENT DOCUMENTS 6,743,656 B2 *   6/2004   Orcutt ................... B81B 7/007
                                                  257/E23.193
6,958,846 B2 *  10/2005   Huibers ................ B82Y 30/00
                                                  348/E5.142

(Continued)

FOREIGN PATENT DOCUMENTS

DE          10118529 C1    10/2002
DE          10241390 B3     4/2004
(Continued)

*Primary Examiner* — Sheikh Maruf
(74) *Attorney, Agent, or Firm* — Perkins Coie, LLP; Michael A. Glenn

(57) ABSTRACT

The invention relates to methods of producing a cap substrate, to methods of producing a packaged radiation-emitting device at the wafer level, and to a radiation-emitting device. By producing a cap substrate, providing a device substrate in the form of a wafer including a multitude of radiation-emitting devices, arranging the substrates one above the other such that the substrates are bonded along an intermediate bonding frame, and dicing the packaged radiation-emitting devices, improved packaged radiation-emitting devices are provided which are advantageously arranged within a cavity free from organics and can be examined, still at the wafer level, in terms of their functionalities in a simplified manner prior to being diced.

26 Claims, 34 Drawing Sheets

(51) Int. Cl.

| | | |
|---|---|---|
| *H01L 23/52* | (2006.01) | |
| *H01S 5/022* | (2006.01) | |
| *H01L 33/58* | (2010.01) | |
| *H01S 5/40* | (2006.01) | |
| *C03B 23/02* | (2006.01) | |
| *C03B 23/20* | (2006.01) | |
| *H01L 23/00* | (2006.01) | |
| *H01S 5/028* | (2006.01) | |
| *H01L 33/00* | (2010.01) | |
| *H01L 33/56* | (2010.01) | |

(52) U.S. Cl.
CPC ............ *H01L 24/32* (2013.01); *H01L 33/58* (2013.01); *H01S 5/022* (2013.01); *H01S 5/028* (2013.01); *H01S 5/0222* (2013.01); *H01S 5/02276* (2013.01); *H01S 5/02288* (2013.01); *H01S 5/02296* (2013.01); *H01S 5/40* (2013.01); *H01S 5/4025* (2013.01); *H01L 33/0095* (2013.01); *H01L 33/56* (2013.01); *H01L 2224/32145* (2013.01); *H01L 2224/48091* (2013.01); *H01L 2224/49107* (2013.01); *H01L 2224/73265* (2013.01); *H01L 2924/12043* (2013.01); *H01L 2924/16152* (2013.01); *H01L 2933/0033* (2013.01); *H01L 2933/0058* (2013.01)

(58) Field of Classification Search
USPC .......... 438/118, 48, 455, 106, 107; 257/753, 257/737, 758, 783, E21.502
See application file for complete search history.

(56) References Cited

U.S. PATENT DOCUMENTS

| | | | |
|---|---|---|---|
| 9,394,161 B2* | 7/2016 | Cheng | ................ B81C 1/00238 |
| 2002/0179921 A1 | 12/2002 | Cohn et al. | |
| 2004/0025589 A1* | 2/2004 | Kurle | ...................... G01P 1/023 |
| | | | 73/488 |
| 2004/0087043 A1 | 5/2004 | Lee et al. | |
| 2005/0239228 A1 | 10/2005 | Quenzer et al. | |
| 2006/0096321 A1 | 5/2006 | Quenzer et al. | |
| 2006/0110893 A1* | 5/2006 | Quenzer | ............ B81C 1/00611 |
| | | | 438/455 |
| 2006/0130584 A1* | 6/2006 | Ono | ........................ G01P 1/023 |
| | | | 73/514.36 |
| 2006/0144143 A1* | 7/2006 | Gogoi | ................... B81B 3/0051 |
| | | | 73/504.12 |
| 2006/0219653 A1 | 10/2006 | Quenzer et al. | |
| 2006/0272413 A1* | 12/2006 | Vaganov | ............ G01P 15/123 |
| | | | 73/514.01 |
| 2008/0068845 A1 | 3/2008 | Aida et al. | |
| 2008/0099908 A1 | 5/2008 | Wang et al. | |
| 2009/0294789 A1 | 12/2009 | Yoshida et al. | |
| 2010/0061073 A1* | 3/2010 | Oldsen | ................... B81B 3/0051 |
| | | | 361/807 |
| 2010/0330332 A1 | 12/2010 | Quenzer et al. | |
| 2011/0137659 A1 | 6/2011 | Honma et al. | |
| 2011/0317397 A1 | 12/2011 | Trottier et al. | |
| 2013/0279169 A1* | 10/2013 | Reiherzer | ............. F21V 19/001 |
| | | | 362/249.02 |
| 2014/0301697 A1 | 10/2014 | Marenco et al. | |
| 2015/0035133 A1* | 2/2015 | Wong | ...................... H01L 23/04 |
| | | | 257/704 |
| 2015/0040368 A1 | 2/2015 | Quenzer et al. | |
| 2015/0137341 A1* | 5/2015 | Liu | ...................... H01L 23/5386 |
| | | | 257/692 |
| 2015/0155267 A1* | 6/2015 | Hoegerl | ............. H01L 25/0655 |
| | | | 257/698 |
| 2015/0325557 A1* | 11/2015 | Yiu | ...................... H01L 23/3114 |
| | | | 257/414 |

FOREIGN PATENT DOCUMENTS

| | | |
|---|---|---|
| DE | 10259890 A1 | 7/2004 |
| DE | 10313889 B3 | 8/2004 |
| DE | 19956654 B4 | 4/2005 |
| DE | 102007046348 A1 | 4/2009 |
| DE | 102008012384 A1 | 9/2009 |
| DE | 102011110166 A1 | 2/2013 |
| DE | 102011119610 A1 | 5/2013 |
| JP | H05129712 A | 5/1993 |
| WO | 0138240 A1 | 5/2001 |
| WO | 2008087022 A1 | 7/2008 |
| WO | 2009039816 A1 | 8/2008 |

* cited by examiner

S5-14

S5-15a

S5-15b

S5-15c

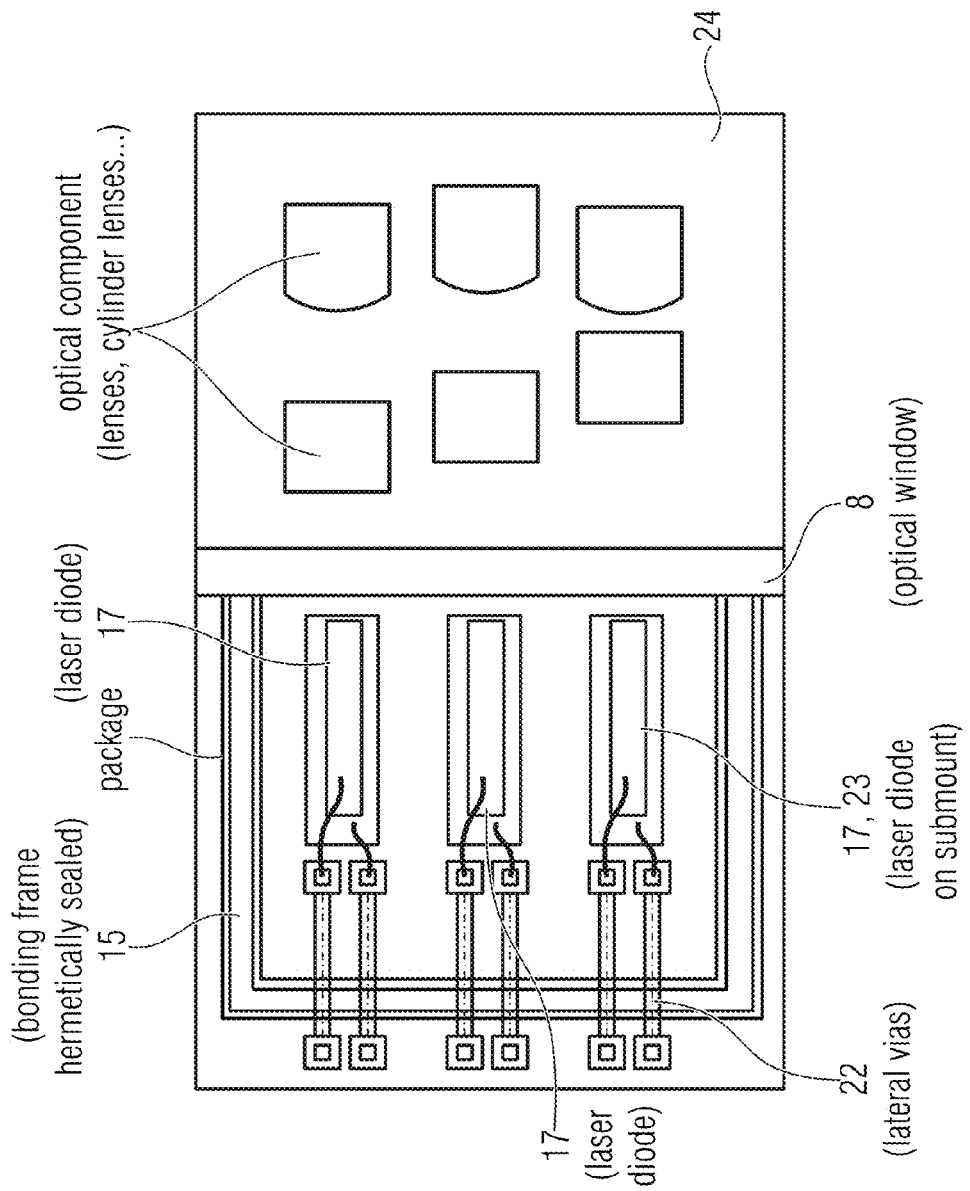

METHOD OF PRODUCING A CAP SUBSTRATE, AND PACKAGED RADIATION-EMITTING DEVICE

CROSS-REFERENCE TO RELATED APPLICATIONS

This application is a continuation of copending International Application No. PCT/EP2014/076271, filed Dec. 2, 2014, which is incorporated herein by reference in its entirety, and additionally claims priority from German Applications Nos. DE 102013113364.9, filed Dec. 3, 2013, and DE 10 2014 202 220.7, filed Feb. 6, 2014, both of which are incorporated herein by reference in their entirety.

The present invention relates to methods of producing a cap substrate, to a method of producing a packaged radiation-emitting device at the wafer level and to a packaged radiation-emitting device produced by means of such a method. For example, a capping concept for laser diodes and production methods at the wafer level with an integrated vertical optical window are to be provided.

BACKGROUND OF THE INVENTION

Blue and green laser diodes are being used in increasingly wide fields of application. What has already become established and is now widespread is the use of blue laser diodes as decisive components in reading out high-density optical storage media (Blu-ray). Manifold further applications of high-performance blue and green laser diodes such as RGB sources in mobile image and video projections, for example, have become established by now.

Both green and blue laser diodes should be packed within a package in a hermetically sealed manner. It is possible to cap such laser diodes by means of a capping technology by using specific TO headers (TO 38) comprising integrated optical windows and copper heat sinks.

In addition to the consumer applications mentioned, in the field of factory lighting systems and, specifically, of UV curing lamps, there is also a need for hermetically capped UV light emitting diodes (no laser diodes) having a particularly high level of heat dissipation and having organic-free packages so as to guarantee long service lives.

SUMMARY

According to an embodiment, a method of producing a cap substrate may have the steps of: providing a mold substrate including a structured surface region; arranging a cover substrate on the structured surface region of the mold substrate, the cover substrate including a glass material, and connecting the cover substrate to the mold substrate, the structured surface of the mold substrate being brought into contact with a surface of the cover substrate in such a way that they at least partially overlap; forming first island regions and respectively associated adjacent second island regions from the mold substrate, a recess being provided between the first island regions and the respectively associated adjacent second island regions; arranging a window component within the recess located between a first island region and the associated adjacent second island region; arranging a carrier substrate on the first island regions and on the second island regions, which are formed from the mold substrate, so that the first island regions and the second island regions are located between the carrier substrate and the cover substrate; tempering the bonded substrates such that the glass material of the cover substrate is caused to flow into the remaining recesses located between the island regions; and removing the cover substrate from the mold substrate and the carrier substrate so as to achieve the structured cap substrate having the window component on a side face of the cap substrate.

According to another embodiment, a method of producing a cap substrate may have the steps of: providing a mold substrate including a structured surface region; arranging a carrier substrate on the structured surface region of the mold substrate and connecting the carrier substrate to the mold substrate, the structured surface of the mold substrate being brought into contact with a surface of the carrier substrate in such a way that they at least partially overlap; forming first island regions and respectively associated adjacent second island regions from the mold substrate, a recess being provided between the first island regions and the respectively associated adjacent second island regions; arranging a window component within the recess located between a first island region and the associated adjacent second island region; arranging a cover substrate on the first island regions and on the second island regions, which are formed from the mold substrate, so that the first island regions and the second island regions are located between the carrier substrate and the cover substrate, the cover substrate including a glass material; tempering the bonded substrates such that the glass material of the cover substrate is caused to flow into the remaining recesses located between the island regions; and removing the cover substrate from the mold substrate and the carrier substrate so as to achieve the structured cap substrate having the window component on a side face of the cap substrate.

According to another embodiment, a method of producing a cap substrate may have the steps of: providing a reusable tool as the mold substrate, first island regions and respectively associated adjacent second island regions being formed on a surface of the reusable tool, which is effective as a negative structure for a cap structure, a recess being provided, in the reusable wafer, between the first island regions and the respectively associated adjacent second island regions; arranging a window component on the reusable tool in the recess, respectively, located between a first island region and the associated adjacent second island region; arranging a cover substrate on the island regions of the reusable tool, the cover substrate including a glass material; wherein the surface of the reusable tool is brought into contact with a surface of the cover substrate in such a way that they at least partially overlap; tempering the bonded substrates such that the glass material of the cover substrate is caused to flow into the recesses located between the island regions; and separating the cover substrate from the mold substrate so as to achieve the structured cap substrate having the window component on a side face of the cap substrate.

According to another embodiment, a method of producing a cap substrate may have the steps of: providing a mold substrate including a structured surface region; arranging a cover substrate on the structured surface region of the mold substrate, the cover substrate including a glass material, and connecting the cover substrate to the mold substrate, the structured surface of the mold substrate being brought into contact with at least one surface of the cover substrate in such a way that they at least partially overlap; forming first island regions and respectively associated adjacent second island regions from the mold substrate, a recess being provided between the first island regions and the respectively associated adjacent second island regions; arranging semiconductor strips in the recess, respectively, located between a first island region and the associated adjacent second island region, so that the semiconductor strips with one of their surfaces at least partially overlap respective lateral surfaces of the island regions perpendicularly to the cover substrate, and so that semiconductor strips are located opposite one another with regard to the recess and that a distance, which corresponds to a remaining recess, is formed between the semiconductor strips; arranging a carrier substrate on the first island regions and on the second island regions, which are formed from the mold substrate, so that the first island regions and the second island regions are located between the carrier substrate and the cover substrate; tempering the bonded substrates such that the glass material of the cover substrate is caused to flow into the remaining recesses located between the island regions; and removing the cover substrate from the mold substrate and from the carrier substrate so as to achieve the structured cap substrate having the window component on a side face of the cap substrate.

According to another embodiment, a method of producing a cap substrate may have the steps of: providing a reusable tool as the mold substrate, first island regions and respectively associated adjacent second island regions being formed on a surface of the reusable tool, which is effective as a negative structure for a cap structure, a recess being provided, within the reusable wafer, between the first island regions and the respectively associated adjacent second island regions; arranging semiconductor strips in the recess, respectively, located between a first island region and the associated adjacent second island region, so that the semiconductor strips with one of their surfaces at least partially overlap respective lateral surfaces of the island regions perpendicularly to the cover substrate, and so that semiconductor strips are located opposite one another with regard to the recess and that a distance, which corresponds to a remaining recess, is formed between the semiconductor strips; arranging a cover substrate on the island regions of the reusable tool, the cover substrate including a glass material; wherein the surface of the reusable tool is brought into contact with a surface of the cover substrate in such a way that they at least partially overlap; tempering the bonded substrates such that the glass material of the cover substrate is caused to flow into the recesses located between the island regions; and separating the cover substrate from the mold substrate so as to achieve the structured cap substrate having the window component on a side face of the cap substrate.

According to another embodiment, a packaged radiation-emitting device may have: a radiation-emitting device arranged on a device substrate; and a cap substrate providing a hermetically sealed cavity for the radiation-emitting device within which the radiation-emitting device is packaged, said cap substrate including, in a side face, an optical output window made of a material transparent to the radiation of the radiation-emitting device, said optical output window of the cap substrate and the radiation-emitting device being arranged in relation to each other such that the radiation emitted during operation of the radiation-emitting device leaves the package in an emission direction in a manner that is parallel with the surface of the device substrate and/or that is perpendicular to the side face of the cap substrate, wherein the optical output window is formed from a first glass material and the cap substrate is formed from a second glass material and wherein the second glass material exhibits a viscosity lower than that of the first glass material; and wherein the glass material of the cover substrate and the glass material of the window components are integrally bonded.

One aims to achieve that the packaged radiation-emitting devices exhibit long service lives while maintaining consistently good radiation and performance quality. In particular, damaging of the laser facets upon exposure to water vapor and volatile organic components under the action of extremely intense and high-energy laser radiation is to be reduced or prevented. In addition, production costs are to be reduced and heat dissipation from the package is to be improved.

The present invention is based on the finding that a particularly advantageous manner of producing an improved packaged radiation-emitting device is at the wafer level. If one uses a mold substrate for shaping cap substrates by means of glass flowing processes, window components can be integrated into a cap substrate, by which measure one can subsequently cap sensitive radiation sources in a hermetically sealed manner.

Manufacturing processes improved accordingly may be achieved by forming, in a method of producing a cap substrate, first island regions and respectively associated adjacent second island regions from a mold substrate, a recess being provided between the first island regions and the respectively associated adjacent second island regions, and a window component being arranged in the recess, respectively, located between the first island regions and the associated adjacent second island region.

Thus, a first method of producing a cap substrate comprising the following steps is provided: providing a mold substrate comprising a structured surface region, arranging a cover substrate on the structured surface region of the mold substrate, the cover substrate comprising a glass material, and connecting the cover substrate to the mold substrate, the structured surface of the mold substrate being brought into contact with a surface of the cover substrate in such a way that they at least partially overlap, forming first island regions and respectively associated adjacent second island regions from the mold substrate, a recess being provided between the first island regions and the respectively associated adjacent second island regions, arranging, in each case, a window component within the recess located between the first island region and the associated adjacent second island region, arranging a carrier substrate on the first island regions and on the second island regions, which are formed from the mold substrate, so that the first island regions and the second island regions are located between the carrier substrate and the cover substrate, tempering the bonded substrates such that the glass material of the cover substrate is caused to flow into the remaining recesses located between the island regions, and removing the cover substrate from the mold substrate and the carrier substrate so as to obtain the structured cap substrate.

A method alternative thereto of producing a cap substrate includes the following steps: providing a mold substrate comprising a structured surface region; arranging a carrier substrate on the structured surface region of the mold substrate and connecting the carrier substrate to the mold substrate, the structured surface of the mold substrate being brought into contact with a surface of the carrier substrate in such a way that they at least partially overlap; forming first island regions and respectively associated adjacent second island regions from the mold substrate, a recess being provided between the first island regions and the respectively associated adjacent second island regions; arranging a window component within the recess located between a first island region and the associated adjacent second island region; arranging a cover substrate on the first island regions and on the second island regions, which are formed from the mold substrate, so that the first island regions and the second island regions are located between the carrier substrate and the cover substrate, the cover substrate comprising a glass material; tempering the bonded substrates such that the glass material of the cover substrate is caused to flow into the remaining recesses located between the island regions; and removing the cover substrate from the mold substrate and the carrier substrate so as to obtain the structured cap substrate.

As defined by the invention, removing is understood to mean (mechanically) separating or selectively etching off or away of the semiconductor material, for example of the silicon, from the mold substrate.

In addition, a second method of producing a cap substrate comprising the following steps is provided: providing a reusable tool as the mold substrate, forming first island regions and respectively associated adjacent second island regions on a surface of the reusable tool, which is effective as a negative structure for a cap structure, a recess being provided, in the reusable wafer, between the first island regions and the respectively associated adjacent second island regions, arranging a window component on the reusable tool in the recess, respectively, located between a first island region and the associated adjacent second island region, arranging a cover substrate on the island regions of the reusable tool, the cover substrate comprising a glass material, wherein the surface of the reusable tool is brought into contact with a surface of the cover substrate in such a way that they at least partially overlap, tempering the bonded substrates such that the glass material of the cover substrate is caused to flow into the recesses located between the island regions, and separating the cover substrate from the mold substrate so as to obtain the structured cap substrate.

Moreover, a third method of producing a cap substrate comprising the following steps is provided: providing a mold substrate comprising a structured surface region, arranging a cover substrate on the structured surface region of the mold substrate, the cover substrate comprising a glass material, and connecting the cover substrate to the mold substrate, the structured surface of the mold substrate being brought into contact with at least one surface of the cover substrate in such a way that they at least partially overlap, forming first island regions and respectively associated adjacent second island regions from the mold substrate, a recess being provided between the first island regions and the respectively associated adjacent second island regions, arranging semiconductor strips in the recess, respectively, located between a first island region and the associated adjacent second island region, so that the semiconductor strips with one of their surfaces at least partially overlap respective lateral surfaces of the island regions perpendicularly to the cover substrate, and so that semiconductor strips are located opposite one another with regard to the recess and that a distance, which corresponds to a remaining recess, is formed between the semiconductor strips, arranging a carrier substrate on the first island regions and on the second island regions, which are formed from the mold substrate, so that the first island regions and the second island regions are located between the carrier substrate and the cover substrate, tempering the bonded substrates such that the glass material of the cover substrate is caused to flow into the remaining recesses located between the island regions, and removing the cover substrate from the mold substrate and from the carrier substrate so as to obtain the structured cap substrate.

A packaged radiation-emitting device may be provided, accordingly, by means of a method of producing a packaged radiation-emitting device at the wafer level by means of the following steps: producing a cap substrate, providing a device substrate in the form of a wafer comprising a multitude of radiation-emitting devices, arranging the substrates one above the other, so that the substrates are bonded along an intermediate bonding frame, and dicing the packaged radiation-emitting devices.

As defined by the invention, a mold substrate is provided which has a topographically structured surface region. This means that a surface region of the mold substrate comprises one or more projections, so that the surface region is uneven, i.e. comprises a topography, when viewed across its entire extension. Thus, the mold substrate may serve as a negative 3D mask for the cap substrate.

As defined by the invention, island regions are elevations on the surface region, i.e. projections. First island regions are configured to form projections for cavities for a radiation-emitting device within the cap substrate, whereas the adjacent second island region is configured to form a cavity for a dicing pathway, or serves to be able, at a later point in time, to expose the electrical connection pads within the package. A recess as defined by the invention is an intermediate region between a first island region and an adjacent associated second island region.

As defined by the invention, tempering is understood to mean a temperature treatment, for example heating up. A glass material as defined by the invention is an amorphous inorganic material wherein the viscosity continuously decreases as the temperature increases. As defined by this invention, at the same temperature, a low-melting glass material thus has a viscosity lower than that of a higher-melting glass.

Accordingly, the invention describes a method of a structural design (assembly) and connection technology for hermetically sealed packaging of radiation-emitting devices, i.e. laser diodes or LEDs, for example, which may be referred to by WLP-IVA (wafer level packages—with integrated vertical optical apertures). What can be advantageous in this respect, in particular, is the optical window, which forms an integral part of the cap and allows lateral beam extraction. The laser diodes may be mounted, for example, on a semiconductor wafer, e.g. a silicon wafer, and the capping process may be effected, for all mounted components together, by bonding a further glass or semiconductor wafer comprising glass elements. It is not until then that the separating, or dicing, into individual chips, namely into individual packages, is performed.

Production of the cap or cap wafer, also referred to as a cap substrate, which contains the vertical optical window surfaces made of glass for a multitude of packages, represents a completely novel production method. The method is essentially based on techniques of so-called glass flowing (cf. [1] to [7]). In embodiments, the glass material of the cover substrate is Borofloat® glass or any other low-melting glass. The coefficient of thermal expansion (CTE) of the glass materials should match that of the semiconductor material used since both production of the cap wafer and bonding of the cap wafer take place on a semiconductor material, e.g. on a silicon substrate, which otherwise would result in very large thermomechanical tensions or in the destruction of the elements involved if the CTE is not adapted to the semiconductor material. Adapted here means that the CTE of the glass material in embodiments deviates by no more than 1-2 ppm/C.° from the CTE of the semiconductor material. In embodiments, the CTE of the glass material deviates by less than 0.5 ppm/C.° from the CTE of the semiconductor material. One possible process flow in the production of said cap wafers having integrated vertical optical window surfaces will be described at a later point in time by means of the figures. For example, such window elements whose (optically effective) side faces form a vertical side window of a cap arrangement for a radiation- and/or light-emitting device, and/or which extend essentially perpendicularly to a central axis of lateral beam extraction may be regarded as window elements having vertical optical window surfaces.

The above-described process in accordance with the first and the third methods eventually uses semiconductor structures, e.g. silicon structures, as lost molds (disposable molds) for shaping the glass. In principle, however, molds (reusable tools) may be produced which can be used many times in order to process the cap wafer. Of course, only such materials or coatings may be considered here which do not establish a close bond with the glass and which can be easily separated from the glass. To this end, a base mold may be produced from a reusable material, as is proposed in accordance with the second method. It is also referred to as WLP-ILOW I. By analogy with the first method, glass strips, i.e. strip-shaped window components, may be inserted into the structures, for example by being rotated about their longitudinal axes by 90°, so that such surfaces of the window components which are provided as surfaces of optical output windows, are located opposite to surfaces of the island regions formed from the mold substrate. Subsequently, a glass wafer is placed, the entire assembly is heated up and finally drawn into the reusable mold by means of pressure, e.g. negative pressure. To this end, suitable points of entry and channels, which ensure complete removal of the air between the glass wafer and the mold, are previously provided within the reusable mold. Subsequently, the glass wafer having the glass strips embedded therein is lifted off and separated from the mold. For example, the reusable tool may consist of graphite. As an alternative to a mold which consists of graphite entirely, other materials may basically also be considered for producing such a mold, among others temperature-resistant steels and ceramics (SIC, glassy carbon), in particular when said molds are additionally provided with a coating which prevents the glass mass from adhering (e.g. graphite or, even better, boron nitride (BN)). By applying such a glass-repellent protective layer, it is also possible, in principle, for such a reusable mold to be made of silicon.

In embodiments of the invention in accordance with the second method, provision is made for the tempering to include the following step: applying a negative pressure to the bonded substrates so as to draw the glass material into the remaining recesses located between the island regions. Alternatively, it is possible to apply a pneumatic or mechanical pressure on the side of the glass plate placed, or of the glass wafer. Ideally, the vacuum ports and channels should be arranged such that they do not impair the glass, which will surely, if superficially, flow into these structures. One should avoid, in particular, that elevations are formed within the area of the bonding frame. This is why it is useful to integrate the vacuum feeds into the island structures of the reusable tool and, in order to facilitate improved removal of the remaining occlusions of gas by suction, to additionally introduce narrow channels into the surfaces of said island structures.

In addition, the invention provides a packaged radiation-emitting device, comprising: a radiation-emitting device arranged on a device substrate, and a cap substrate providing a hermetically sealed cavity for the radiation-emitting device within which the radiation-emitting device is packaged, said cap substrate comprising, in a side face, an optical output window made of a material transparent to the radiation of the radiation-emitting device, said optical output window of the cap substrate and the radiation-emitting device being arranged in relation to each other such that the radiation emitted during operation of the radiation-emitting device leaves the package in an emission direction in a manner that is parallel with the surface of the device substrate and/or that is perpendicular to the side face of the cap substrate.

The invention furthermore provides a wafer array comprising a multitude of packaged radiation-emitting devices, comprising: a device substrate in the form of a wafer that is configured as a shared device substrate for the radiation-emitting devices arranged thereat, and a shared cap substrate comprising the cap substrates for the radiation-emitting devices, the substrates being arranged at one another such that the cap substrate and the device substrate are bonded along an intermediate bonding frame.

In accordance with one embodiment, the first method includes the following steps with regard to the provision of the mold substrate: providing a semiconductor wafer comprising a passivation layer on a surface, lithographing the passivation layer so that the passivation layer will remain on the surface wherever the first island regions and the second island regions are provided, etching the surface of the semiconductor wafer with regard to the lithographed regions, so that a thickness of the semiconductor wafer is reduced perpendicularly to the lithographed regions of the surface so as to structure the surface region and to thus specify positions for the first island regions and the second island regions, and completely removing the passivation layer. This may have the advantage that a mold substrate having a conveniently structured surface region can be provided in a simple manner. For example, the semiconductor wafer is a silicon wafer. The semiconductor wafer may be coated with a KOH-resistant passivation, or example made of LP nitride. Subsequently, lithography is performed wherein merely the first and second island regions remain unetched. The passivation is opened by means of plasma etching. The lithographed regions may be processed by means of anisotropic wet-chemical etching, for example by using KOH, so that the surface of the semiconductor wafer is etched with regard to the lithographed regions. Eventually, the passivation layer is completely removed by being etched off, for example.

In accordance with an embodiment of the first method, provision is made for that the method includes the following step in said arranging and connecting of the cover substrate: anodically bonding, region by region, the structured surface region of the mold substrate with a surface region of the cover substrate. A glass wafer suited as a cover substrate may consist of Pyrex or Borofloat® 33, for example, or may at least include said glass materials. Such glass materials may have the advantage that they can be used particularly advantageously in glass flowing processes.

Cutting (sawing) into the structures may be effected, for example, by means of so called cap dicing. In accordance with an embodiment of the first method, provision may also be made, accordingly, for said forming of island regions from the mold substrate to additionally include the steps: sawing (cutting) into the first and second island regions in the mold substrate following said region-by-region anodic bonding, and removing those portions of the mold substrate that are separate from the bonded regions following the sawing. Subsequently, the strips between the islands will be removed. This is very easily possible since those surface regions of the mold substrate which are firmly bonded to the cover substrate are freely movable in relation to the strips that have been removed by sawing.

Irrespective of whether this is an embodiment of the invention in accordance with the first method or the second method, provision may be made for said arranging of the window component in each case to additionally include the following steps: providing several strip-shaped window components, and inserting the strip-shaped window components into the recesses located between the first island regions and the second island regions, so that surfaces of the window components that are provided as surfaces of optical output windows are located opposite surfaces of the island regions that are formed from the mold substrate. This corresponds to utilizing the semiconductor or graphite structures like a plugboard, so that the window surfaces fit perfectly into the structures formed by the island regions. The lateral islands thus serve as stops.

According to the invention, provision is made, in embodiments, for said providing of strip-shaped window components to additionally include the following steps: providing a window component wafer, and cutting to length of the strip-shaped window components from the window component wafer. For example, this may mean to cut to length, for example to saw, strips of the actual window material. In embodiments, the window material, i.e. the window components, are higher-melting glass, such as higher-melting glass which as compared with the cover wafer has a thermal expansion coefficient identical to that of "AF 32"® (Schott) or "Eagle XG"® (Corning®). The window component may be rotated to the side about its longitudinal axis by 90°. Subsequently, assembling with the window components can be effected. Instead of a higher-melting glass or glass material, it is also possible to employ Borofloat® glass (low-melting glass), which is held in its mold by two silicon supports. It is generally also possible to use semiconductor supports rather than silicon supports.

Accordingly, provision is made, in embodiments of methods according to the invention, for said arranging of the respective window component to include the following step: inserting silicon strips into the recesses prior to inserting the strip-shaped window components into the recesses, so that the silicon strips are arranged between surfaces of the window components that are provided as surfaces of optical output windows, and surfaces of the island regions that are formed from the mold substrate. Also, provision may be made for said arranging of the respective window component to include the step: providing one or more strip-shaped window elements coated with semiconductor material. In said providing of a window element coated with semiconductor material, provision may be made of the following step: coating surfaces of the window component by bonding silicon strips onto them. Generally, semiconductor strips may be used rather than silicon strips. Accordingly, there are different possibilities of providing suitable window components for the inventive methods. When using structured SI-glass-SI elements made of Borofloat® glass, i.e. when using silicon glass structures, it is particularly convenient to structure the silicon island (=to-be cavity) SI strip such that the silicon remains within this region only. Otherwise, i.e. when using unstructured SI-glass-SI elements made of Borofloat® glass, said unstructured silicon strip will also cut through the side faces of the glass package. Said silicon structures, provided that silicon is used as the semiconductor material, would also be etched during etching of the other silicon structures and would also be either completely or partly removed. In this case, production of a glass cap wafer for assembling intact glass packages would not be possible by means of the first method.

However, it is conceivable that said critical regions might be protected from etching by performing additional processing steps following tempering of the bonded substrates. To this end, the thickness of the silicon strip, or, generally, semiconductor strip, should be selected to be thin (e.g. about 200 µm, for example between 150 µm and 250 µm), and the lower semiconductor substrate, i.e. the carrier substrate, which may also consist of silicon or include silicon, for example, should initially be mechanically removed down to the plane of the glass and semiconductor noses by means of grinding. Subsequently, the particularly critical areas in the region of the bonding frame might be protected by suitable passivation. Subsequently, the semiconductor material, for example the silicon, would be etched away in the region of the cavities, connection pads and other support structures, and the semiconductor material, for example the silicon, which might cut through the side walls, would still be preserved. However, since the semiconductor material, for example silicon, located within the side wall is attacked, it is recommendable to keep the thickness of the semiconductor strip to a minimum so as to prevent etching through the side wall.

A possible alternative to this passivation variant is to structure the bonded-on semiconductor structures, e.g. silicon structures, in such a manner (comb shape) that they do not come into contact, in regions located outside the cavities (which equal the optical window surfaces), with the surface of the applied semiconductor wafer, i.e. the carrier substrate, during the tempering process. Thus, one can achieve that the bottom area of the actual glass package entirely consists of glass. In accordance with what was described above, it is also possible to use two parallel silicon strips or, more generally, semiconductor strips, for defining the window surfaces. This, too, is shown in the figures.

In accordance with an embodiment of the invention, provision is made for said arranging of the window component to include the following step: cutting to length of strip-shaped window components from a lens array in each case. In this manner, installation of optical lenses made of glass can be allowed instead of installing a planar window. In principle, it is also possible to embed a lens element, rather than a simple planar window, into the glass of the package. Said lens function might consist either of a number of lenses (i.e. linear lens array) or one single cylinder lens when the latter is oriented in parallel with the alignment of the glass strip. Unlike the planar glass elements employed for producing the planar glass windows, however, it is useful to additionally protect the non-planar sides of the lenses by an additional protective element made of a semiconductor material, e.g. silicon, against direct contact with the glass mass. Said protective structure bridges the lens surface, on the one hand, and ensures optimum fitting with the semiconductor structures, e.g. silicon structures, placed on the glass wafer, on the other hand, so as to avoid uncontrolled flowing of the glass into this gap here as well.

The simplest way of forming such lens array semiconductor elements by means of the glass flowing technique is to use a higher-melting glass (e.g. "AF 32"®, "Eagle XG"®) with a thermal expansion coefficient adapted to silicon and/or Borofloat® glass. In principle, using this technique is also possible when using biconvex or biconcave lenses. In this case, both sides of the lenses are protected against direct contact with the glass by corresponding semiconductor structures. Precisely how this can be implemented is shown in the figures and will be described later on.

In one method of producing a packaged radiation-emitting device at the wafer level provision is made, in accordance with an embodiment, for the method to additionally include the following steps: producing the cap substrate in accordance with the first method, and dicing the packaged radiation-emitting devices, a dicing pathway having been formed through the second islands within the cap substrate. By cutting into the dicing pathway in parallel, the regions may be exposed via connection pads provided on a device substrate in embodiments. In this context, the regions of the outer window surfaces are also made accessible. The strips resulting from the sawing between the two saw cuts become fully detached during the sawing. At this stage, electrical tests may still be performed on a wafer prober at the wafer level. Subsequently, and eventually, the carrier substrate, i.e. the device substrate, is diced by sawing along the dicing pathway. Thus, for sawing through the cap wafers, the same dicing pathway is used which is also used for sawing through the device substrate.

In a method of producing a packaged radiation-emitting device at the wafer level, provision is also made, in accordance with an embodiment, for that the arranging of the substrates is performed under a predefined atmosphere. In this manner, one may ensure that the package is completely free from organic substances, so that the life cycles of the light emitting diodes, for example of the laser diodes, are not impaired. The cavity advantageously has dry air, nitrogen or another kind of inert atmosphere therein; however, it is also possible, in principle, to establish a negative pressure or even a complete vacuum and to maintain said negative pressure or vacuum over long periods of time by additionally inserting specific getter layers.

In some embodiments, the packaged radiation-emitting device is configured such that the device substrate serves as a package header and as a bearing surface for the radiation-emitting device, the cap substrate cooperating with the package header to hermetically seal the cavity of the package.

In some embodiments, the packaged radiation-emitting device is configured such that the package header was formed from a header wafer which includes several package headers and/or wherein the cap substrate was formed from a cap wafer which includes several cap substrates.

In some embodiments, the packaged radiation-emitting device is configured such that the cap substrate comprises one or several planar wall portions as (a) side face(s), so that either a planar wall portion comprises the optical output window or that the optical output window forms a planar wall portion of the cap substrate.

In some embodiments, the packaged radiation-emitting device is configured such that the optical output window is bonded to the cap substrate in a firmly bonded manner or as one piece.

In some embodiments, the packaged radiation-emitting device is configured such that a subcarrier for the radiation-emitting device is arranged between the device substrate and the radiation-emitting device, so that the device substrate indirectly carries the radiation-emitting device.

In some embodiments, the packaged radiation-emitting device is configured such that the device substrate and the cap substrate are attached to each other by means of a bonding frame comprising a metallic solder material.

In some embodiments, the packaged radiation-emitting device is configured such that the optical output window is formed from a first glass material and the cap substrate is formed from a second glass material and wherein the second glass material has a viscosity lower than that of the first glass material.

In some embodiments, the packaged radiation-emitting device is configured such that a conductor track is arranged for electrically connecting the radiation-emitting device on the part of the device substrate, and the conductor track is led out of the cavity in the location between the cap substrate and the device substrate.

In some embodiments, the packaged radiation-emitting device is configured such that the optical output window has an optical bench located upstream from it on the part of the device substrate, so that the optical output window is arranged between the optical bench and the radiation-emitting device.

In some embodiments, the packaged radiation-emitting device is configured such that the optical bench is arranged on the device substrate and is located in the emission direction of the radiation-emitting device.

In some embodiments, the packaged radiation-emitting device is configured such that the optical output window includes an optical lens.

In some embodiments, the packaged radiation-emitting device is configured such that it further comprises an element effective for light color transformation of the emitted light, so that the optical output window is arranged between the effective element and the radiation-emitting device.

In some embodiments, the packaged radiation-emitting device is configured such that the cavity has an inert atmosphere and/or the cavity contains exclusively inorganic substances.

In some embodiments, the packaged radiation-emitting device is configured such that the cavity has an electronic driver circuit arranged therein.

BRIEF DESCRIPTION OF THE DRAWINGS

Embodiments of the present invention will be detailed subsequently referring to the appended drawings, in which:

FIG. 20 shows an exemplary embodiment comprising several radiation-emitting devices within the same package.

Even in different embodiments of the invention, identical reference numerals refer to identical or comparable elements.

DETAILED DESCRIPTION OF THE INVENTION

Figure 1A:
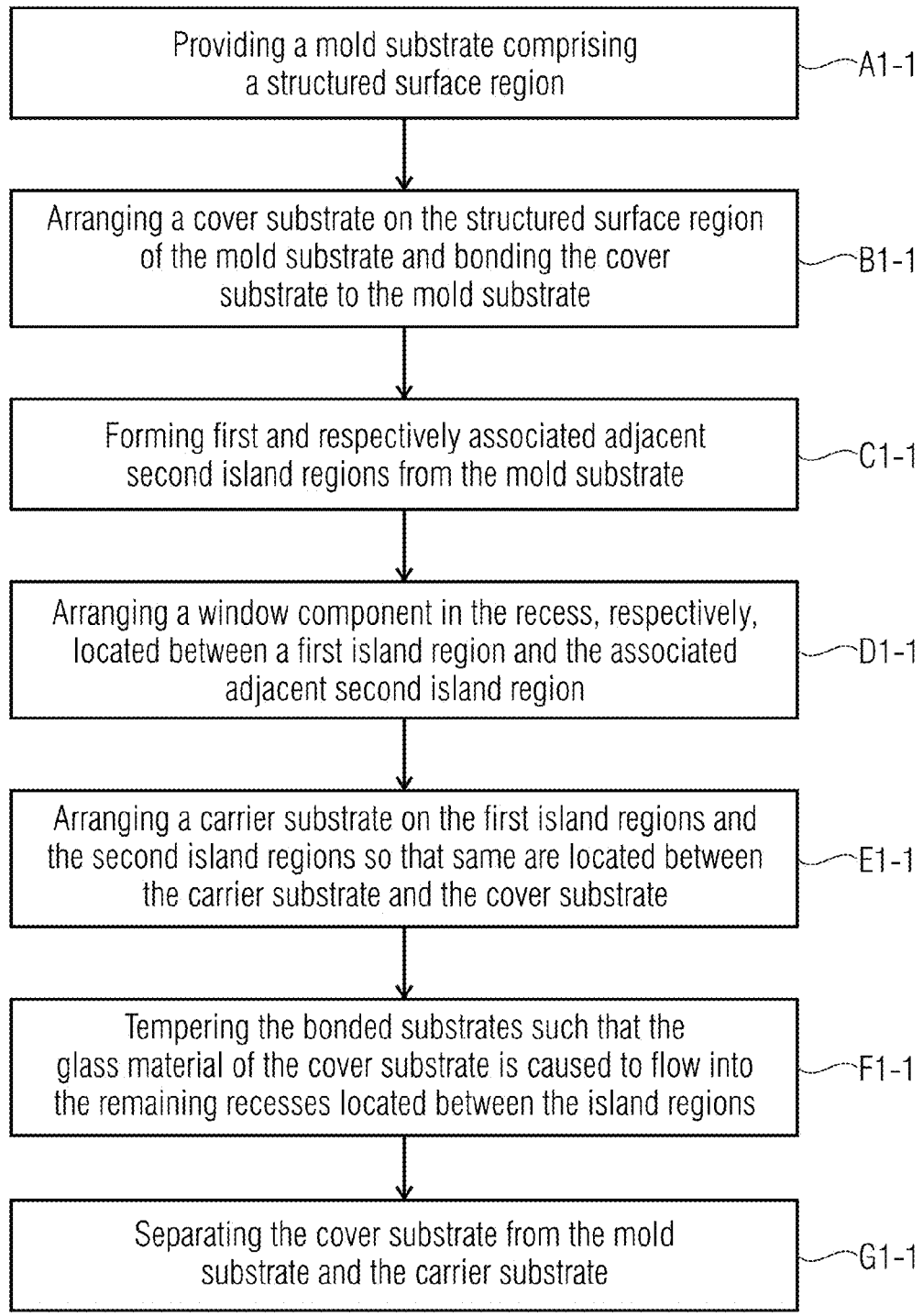
FIGS. 1a-d show a first method of producing a cap substrate.
Figure 1B:
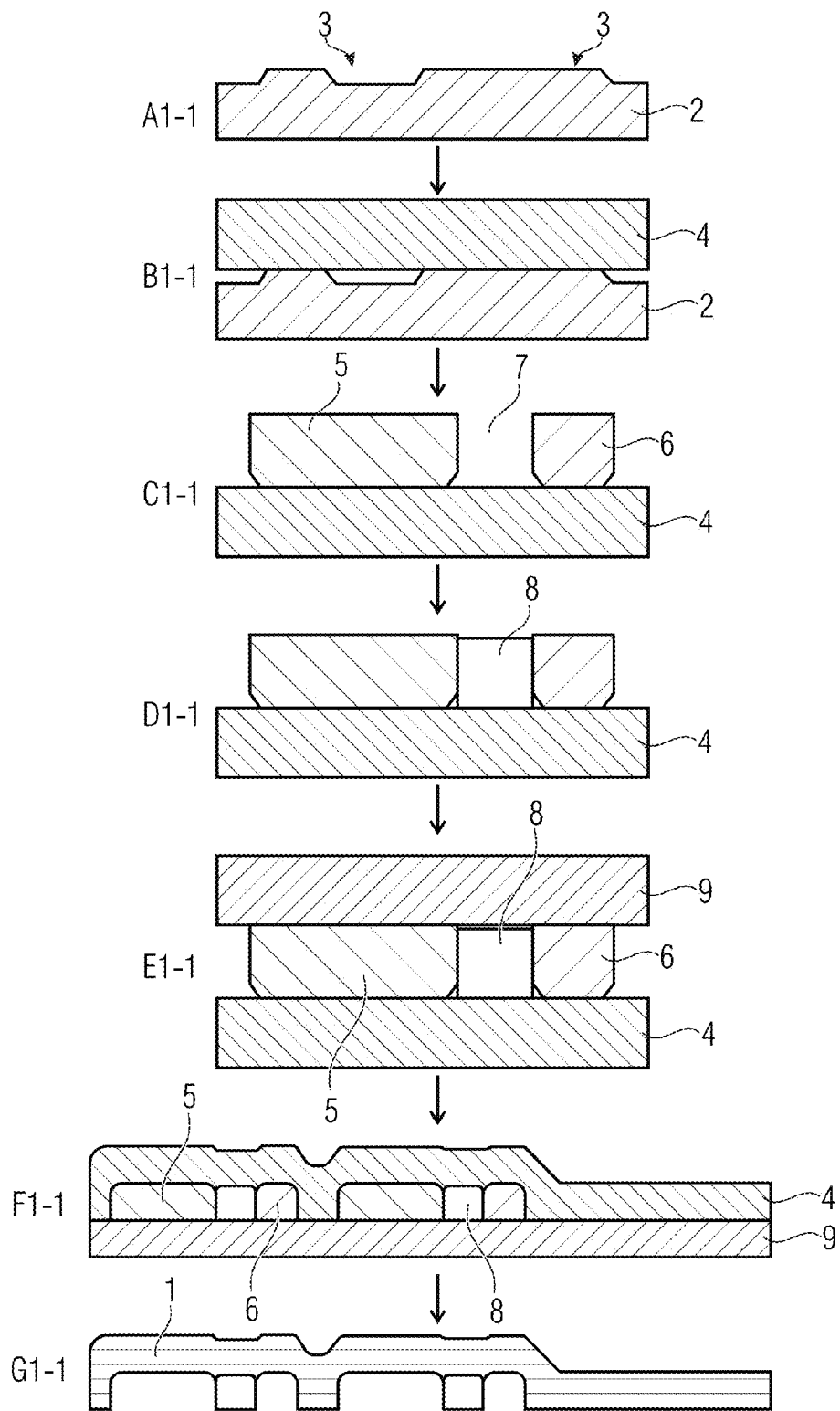

FIG. 1a shows a flowchart, illustrated by means of FIG. 1b, of a first method of producing a cap substrate 1. The cap substrate 1 comprises an optical side window, for example, which is an integral part of the cap and allows lateral beam extraction (lateral coupling out of beams). For example, it is also possible for several optical side windows to be provided which form an integral part of the cap and allow lateral beam extraction in different directions.

As a step (A1-1), the first method includes providing a mold substrate 2 having a structured surface region 3. The mold substrate 2 in this embodiment comprises a semiconductor material such as silicon, for example. Subsequently, a cover substrate 4 is arranged on the structured surface region 3 of the mold substrate 2 (B1-1). The cover substrate 4 is bonded to the mold substrate 2 in the process. In this context, provision is made for the cover substrate 4 to comprise a glass material. The step of arranging comprises bringing the structured surface 3 of the mold substrate 2 into contact with a surface of the cover substrate 4 in such a way that they at least partially overlap. A further step (C1-1) provides forming first island regions 5 and respectively associated adjacent second island regions 6 from the mold substrate 2, a recess, or notch, 7 being provided between the first island regions and the respectively associated adjacent second island regions 6. Subsequently, a window component 8 is arranged in the recess 7, respectively, located between the first island region 5 and the associated adjacent second island region 6 (D1-1). In a further step (E1-1), a carrier substrate 9 is arranged on the first island regions 5 and the second island regions 6, which are formed from the mold substrate 2, so that the first island regions 5 and the second island regions 6 are located between the carrier substrate 9 and the cover substrate 4. A following step (F1-1) comprises tempering (annealing) the bonded substrates such that the glass material of the cover substrate 4 is caused to flow into the remaining recesses 7 located between the island regions 5, 6. In this context, the temperatures are selected such that the higher-melting glass material of the window components 8 not be influenced (or be influenced to a negligible degree), i.e. remain planar, but that the lower-melting glass material can flow into the structures. To support this, a pressure difference between the interiors between the substrates 4, 9 and the ambient atmosphere should be present. A vacuum within the interiors may be present in order to be able to avoid potential inclusions of air. It may be particularly advantageous to support the flowing in of the glass material by a pressure difference. To this end, the process may be performed in two tempering steps, the first step comprising pressing down the edge of the glass of the cover substrate 4 onto the carrier substrate 9 by a suitable stress tool during tempering under vacuum. In this manner, a vacuum can be created within the interiors between the substrates 4, 9. In the second tempering step, which may subsequently occur within the furnace under a normal atmosphere, the hot glass mass is pressed into the interiors. The present pressure difference between the vacuum present within the interiors and the furnace atmosphere supports the entire flowing process.

In addition to the two-stage tempering process presented above, it is also possible that sufficient warming of the glass material leads to a so called "capillary formation" at the recesses 7, so that flowing of the glass material into the recesses 7 located between the island regions 5, 6 is caused, or supported. Thus, it is also possible to implement a one-stage tempering process.

Eventually, the cover substrate 4 is removed from the mold substrate 2 and the carrier substrate 9 so as to obtain the structured cap substrate 1 (G1-1). Removal may mean separating or selectively etching off of the semiconductor material, e.g. in a hot potash lye. In this manner, an improved method of producing a cap substrate 1 for capping radiation-emitting devices is provided since the cap substrate 1 obtained by the method as is schematically described in FIG. 1b includes an optical output window (emission window) formed by means of the window component 8. In some embodiments, the cover substrate 4 and the window component 8 are made of different glass materials. For example, a particularly suitable window glass material may be selected for the window component 8, whereas the cover substrate 4 consists of a different glass material which may be mechanically more robust, for example. In some embodiments, the glass material of the cover substrate 4 has a clearly lower viscosity, at the same temperature, than the glass material of the window component 8. For example, as an effective, stable package (housing) capping, the cover substrate 4 may thus present a relatively larger overall proportion of glass, which advantageously amounts to more than 50%, of the cap substrate 1 structured in accordance with the method. In this embodiment, the cover substrate is made of Borofloat® glass. The window component, in contrast, is made of "Eagle XG"® glass.

Figure 1C:
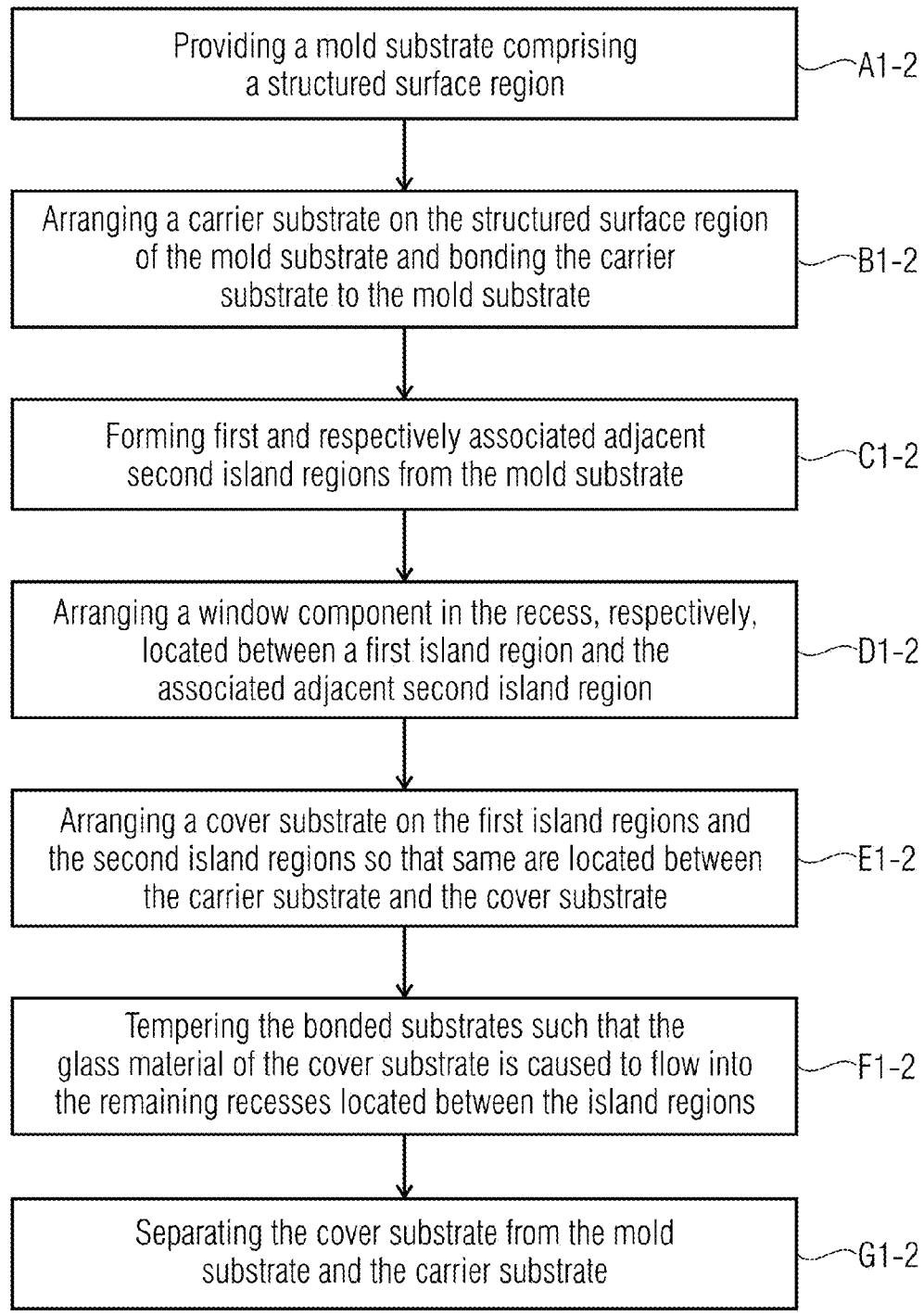
Figure 1D:
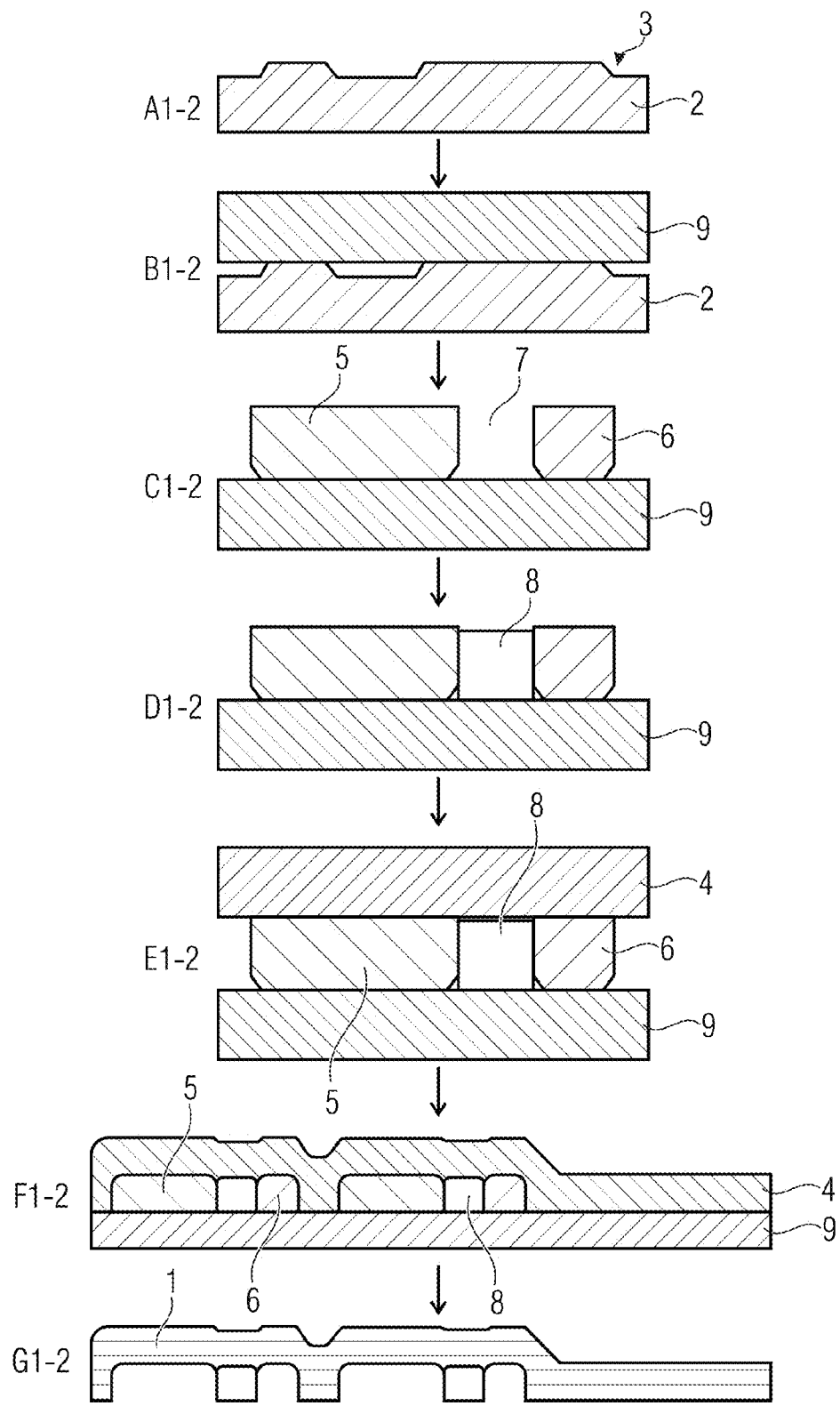

FIG. 1c shows a flowchart, illustrated by means of FIG. 1d, of an alternative method of producing a cap substrate 1. The cap substrate 1 comprises, e.g., an optical side window which forms an integral part of the cap and allows lateral beam extraction. For example, it is also possible for several optical side windows to be provided which form integral parts of the cap and allow lateral beam extraction in different directions.

In the further alternative method of FIG. 1d, the process sequence is changed, as compared to the first method presented in FIG. 1b, such that initially, the carrier substrate 9 is attached and/or bonded to the structured surface region of the mold substrate 2. In this context, a wafer bonding process is used, for example, when both the carrier substrate 9 and the mold substrate 2 are formed as semiconductor wafers (e.g. silicon wafers). Once the island regions 5, 6 comprising the recesses 7 located therebetween have been subsequently formed, the cover substrate is deposited on the island regions 5, 6 fixedly arranged on the carrier substrate 9.

The further (alternative) method of FIG. 1d includes, as a step (A1-2), providing a mold substrate 2 having a structured surface region 3. The mold substrate 2 in this embodiment comprises a semiconductor material such as silicon, for example. Subsequently, a carrier substrate 9 is arranged on the structured surface region 3 of the mold substrate 2 (B1-2). The carrier substrate 9 is bonded to the mold substrate 2 in the process. In this context, provision is made for the carrier substrate 9 to comprise a semiconductor material, e.g. silicon. The step of arranging comprises bringing the structured surface 3 of the mold substrate 2 into contact with a surface of the carrier substrate 9 in such a way that they at least partially overlap, it being possible for the mold substrate 2 and the carrier substrate 9 to be configured as semiconductor wafers (e.g. silicon wafers), and for a so called wafer bonding process to be performed during the steps of arranging and/or bonding the mold substrate 2 and the carrier substrate 9.

A further step (C1-2) provides forming first island regions 5 and respectively associated adjacent second island regions 6 from the mold substrate 2, a recess, or notch, 7 being provided between the first island regions and the respectively associated adjacent second island regions 6. Subsequently, a window component 8 is arranged in the recess 7, respectively, located between the first island region 5 and the associated adjacent second island region 6 (D1-2).

In a further step (E1-2), a cover substrate 4 is arranged on the first island regions 5 and the second island regions 6, which are formed from the mold substrate 2, so that the first island regions 5 and the second island regions 6 are located between the carrier substrate 9 and the cover substrate 4. The cover substrate 4 comprises a glass material. A following step (F1-2) comprises tempering the bonded substrates such that the glass material of the cover substrate 4 is caused to flow into the remaining recesses, or notches, 7 located between the island regions 5, 6. In this context, the temperatures are selected such that the higher-melting glass material of the window components 8 not be influenced (or be influenced to a negligible degree), i.e. remain planar, but that the lower-melting glass material can "flow" into the structures. To support this, a pressure difference between the interiors between the substrates 4, 9 and the ambient atmosphere should be present. A vacuum within the interiors may be present in order to be able to avoid potential inclusions of air. It may be particularly advantageous to support the flowing in of the glass material by a pressure difference. To this end, the process may be performed in two tempering steps, the first step comprising pressing down the edge of the glass of the cover substrate 4 onto the carrier substrate 9 by a suitable stress tool during tempering under vacuum. In this manner, a vacuum can be created within the interiors between the substrates 4 and 9. In the second tempering step, which may subsequently occur within the furnace under a normal atmosphere, the hot glass mass is pressed into the interiors. The present pressure difference between the vacuum present within the interiors and the furnace atmosphere supports the entire flowing process.

In addition to the two-stage tempering process presented above, it is also possible that sufficient warming of the glass material leads to a so called "capillary formation" at the recesses 7, so that flowing of the glass material into the recesses 7 located between the island regions 5, 6 is caused, or supported. Thus, it is also possible to implement a one-stage tempering process.

Eventually, the cover substrate 4 is removed from the mold substrate 2 and the carrier substrate 9 so as to obtain the structured cap substrate 1 (G1-2). Removal may mean separating or selectively etching off of the semiconductor material, e.g. in a hot potash lye. In this manner, an improved method of producing a cap substrate 1 for capping radiation-emitting devices is provided since the cap substrate 1 obtained by the method as is schematically described in FIG. 1d includes an optical output window (emission window) formed by means of the window component 8. In some embodiments, the cover substrate 4 and the window component 8 are made of different glass materials. For example, a particularly suitable window glass material may be selected for the window component 8, whereas the cover substrate 4 consists of a different glass material which may be mechanically more robust, for example. In some embodiments, the glass material of the cover substrate 4 has a clearly lower viscosity, at the same temperature, than the glass material of the window component 8. For example, as an effective, stable package capping, the cover substrate 4 may thus present a relatively larger overall proportion of glass, which advantageously amounts to more than 50%, of the cap substrate 1 structured in accordance with the method. In this embodiment, the cover substrate is made of Borofloat® glass. The window component, in contrast, is made of "Eagle XG"® glass.

By means of the firm bonding of the mold substrate 2 and of the carrier substrate 9, e.g. by means of wafer bonding, one achieves that the resulting island regions 5, 6 are also firmly bonded to the carrier substrate 9, so that during the further method steps and in particular during tempering (temperature treatment) of the bonded substrates one can prevent that the island regions 5, 6 formed from the mold substrate 2 can laterally move or be slightly shifted in relation to the cover substrate 4 and/or the carrier substrate 9. Thus, the resulting window components can be manufactured with extremely high precision and, thus, very small manufacturing tolerances.

Figure 2A:
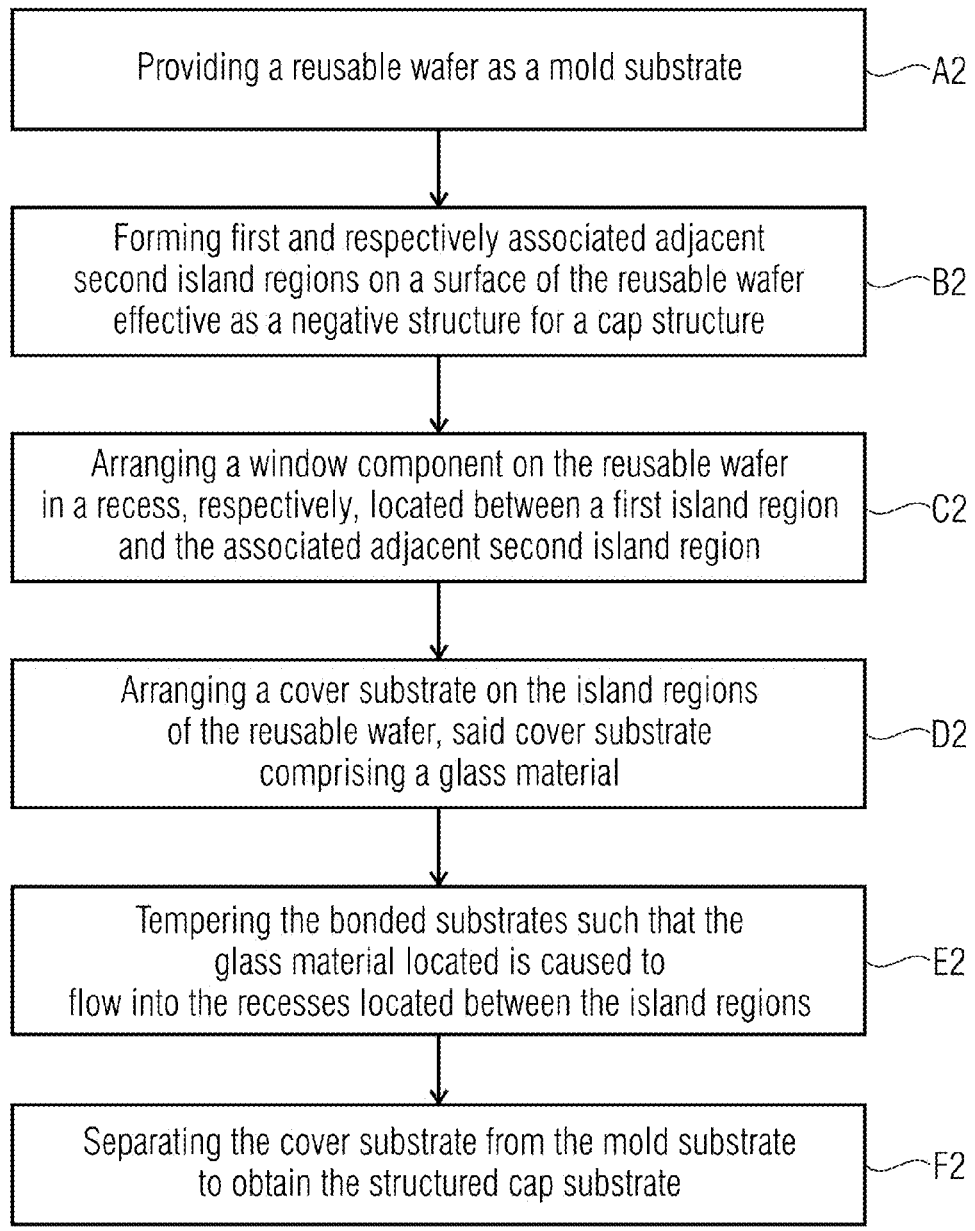
FIGS. 2a-b show a second method of producing a cap substrate.
Figure 2B:
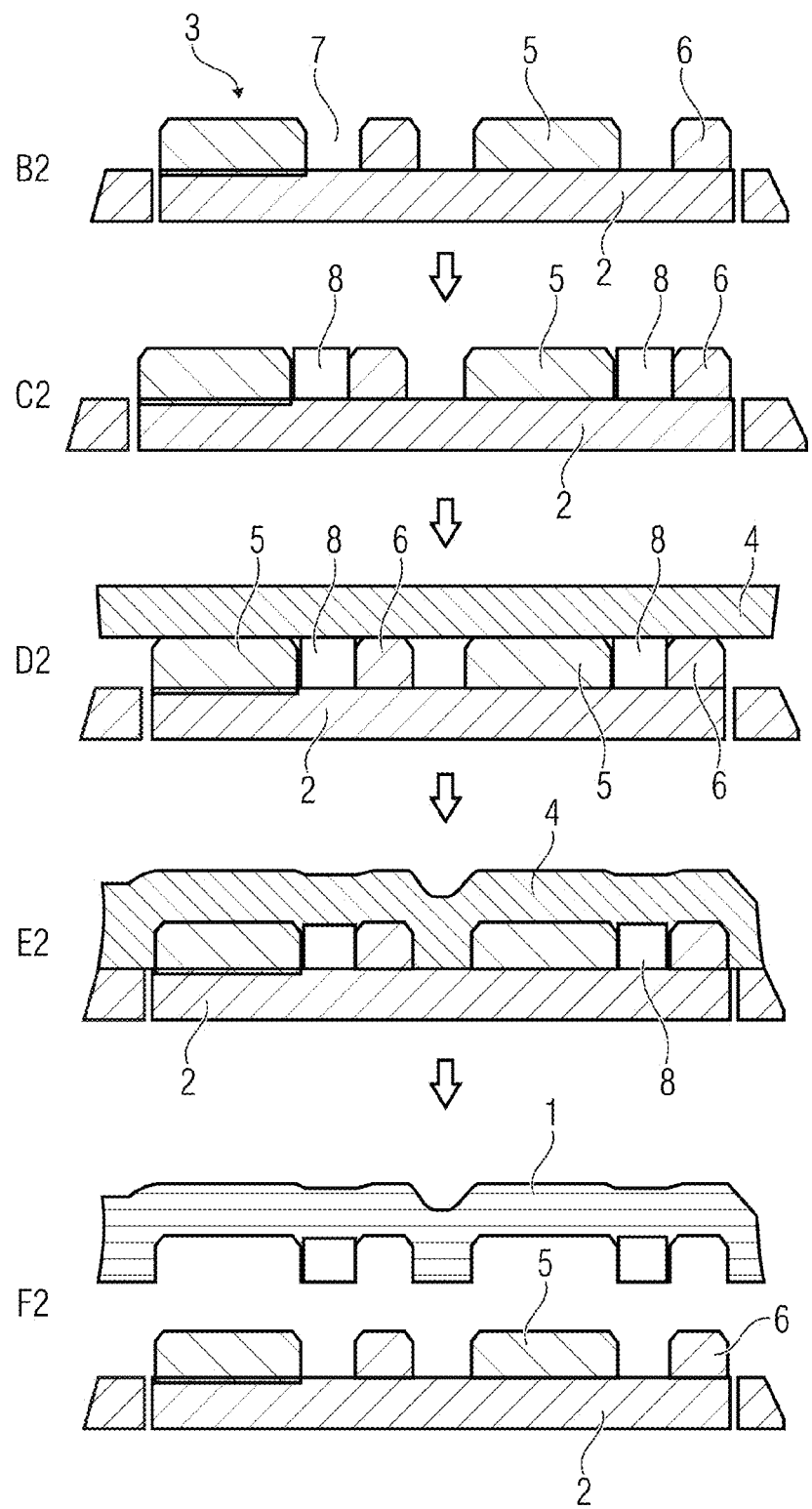

FIG. 2a shows a flowchart, illustrated by means of FIG. 2b, of a second method of producing a cap substrate 1. For example, the cap substrate 1 comprises a "lateral" optical window which forms an integral part of the cap and enables lateral beam extraction. For example, it is also possible for several "lateral" optical windows to be provided which form an integral part of the cap and enable lateral beam extraction in different directions.

In a step (B2), the method includes providing a reusable tool as the mold substrate 2, first island regions 5 and respectively associated adjacent second island regions 6 being formed on a surface of the reusable tool that is effective as a negative structure for a cap structure (B2). In this context, a recess 7 is provided, in the reusable tool, between the first island regions 5 and the respectively associated adjacent second island regions 6. Said recesses will be employed in a further step. Said further step (C2) specifically includes arranging a window component 8 on the reusable tool in the recess, respectively, that is located between a first island region 5 and the associated adjacent second island region 6. A further step (D2) then comprises arranging a cover substrate 4 on the island regions 5, 6 of the reusable tool, the cover substrate 4 comprising a glass material. This step comprises bringing the surface of the reusable wafer into contact with a surface of the cover substrate in such a way that they at least partially overlap.

A following further step (E2) comprises tempering the bonded substrates such that the glass material of the cover substrate 4 is caused to flow into the recesses 7 located between the island regions 5, 6. Eventually, the cover substrate 4 is separated from the mold substrate 2 in order to obtain the structured cap substrate 1 (F2). In this manner, an improved method of producing a cap substrate 1 for capping radiation-emitting devices is also provided since the cap substrate 1 obtained by the second method as is schematically described in FIGS. 2a and 2b includes an optical output window formed by means of the window component 8. In some embodiments, the cover substrate 4 and the window component 8 are made of different glass materials. For example, a particularly suitable window glass material may be selected for the window component, whereas the cover substrate consists of a different glass material which may be mechanically more robust, for example. For example, as an effective, stable package capping, the cover substrate may thus present a relatively larger overall proportion of glass, which advantageously amounts to more than 50%, of the structured cap substrate. In this embodiment, the cover substrate is made of Borofloat® glass. The window component, in contrast, is made of "Eagle XG"® glass.

Figure 10:
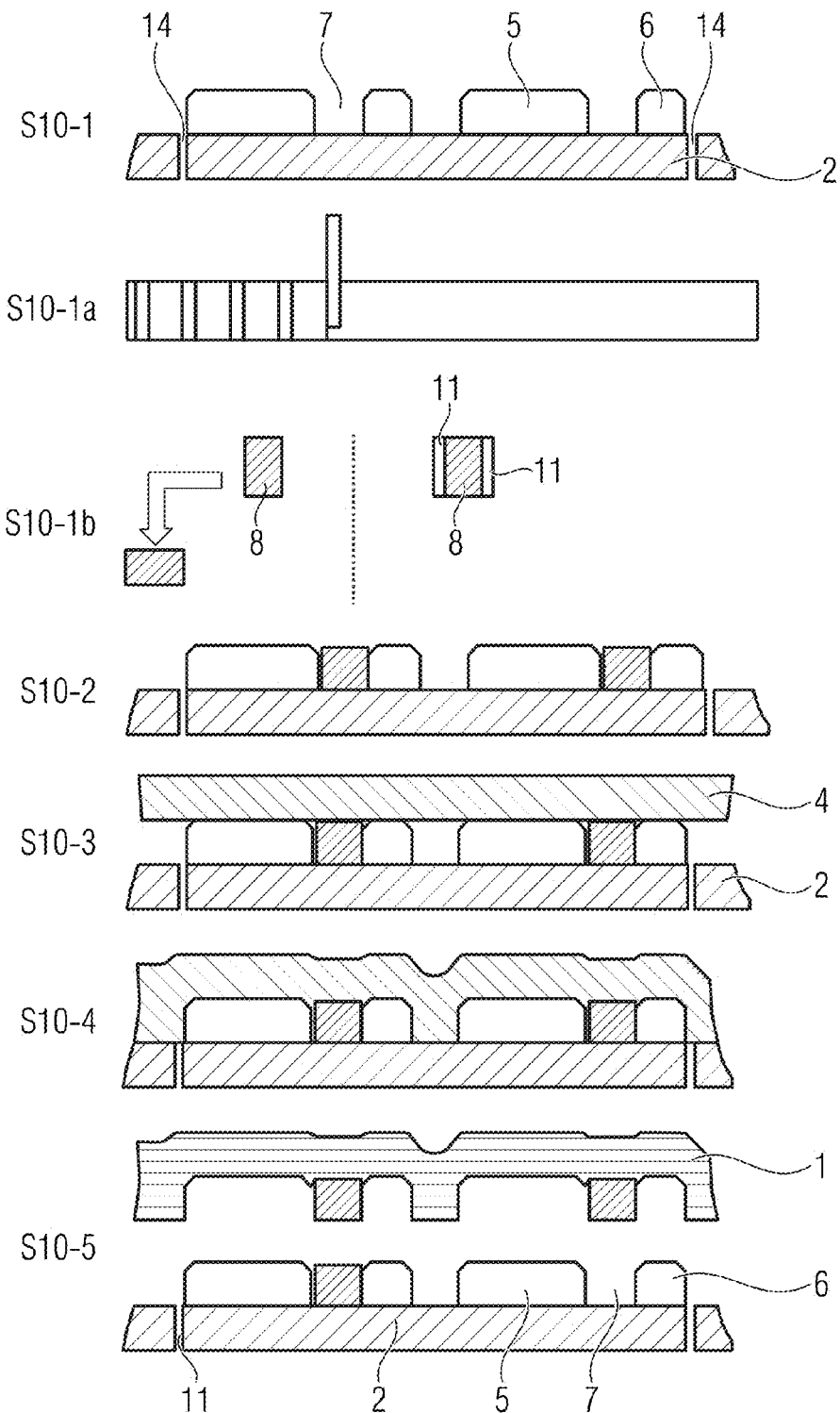
FIG. 10 illustrates possible substeps of a second method of producing a cap substrate by means of sketches.

In embodiments of the second method as is shown in FIGS. 2a and 2b, a graphite wafer is provided as the reusable tool, as applies also to the present case. As an alternative to a mold which consists of graphite entirely, other materials may basically also be considered for producing such a mold, among others temperature-resistant steels and ceramics (SIC, glassy carbon or others), in particular when said molds are additionally provided with a coating which prevents the glass mass from adhering (e.g. graphite or, even better, boron nitride (BN)). By applying such a glass-repellent protective layer, it is also possible, for a method in accordance with FIGS. 2a and 2b, for such a mold to be made of silicon. FIG. 10 shows substeps of the second method.

FIGS. 3a-f illustrate further possible and optional substeps of a first method of producing a cap substrate, as was described by means of FIGS. 1a-d, in an exemplary manner by means of sketches.

Figure 3A:
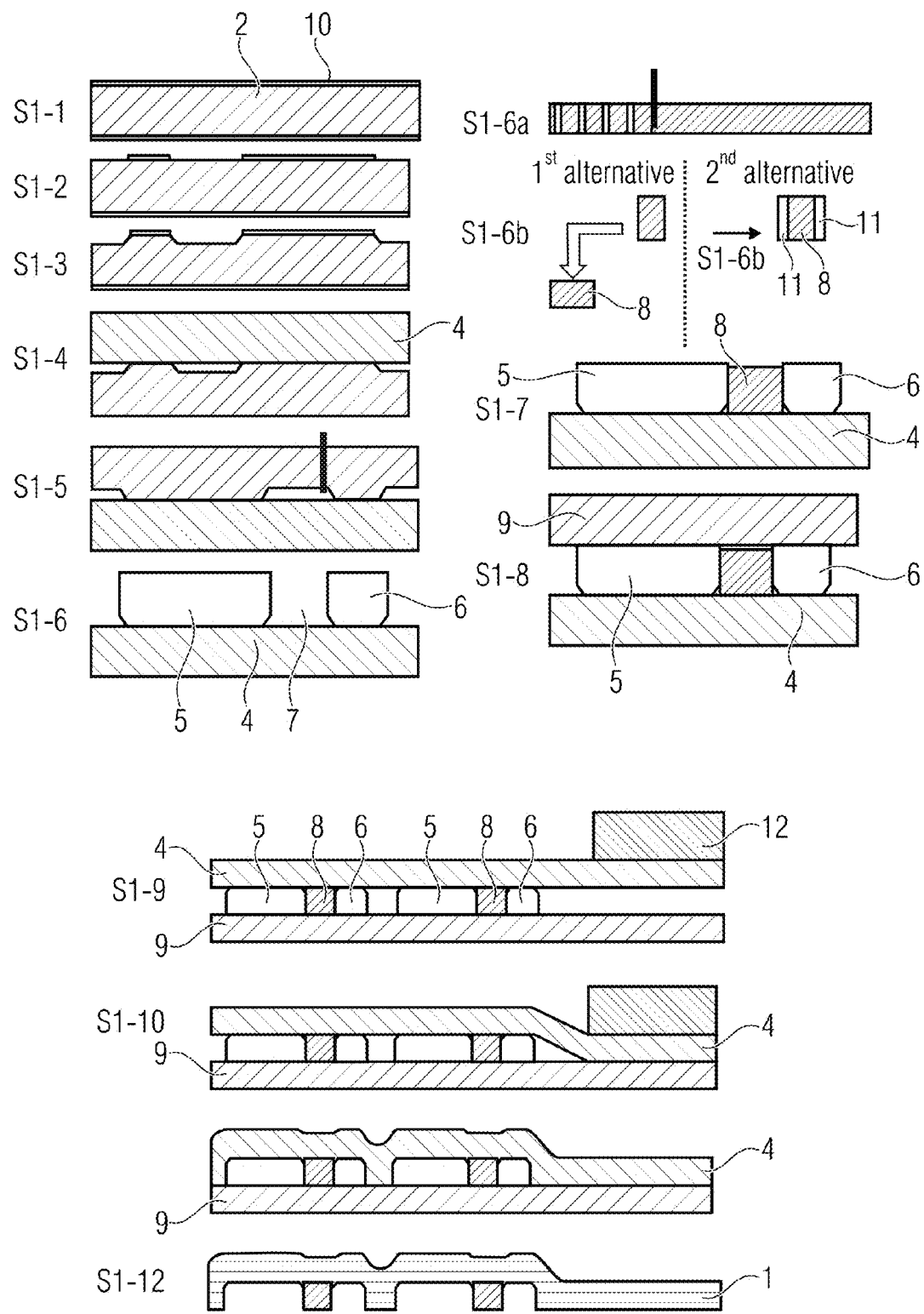
FIGS. 3a-f show possible substeps and alternatives to the first method of producing a cap substrate by means of sketches.

The substeps presented in FIG. 3a are to be regarded as being merely exemplary and may comprise variations in other implementations. What is shown is a possible process sequence in terms of how said cap wafers, i.e. the cap substrates, with integrated vertical optical window surfaces can be produced. The method is essentially based on techniques of so called glass flowing (glass liquefaction, glass casting). A substep S1-1 comprises coating a silicon wafer, i.e. a mold substrate 2, with a KOH-resistant passivation 10, in this case LP nitride, for example. A substep S1-2 comprises performing lithography, so that only islands remain unetched, and opening the passivation by means of plasma etching. A substep S1-3 comprises anisotropic wet-chemical etching, in this case by using KOH, and etching off of the passivation. A substep S1-4 comprises anodic bonding of a glass wafer, i.e. of a cover substrate 4, to the silicon wafer. In this case, the cover substrate 4 is formed from Pyrex glass material. However, it may also be formed from the Borofloat® 33 glass material, for example. A substep S1-5 comprises sawing into the structures, here by means of cap dicing. A substep S1-6 comprises removing the strips between the islands.

A substep S1-6a comprises cutting to length, here sawing to length, of strips of the actual window material, i.e. of the window components 8. What is at hand in this embodiment as compared to the glass material of the cover substrate is higher-melting glass which, however, comprises similar, ideally identical, thermal expansion coefficients. Suitable glass materials are, for example, "AF 32"® (Schott) or, as in this example, "Eagle XG"® (Corning®). A step S1-6b comprises rotating to the side, for example by 90°, so that the optically suitable faces end up in a position that is favorable in relation to the cover substrate 4 in terms of flatness and roughness of the window component 8.

If a low-melting glass material such as Borofloat® glass, for example, is used for the window component 8 instead of a higher-melting glass, said low-melting glass material may be provided with silicon supports 11 so that it is kept in its shape during the tempering step, as illustrated by means of S1-6b, "alternative 2", and will be explained in detail below with reference to FIG. 3b.

In embodiments, the silicon supports 11 may be bonded. Subsequently, the cover substrate 4 is assembled (loaded) in both cases. This is illustrated in substep S1-7 which shows insertion of the glass strips of 6b, the silicon structures, i.e. the island regions 5, 6, being used like a plugboard, so that the window surfaces, i.e. the window components 8, perfectly fit into the structures. The lateral island regions 5, 6 thus serve as "stops" for the window components 8. Thus, in some embodiments of the invention the window components 8 abut the island regions 5, 6 in an almost flush manner (in a manner not entirely free from gaps). Only a small gap ranging from about 5 μm to 50 μm should remain between the glass inserts, i.e. the window components 8, and the semiconductor structures, i.e. the first and second island regions 5, 6. The hot glass mass is still very viscous and can enter into said gaps to a small extent only. However, a certain distance facilitates introduction of the window components 8 into the semiconductor structures.

A step S1-8 comprises, in accordance with FIG. 3a, placing of a further silicon wafer, in other words placing of a carrier substrate 9. A step S1-9 comprises turning around the wafer stack, i.e. the stack comprised of the cover substrate 4, the carrier substrate 9 and intermediate first island regions 5 and second island regions 6 of the mold substrate 2, in this case by 180°, placing of a load ring (stress ring) 12 onto the cover substrate 4, in this case to an edge region of the cover substrate 4, and evacuating the recesses 7 located between the cover substrate 4 and the carrier substrate 9. The load ring 12 is coated to avoid gluing to the cover substrate 4. A step S1-10 comprises vacuum tempering, which includes hermetically sealing the wafer and subsequently removing the pressure support, i.e. the load ring 12. A step S1-11 comprises tempering under atmospheric pressure. In this context, the glass mass, i.e. the glass material of the cover substrate 4, is pressed into the large gaps, the recesses 7, but not into narrow ones such as between the window components 8 and the first island regions 5 and second island regions 6, for example, which surround the window surfaces during glass flowing and protect same from getting into contact with the glass mass of the glass wafer. A step S1-12 then comprises selectively etching off the silicon structures toward the glass structures, in this case by means of KOH. In the cap substrate 1, which is obtained in this manner, the glass material of the cover substrate 4 and the glass material of the window components 8 are thus integrally bonded even though in the embodiment described they are glass masses which differ from each other in terms of chemistry. The improved cap substrate 1 is a prerequisite for producing improved packaged (housed) radiation-emitting devices.

In other words, this means that the above method of FIG. 3a in accordance with the method of FIGS. 1a-b in embodiments (additionally) includes the following steps in providing the mold substrate 2: providing a semiconductor wafer 2 comprising a passivation layer 10 on a surface 3; lithographing the passivation layer 10 so that the passivation layer 10 will remain on the surface 3 where the first island regions 5 and the second island regions 6 are provided; etching the surface 3 of the semiconductor wafer 2 with regard to the lithographed regions, so that a thickness of the semiconductor wafer 2 is reduced perpendicularly to the lithographed regions of the surface so as to structure the surface region 3 and to thus specify positions for the first island regions 5 and the second island regions 6; and completely removing the passivation layer 10. In addition, the method of FIGS. 1a-b or FIG. 3a in embodiments thus comprises, in arranging and bonding the cover substrate 4, the step of anodically bonding, region by region, the structured surface region 3 of the mold substrate 2 with a surface region of the cover substrate 4. Moreover, said forming of island regions 5, 6 from the mold substrate 2 thus includes, in embodiments, the following steps: sawing into the first and second island regions 5, 6 in the mold substrate 2 following said region-by-region anodic bonding; and removing those portions of the mold substrate 2 that are separate from the bonded regions following the sawing.

As was shown, said arranging of the window component 8 in each case may include the following steps: providing several strip-shaped window components 8; and inserting the strip-shaped window components 8 into the recesses 7 located between the first island regions 5 and the second island regions 6, so that surfaces of the window components 8 that are provided as surfaces of optical output windows are located opposite surfaces of the island regions 5, 6 that are formed from the mold substrate 2. As was shown, provision may also be made for said providing of strip-shaped window components 8 to additionally include the following steps: providing a window component wafer and cutting to length of the strip-shaped window components 8 from the window component wafer. As was shown, said arranging of the respective window component 8 may also include the following step: inserting semiconductor strips 11 into the recesses 7 prior to inserting the strip-shaped window components 8 into the recesses, so that the semiconductor strips 11 are arranged between surfaces of the window components 8 that are provided as surfaces of optical output windows, and surfaces of the island regions 5, 6 that are formed from the mold substrate 2. As was shown, said arranging of the respective window component 8 may further include the following step: providing one or more strip-shaped window components 8 coated with semiconductor material 11. Moreover, provision may be made for said providing of a window component 8 coated with semiconductor material 11 to include the following step: coating surfaces of the window component 8 by bonding semiconductor strips 11 onto them.

For example, in the manner illustrated with reference to FIG. 3a one will thus obtain, substep by substep, a cap substrate 1 in accordance with the method of FIG. 1a-b. Essential features of said method are as follows, as results from FIG. 3a and the explanations:

1. Utilization of island-like silicon structures, or, generally, semiconductor structures, which serve as a plugboard.
2. Insertion of glass structures, arranged in a strip shape, into said structures.
3. Rotating said glass structures by 90° during insertion so as to vertically align the good optical surfaces.
4. Realizing small dimensions of gaps between the window components and the first island regions and/or the second island regions (approx. 50 μm or smaller, for example 20 μm to 50 μm; strictly speaking, the aspect ratios are decisive since the glass mass takes very long to be able to fill very small gaps. As experience has shown, channels having widths of only few 10 μm cannot be filled up. Therefore, distances of 10 μm should be able to be achieved by the glass to a very limited extent only.)
5. Vacuum sealing in step S1-10 on a loosely underlaid silicon wafer.

Figures 1, 3B:
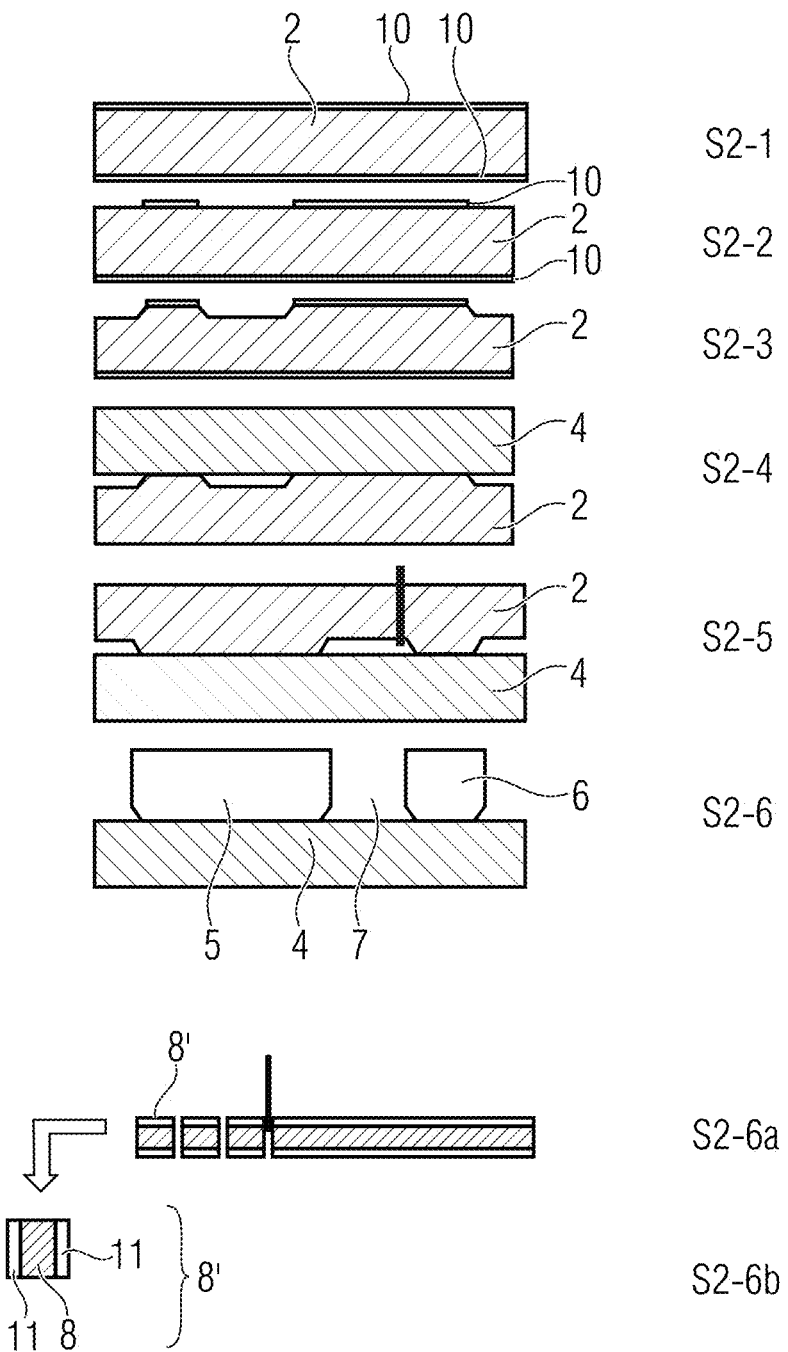
Figures 2, 3B:
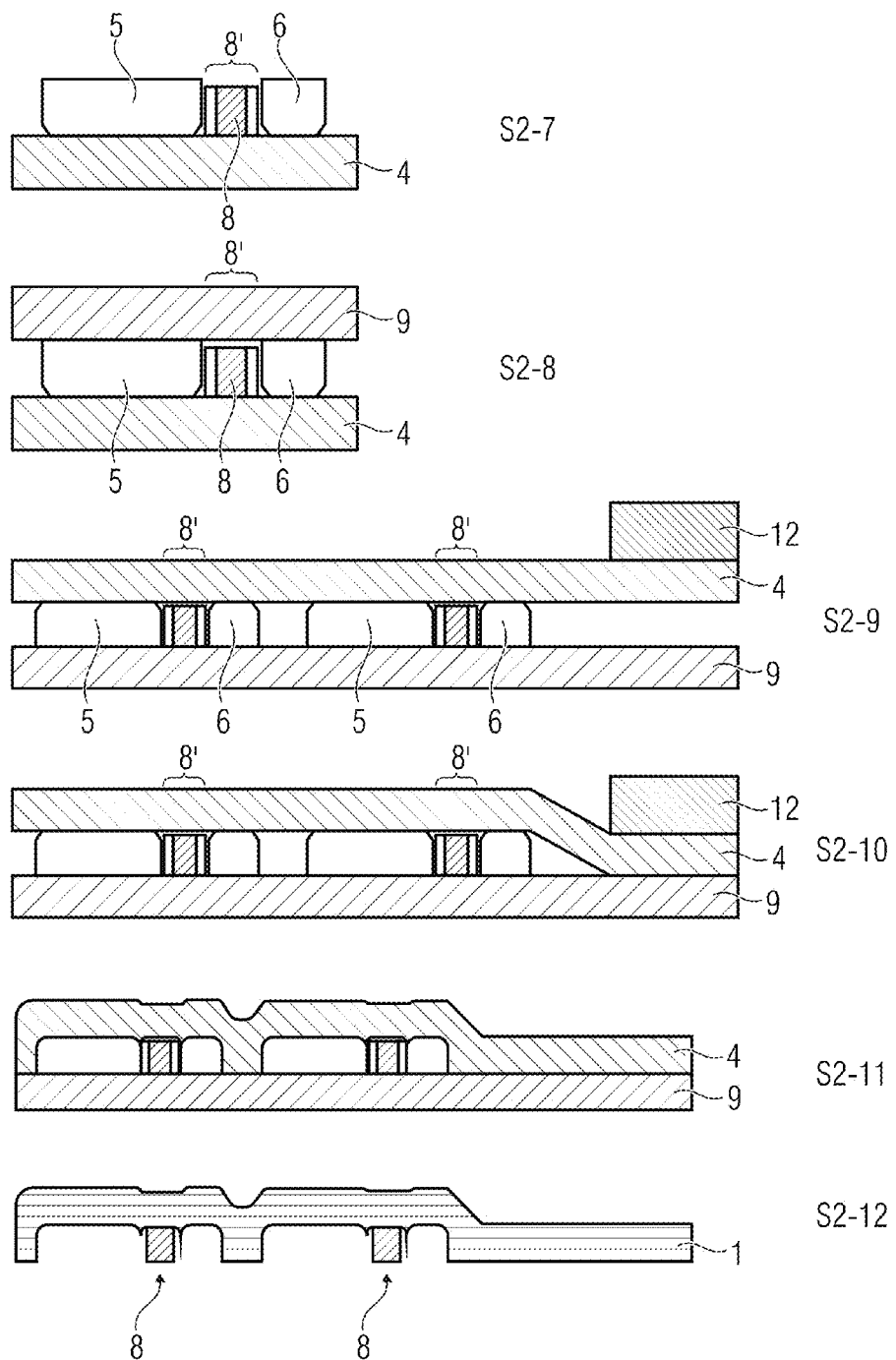

FIG. 3b illustrates substeps of a further method of producing a cap substrate by means of sketches. Said substeps are to be regarded as being merely exemplary and may comprise variations in other implementations. What is shown is a possible process sequence in terms of how said cap wafers, i.e. the cap substrates, with integrated vertical optical window surfaces can be produced. In the method presented here, Si-glass-Si structures (e.g. glass strips, or stacks, coated on two sides) are used as window strips for forming the window elements, or window surfaces.

The method is essentially based on techniques of so called glass flowing. A substep S2-1 comprises coating a silicon wafer, i.e. a mold substrate 2, with a KOH-resistant passivation 10, in this case LP nitride, for example. A substep S2-2 comprises performing lithography, so that only islands remain unetched, and opening the passivation by means of plasma etching. A substep S2-3 comprises anisotropic wet-chemical etching, in this case by using KOH, and etching off of the passivation. A substep S2-4 comprises anodic bonding of a glass wafer, i.e. of a cover substrate 4, to the silicon wafer. In this case, the cover substrate 4 is formed from Pyrex glass material. However, it may also be formed from the Borofloat® 33 glass material, for example. A substep S2-5 comprises sawing into the structures, here by means of cap dicing. A substep S2-6 comprises removing the strips between the islands 5,6 so as to obtain the recesses (notches) 7.

A substep S2-6a comprises cutting to length, e.g. sawing to length, of strips of the actual window material, i.e. of the coated window components 8'. A substrate made of the window material may be provided, e.g., on two sides with a layer 11 made of a semiconductor material, e.g. silicon. By means of said cutting to length, e.g. sawing, the strips 8', which are coated (on two sides), of the actual window material are obtained, said strips being provided, on two opposite side faces, with the layer 11 made of the semiconductor material, e.g. silicon.

If, therefore, a low-melting glass material such as Borofloat® glass, for example, or a different window material, is used for the window component 8 instead of a higher-melting glass (cf. FIG. 3a), said low-melting glass material may be provided with silicon supports 11 so that it is kept in its shape during the tempering step, as illustrated by means of S2-6b. In embodiments, the silicon supports 11 may be bonded.

A step S2-6b comprises rotating the coated window components 8' to the side, for example by 90°, so that the optically suitable faces end up in a position that is favorable in relation to the cover substrate 4 in terms of flatness and roughness of the window component 8. Moreover, the coated window components 8' are aligned such that the semiconductor layers 11 provided on both sides of the window components 8' are aligned in parallel with the side faces of the lateral island regions 5, 6.

Subsequently, the cover substrate 4 is assembled (loaded). This is illustrated in substep S2-7 which shows insertion of the coated glass strips 8' of 6b, the silicon structures, i.e. the island regions 5, 6, being used like a plugboard, so that the window surfaces, i.e. the coated window components 8', perfectly fit into the structures. The lateral island regions 5, 6 thus serve as "stops" for the window components 8'. Thus, in some embodiments of the invention the coated window components 8' abut the island regions 5, 6 in an almost flush manner (in a manner not entirely free from gaps). Only a small gap ranging from about 5 μm to 50 μm should remain between the coated glass inserts, i.e. the coated window components 8', and the semiconductor structures, i.e. the first and second island regions 5, 6. The hot glass mass is still very viscous and can enter into said gaps to a small extent only. However, a certain distance facilitates introduction of the window components 8' into the semiconductor structures.

A step S2-8 comprises, in accordance with FIG. 3b, placing of a further semiconductor wafer (e.g. silicon wafer), in other words placing of a carrier substrate 9. A step S2-9 comprises turning around the wafer stack, i.e. the stack comprised of the cover substrate 4, the carrier substrate 9 and intermediate first island regions 5 and second island regions 6 of the mold substrate 2, in this case by 180°, placing of a load ring (stress ring) 12 onto the cover substrate 4, in this case to an edge region of the cover substrate 4, and evacuating the recesses 7 located between the cover substrate 4 and the carrier substrate 9. The load ring 12 is coated to avoid gluing to the cover substrate 4. A step S2-10 comprises vacuum tempering, which includes hermetically sealing the wafer and subsequently removing the pressure support, i.e. the load ring 12. A step S2-11 comprises tempering under atmospheric pressure. In this context, the glass mass, i.e. the glass material of the cover substrate 4, is pressed into the large gaps, the recesses, or notches, 7, but not into narrow ones such as between the coated window components 8' and the first island regions 5 and second island regions 6, for example, which surround the coated window surfaces 8' during glass flowing and protect same from getting into contact with the glass mass of the glass wafer. A step S2-12 then comprises selectively etching off the silicon structures (i.e. of the carrier substrate 9 and the side faces 11 of the window elements 8) toward the glass structures, in this case by means of KOH, for example. In the cap substrate 1, which is obtained in this manner, the glass material of the cover substrate 4 and the glass material of the window components 8 are thus integrally bonded even though in the embodiment described they are glass masses which differ from each other in terms of chemistry. The exposed surfaces or side faces of the window components 8' are effective, or provided, as optical output windows. The improved cap substrate 1 is a prerequisite for producing improved packaged (housed) radiation-emitting devices.

In other words, this means that the above method of FIG. 3b in accordance with the method of FIGS. 1a-b in embodiments (additionally) includes the following steps in providing the mold substrate 2: providing a semiconductor wafer 2 comprising a passivation layer 10 on a surface 3; lithographing the passivation layer 10 so that the passivation layer 10 will remain on the surface 3 where the first island regions 5 and the second island regions 6 are provided; etching the surface 3 of the semiconductor wafer 2 with regard to the lithographed regions, so that a thickness of the semiconductor wafer 2 is reduced perpendicularly to the lithographed regions of the surface so as to structure the surface region 3 and to thus specify positions for the first island regions 5 and the second island regions 6; and completely removing the passivation layer 10. In addition, the method of FIGS. 1a-b or FIG. 3b in embodiments thus comprises, in arranging and bonding the cover substrate 4, the step of anodically bonding, region by region, the structured surface region 3 of the mold substrate 2 with a surface region of the cover substrate 4. Moreover, said forming of island regions 5, 6 from the mold substrate 2 thus includes, in embodiments, the following steps: sawing into the first and second island regions 5, 6 in the mold substrate 2 following said region-by-region anodic bonding; and removing those portions of the mold substrate 2 that are separate from the bonded regions following the sawing.

As was shown, said arranging of the coated window component 8' in each case may include the following steps: providing several strip-shaped coated window components 8'; and inserting the strip-shaped coated window components 8' into the recesses 7 located between the first island regions 5 and the second island regions 6, so that coated surfaces of the window components 8' are located opposite the lateral surfaces of the island regions 5, 6 that are formed from the mold substrate 2.

As was shown, provision may also be made for said providing of strip-shaped coated window components 8' to additionally include the following steps: providing a coated window component wafer and cutting to length of the strip-shaped coated window components 8' from the window component wafer. As was shown, said arranging of the respective window component 8' may also include the following step: inserting semiconductor strips 11 into the recesses 7 prior to inserting the strip-shaped window components 8 into the recesses, so that the semiconductor strips 11 are arranged between surfaces of the window components 8 that are provided as surfaces of optical output windows, and surfaces of the island regions 5, 6 that are formed from the mold substrate 2. As was shown, said arranging of the respective window component 8' may further include the following step: providing one or more strip-shaped window components 8' coated with semiconductor material 11. Moreover, provision may be made for said providing of a window component 8' coated with semiconductor material 11 to include the following step: coating surfaces of the window component 8 by bonding semiconductor strips 11 onto them so as to obtain the coated window component 8'.

For example, in the manner illustrated with reference to FIG. 3b one will thus obtain, substep by substep, a cap substrate 1 in accordance with the method of FIG. 1a-b. Essential features of said method are as follows, as results from FIG. 3b and the explanations:

1. Utilization of island-like silicon structures, or, generally, semiconductor structures, which serve as a plugboard.
2. Insertion of silicon structures, or, generally, glass semiconductor structures, arranged in a strip shape (see S2-6b), into said structures.
3. Rotating said silicon structures by 90° during insertion so as to vertically align the good optical surfaces.
4. Utilization of said silicon structures as protective structures so as to avoid direct contact, on the optical surfaces, with the glass mass of the glass wafer, which involves correspondingly small dimensions of gaps, i.e. small dimensions of gaps between the window components and the first island regions and/or the second island regions (approx. 50 μm or smaller, for example 20 µm to 50 µm; strictly speaking, the aspect ratios are decisive since the glass mass takes very long to be able to fill very small gaps. As experience has shown, channels having widths of only few 10 µm cannot be filled up. Therefore, distances of 10 µm should be able to be achieved by the glass to a very limited extent only.)

5. Vacuum sealing in step S2-10 on a loosely underlaid silicon wafer.

The production methods presented by means of FIGS. 3a and 3b may be similarly adapted in accordance with the alternative methods presented in FIGS. 1c and d in that in the process sequence, the mold substrate 2 (semiconductor wafer) is initially bonded to the carrier substrate 9 (semiconductor wafer) by means of wafer bonding, while in a later production step, the cover wafer 4 is applied to the island structures 5, 6, which are formed from the mold substrate 2 and are firmly bonded to the carrier substrate 9. The production methods depicted by means of FIGS. 3a-b may be adapted and/or rearranged accordingly so as to apply the process sequence, which is presented there, in accordance with the approach of FIGS. 1c and d. The remaining process steps of the process sequence may be maintained essentially unchanged.

Figures 1, 3C:
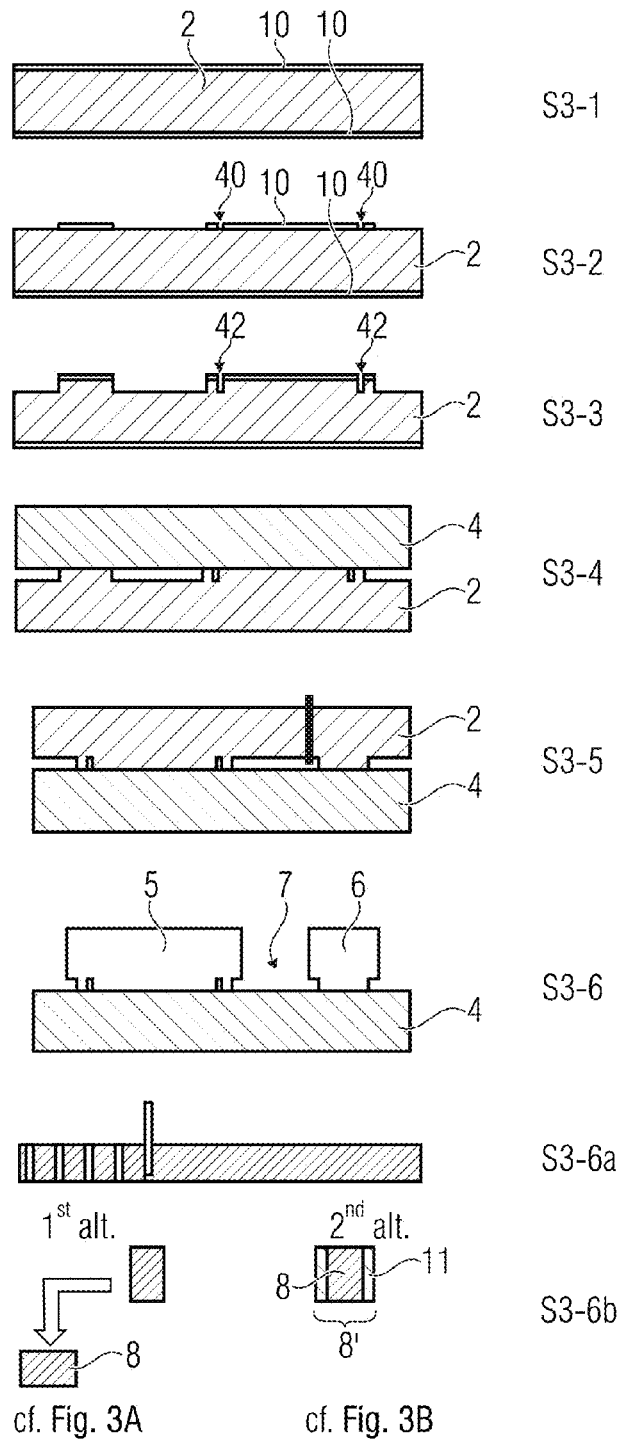
Figures 2, 3C:
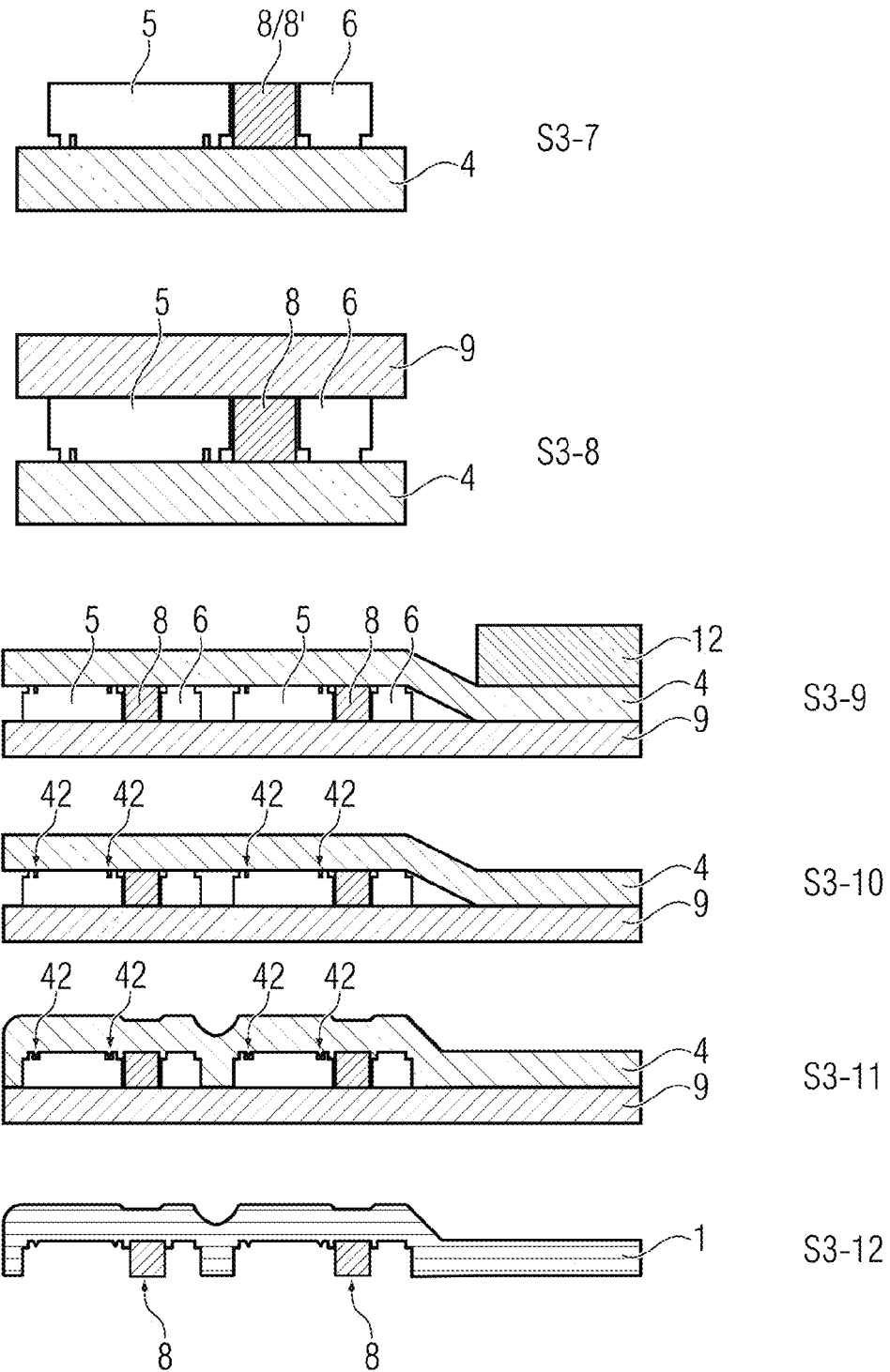

FIG. 3c illustrates substeps of a further method of producing a cap substrate by means of sketches. Said substeps are to be regarded as being merely exemplary and may comprise variations in other implementations. What is shown is a possible process sequence in terms of how said cap wafers, i.e. the cap substrates, with integrated vertical optical window surfaces can be produced. The method is essentially based on techniques of so-called glass flowing. In the method presented here, additional channel structures are provided, e.g. within the semiconductor structures (Si structures), said additional channel structures facilitating final removal of the silicon from the cavities by means of anisotropic wet-chemical etching.

A substep S3-1 comprises coating a silicon wafer, i.e. a mold substrate 2, with a KOH-resistant passivation 10, in this case LP-nitride, for example. A substep S3-2 comprises a lithography, so that only islands remain unetched, and opening of the passivation by means of plasma etching. In the process, additional "small" channel structures 40 are further defined within the islands 10.

A substep S3-3 comprises an anisotropic etching operation, e.g. an anisotropic dry-chemical etching operation (DRIE—Deep Reactive Ion Etching). In this etching operation, the channels 42 shall be formed within the mold substrate in addition to the structurings of the surface 3 of the mold substrate 2, the channels being arranged there, e.g., at such positions within the mold substrate 2 where the island regions 5, 6, which define the intermediate recesses, or notches, 7, will be formed at a later point in time (cf. steps S3-5 and S3-6).

The width and depth of the channels 42 are dimensioned such that in the tempering steps subsequently performed (cf. steps S3-9 to S3-12), the channels 42 within the island regions 5, 6 will not be or will not be able to be fully filled up with the glass material of the cover substrate 4 which also flows into the remaining recesses 7 located between the island regions 5, 6. Eventually, the passivation 10 on the form substrate 2 is also removed, e.g. by being etched off.

With regard to the further process and/or method steps S3-4 to S3-12 depicted in FIG. 3c it shall be noted that said substeps may essentially be performed similarly to substeps S1-4 to S1-12 and S2-4 to S3-12, respectively, described by means of FIGS. 3a-b, reference being made, in this respect, to the above description of FIGS. 3a-b for further technical details. In the production method depicted by means of FIG. 3c it shall merely be pointed out that the depicted production steps S3-4 to S3-11 continue to have the channels 42 contained within the island regions 5, 6. Step S3-12 then comprises selectively etching off the silicon structures toward the glass structures, which is performed, for example, by means of a wet-chemical method (e.g. with KOH—potassium hydroxide). In the cap substrate 1 obtained in this manner, the glass material of the cover substrate 4 and the glass material of the window components 8 are thus integrally bonded even though in the embodiment described, they are glass masses which differ from each other in terms of chemistry.

In the etching operation performed in step S3-12, the channels 42 provided advantageously result in that the semiconductor material (Si material) can be etched out clearly faster since the etching agent, e.g. KOH, can be supplied to the silicon material to be etched away in a larger amount via the channels 42. Thus, the etching operation of the semiconductor, or silicon, material can be heavily supported and thus be reduced in terms of duration. By providing the channels 42 in the inventive production method, etching out of the Si material can thus be clearly accelerated, whereas the channels 42 may be dimensioned, e.g., to have a width of a few 10 µm (a width of ≤50 µm), so that during the tempering operation, the channels 42 are not filled with the glass material of the cover substrate.

Figures 1, 3D:
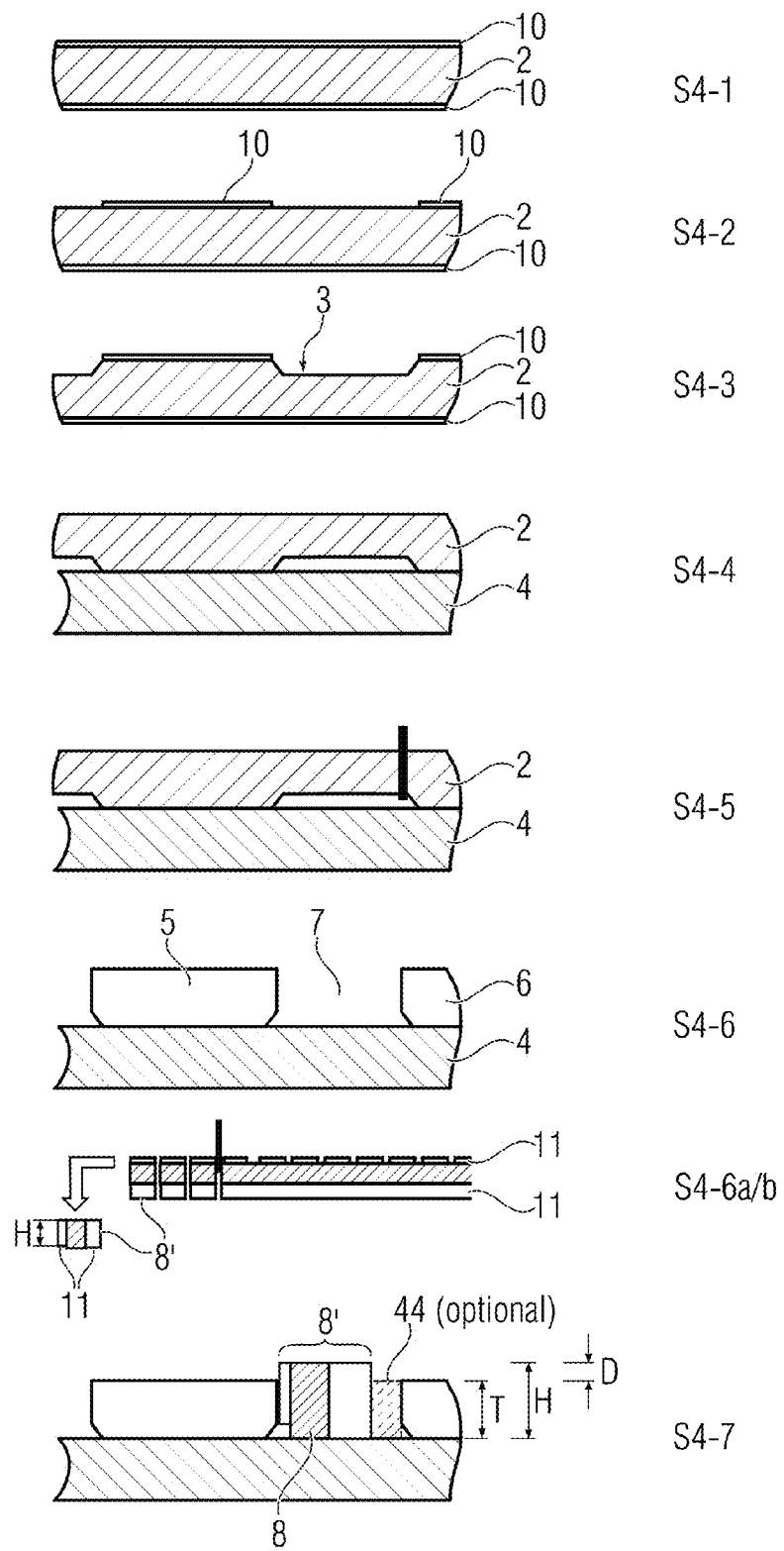
Figures 2, 3D:
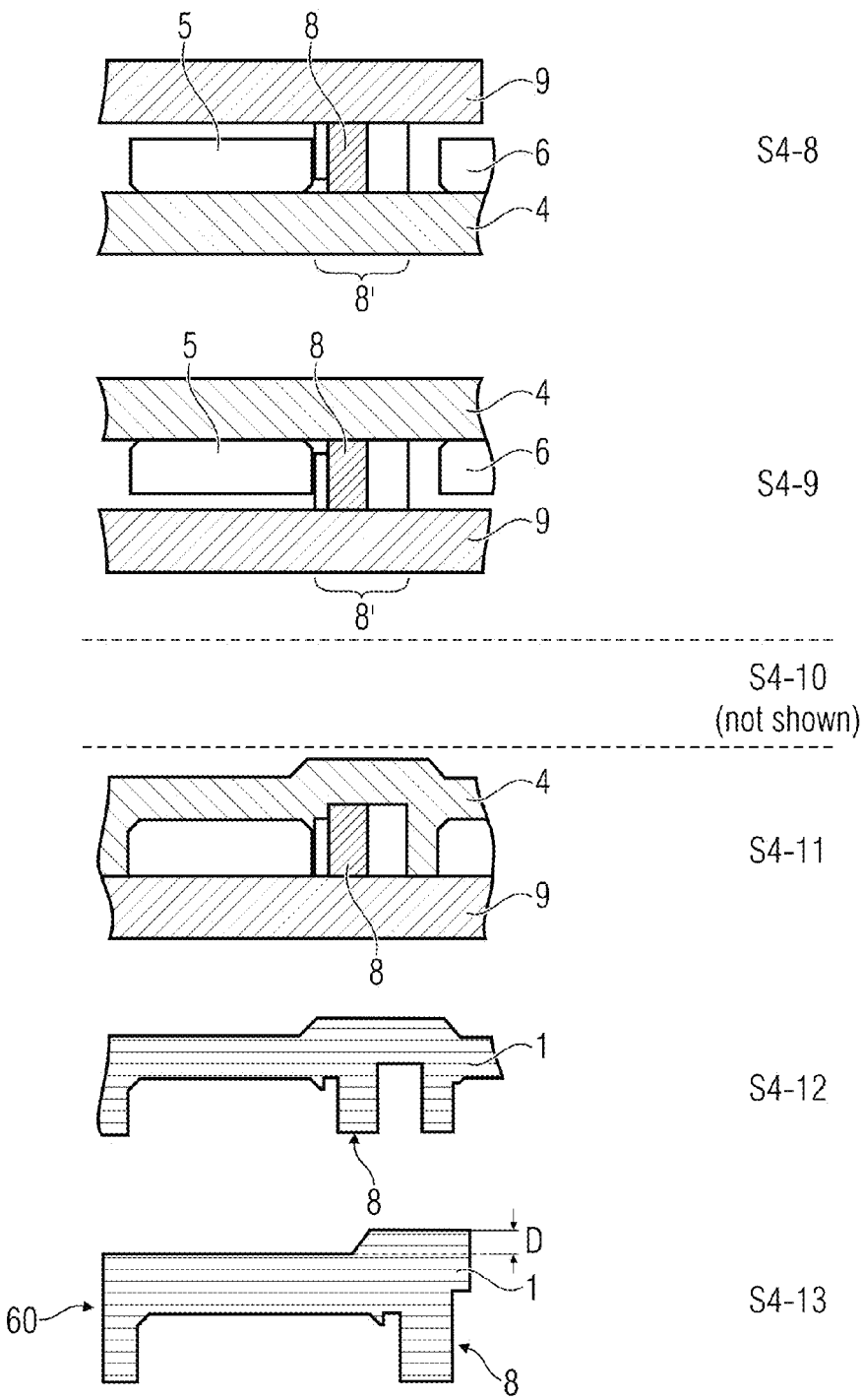

Substeps S4-1 to S4-13 illustrated in FIG. 3d present a further method of producing a cap substrate by means of sketches. Said substeps are to be regarded as being merely exemplary and may comprise variations in other implementations. What is shown is a possible process sequence in terms of how said cap wafers, i.e. the cap substrates, with integrated vertical optical window elements having enlarged (outer) window surfaces can be produced. Thus, larger outer optical surfaces may eventually be realized without having to increase the cavity. The method is again based essentially on techniques of so-called glass flowing.

A substep S4-1 comprises coating a silicon wafer, i.e. a mold substrate 2, with a KOH-resistant passivation 10, in this case LP nitride, for example. A substep S4-2 comprises performing lithography, so that only islands remain unetched, and opening the passivation by means of plasma etching. A substep S4-3 comprises anisotropic wet-chemical etching, in this case by using KOH, and etching off of the passivation. A substep S4-4 comprises anodic bonding of a glass wafer, i.e. of a cover substrate 4, to the silicon wafer. In this case, the cover substrate 4 is formed from Pyrex glass material. However, it may also be formed from the Borofloat® 33 glass material, for example. A substep S4-5 comprises sawing into the structures, here by means of cap dicing. A substep S4-6 comprises removing the strips between the islands 5,6 so as to obtain the recesses (notches) 7.

With regard to the production method presented in FIG. 3d it shall be noted that substeps S4-1 to S4-12 presented essentially correspond to substeps S1-1 to S1-12 of FIG. 3a and/or to substeps S2-1 to S2-12 of FIG. 3b as well as to substeps S3-1 to S3-12 of FIG. 3d, the descriptions given there being similarly applicable to substeps S4-1 to S4-12 presented by means of FIG. 3d.

In the following, only the changes and/or variations of the production methods presented above by means of FIGS. 3a, b and c will be addressed, the remaining technical details of FIG. 3a-c being similarly applicable in the method of FIG. 3d, as was indicated above.

A substep S4-6*a/b* comprises cutting to length, here sawing to length, of strips of the actual window material, i.e. of the window components 8 (not shown in S4-6*a* of FIG. 3*d*), or of the coated window components 8'. A substrate made of the window material may be provided, e.g., on two sides with a layer 11 made of a semiconductor material, e.g. silicon. By means of said cutting to length, e.g. sawing, the strips 8', which are coated (on two sides), of the actual window material are obtained, said strips being provided, on two opposite side faces, with the layer 11 made of the semiconductor material, e.g. silicon, and forming a so-called window stack.

As depicted in substep S4-6*a/b* of FIG. 3*d*, the coated window components 8' may be configured such that the layer 11 made of the semiconductor material, e.g. silicon, has different thicknesses and/or areal extents on different side faces of the window components 8'. For example, in substep S4-6*a/b* of FIG. 3*d*, the "upper" coating is thinner and has a smaller area than the "lower" coating. As is also depicted in substep S4-6*a/b* of FIG. 3*d*, an optional stop structure 44 may be present, which is presented by a dashed line (since the structure is not located within the sectional plane of the package presented here), said stop structure supporting, portion by portion, the Si-glass-Si strip at the edge of the strip. In this context, please also refer to the description which follows and will be given by means of FIGS. 4*a-b*.

If, therefore, a low-melting glass material such as Borofloat® glass, for example, or a different window material, is used for the window component 8 instead of a higher-melting glass (cf. FIG. 3*a*), said low-melting glass material may be provided with silicon supports 11 so that it is kept in its shape during the tempering step, as illustrated by means of S4-6*b*. In embodiments, the silicon supports 11 may be bonded. A step S4-6*a/b* comprises rotating the coated window components 8' to the side, for example by 90°, so that the optically suitable faces end up in a position that is favorable in relation to the cover substrate 4 in terms of flatness and roughness of the window component 8'. Moreover, the coated window components 8' are aligned such that the semiconductor layers 11 provided on both sides of the window components 8' are aligned in parallel with the side faces of the lateral island regions 5, 6.

As is further presented in substep S4-6*a/b* of FIG. 3*d*, the height of the coated window components 8' is selected such that the height H is larger than the thickness T) of the island regions 5, 6 formed from the original mold substrate 2. Thus, the coated window components 8' project beyond the surface of the island regions 5, 6.

Subsequently, the cover substrate 4 is assembled (loaded). This is illustrated in substep S4-7 which shows insertion of the glass strips of 6*b*, the silicon structures, i.e. the island regions 5, 6, being used like a plugboard, so that the window surfaces, i.e. the window components 8, perfectly fit into the structures in lateral terms and vertically project beyond the surface of the island regions 5, 6 by a distance D (=H−T). The lateral island regions 5, 6 thus serve as "stops" for the window components 8. Thus, in some embodiments of the invention the window components 8 abut the island regions 5, 6 in an almost flush manner (in a manner not entirely free from gaps). Only a small gap ranging from about 5 μm to 50 μm should remain between the glass inserts, i.e. the window components 8, and the semiconductor structures, i.e. the first and second island regions 5, 6. The hot glass mass is still very viscous and can enter into said gaps to a small extent only. However, a certain distance facilitates introduction of the window components 8 into the semiconductor structures.

A step S4-8 comprises, in accordance with FIG. 3*d*, placing of a further silicon wafer, in other words placing of a carrier substrate 9. A step S4-9 comprises turning around the wafer stack, i.e. the stack comprised of the cover substrate 4, the carrier substrate 9 and intermediate first island regions 5 and second island regions 6 of the mold substrate 2, in this case by 180°, placing of a load ring (stress ring) 12 onto the cover substrate 4, in this case to an edge region of the cover substrate 4, and evacuating the recesses 7 located between the cover substrate 4 and the carrier substrate 9. The load ring 12 is coated to avoid gluing to the cover substrate 4. A step S4-10 comprises vacuum tempering, which includes hermetically sealing the wafer and subsequently removing the pressure support, i.e. the load ring 12. A step S4-11 comprises tempering under atmospheric pressure. In this context, the glass mass, i.e. the glass material of the cover substrate 4, is pressed into the large gaps, the recesses 7, but not into narrow ones such as between the window components 8 and the first island regions 5 and second island regions 6, for example, which surround the window surfaces during glass flowing and protect same from getting into contact with the glass mass of the glass wafer. A step S4-12 then comprises selectively etching off the silicon structures toward the glass structures, in this case by means of KOH. In the cap substrate 1, which is obtained in this manner, the glass material of the cover substrate 4 and the glass material of the window components 8 are thus integrally bonded even though in the embodiment described they are glass masses which differ from each other in terms of chemistry. The improved cap substrate 1 is a prerequisite for producing improved packaged (housed) radiation-emitting devices.

Substep S4-13 comprises dicing, for example by means of sawing, the individual covers; the individual cover element shown in S4-13 clearly shows that the optically effective outer surface of the individual package 60 is clearly increased, i.e. by the length A, as compared to the production method previously presented. Since radiation- and/or light-emitting devices accommodated within the inventive package and/or the cover 1 frequently exhibit a relatively large amount of beam expansion, and since optics (e.g. collimation optics) can only be provided downstream from the package, the inventive approach of FIG. 3*f* of producing enlarged outer window surfaces for a cap substrate and/or individual cap elements provides a possibility, which is relatively easy to implement in the production process, of realizing such enlarged outer window surfaces. For example, packages may easily be produced into which lasers having beam divergences of ±35° may be packaged.

Figures 1, 3E:
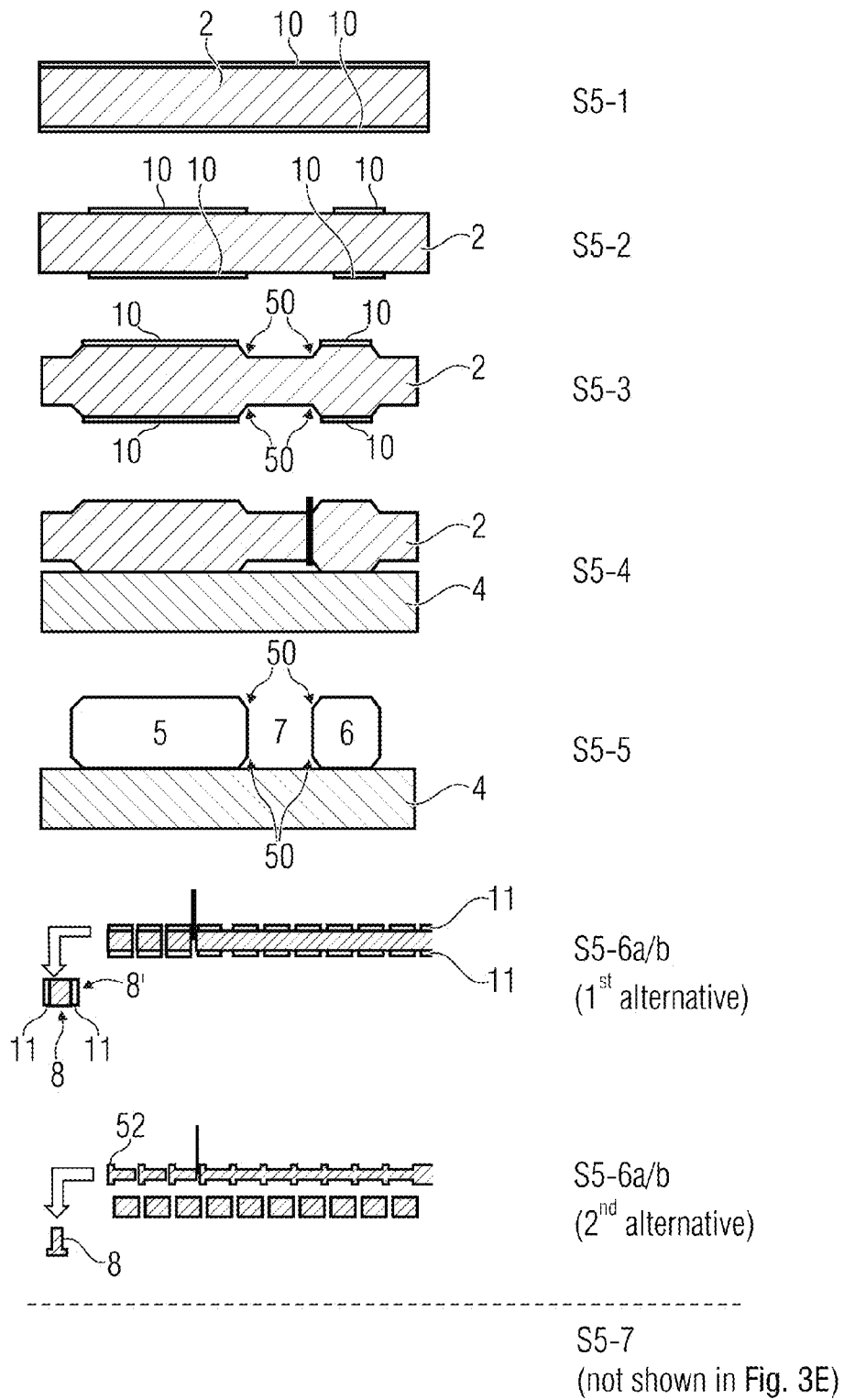
Figures 2, 3E:
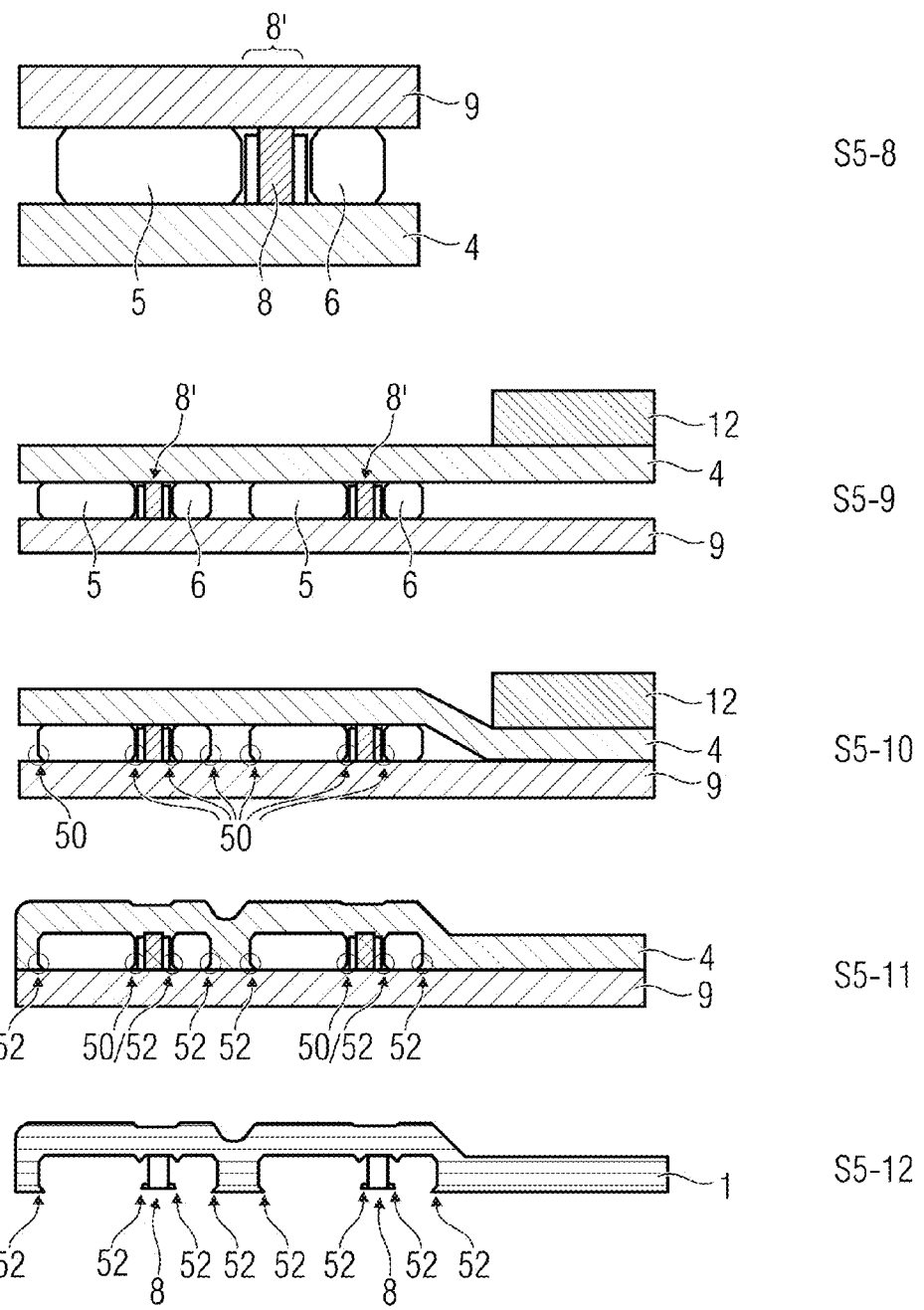

Substeps S5-1 to S5-12 illustrated in FIG. 3*e* present a further method of producing a cap substrate by means of sketches. Said substeps are to be regarded as being merely exemplary and may comprise variations in other implementations. What is shown is a possible process sequence in terms of how said cap wafers, i.e. the cap substrates, with integrated vertical optical window elements can be produced, the process sequence depicted facilitating the production of circumferential geometric overlaps (undercuts) of the side walls. The different regions to be provided with metalization (for electrical and/or mechanical contacting) comprise an undercut structure as a spatial boundary or separation. As a result, separate metalization regions may be formed, it being possible to simplify further processing on account of the projecting support faces.

A substep S5-1 comprises coating a silicon wafer, i.e. a mold substrate 2, with a KOH-resistant passivation 10, in this case LP nitride, for example. A substep S5-2 comprises performing lithography, so that only islands remain unetched, and opening the passivation 10 by means of plasma etching. A substep S5-3 comprises anisotropic wet-chemical etching on both sides, in this case by using KOH, and etching off of the passivation.

A substep S5-4 comprises anodic bonding of a glass wafer, i.e. of a cover substrate 4, to the silicon wafer. In this case, the cover substrate 4 is formed from Pyrex glass material. However, it may also be formed from the Borofloat® 33 glass material, for example. A substep S5-4 further comprises sawing into the structures, here by means of cap dicing. A substep S5-5 comprises removing the strips between the islands 5,6 so as to obtain the recesses (notches) 7.

In substep S5-2, said opening of the passivation 10 on the mold substrate 2 is performed on both sides and essentially in a symmetrical manner; subsequently, in said anisotropic wet-chemical etching in step S5-3, recesses are produced within the mold substrate 2 on both sides and essentially in a symmetrical manner, said recesses laterally and obliquely extending upward to the (non-etched) surface of the mold substrate 2.

In substep S5-4, sawing into the structures is performed within the recesses, so that following removal of the strips between the islands 5, 6 so as to obtain the recesses (notches) 7, the beveling portions 50 (chamfers and/or tapers) remain on the island regions in step S5-5. Said chamfers 50 of the edges of the island regions 5, 6 are explicitly depicted in substeps S5-3, S5-4 and S5-5.

With regard to the production method presented in FIG. 3e it shall be noted that substeps S5-1 to S5-12 presented essentially correspond to substeps S1-1 to S1-12 of FIG. 3a and/or to substeps S2-1 to S2-12 of FIG. 3b as well as to substeps S3-1 to S3-12 of FIG. 3e, the descriptions given there being similarly applicable to substeps S5-1 to S5-12 presented by means of FIG. 3e.

In the following, only the changes and/or variations of the production methods presented above by means of FIGS. 3a-d will be addressed, the remaining technical details of FIG. 3a-d being similarly applicable in the method of FIG. 3e, as was indicated above.

A substep S5-6a/b (first and second alternatives) comprises cutting to length, here sawing to length, of strips of the actual window material, i.e. of the window components 8, or of the coated window components 8'.

As depicted in the first alternative of step S5-6a/b, a substrate made of the window material may be provided, e.g., on two sides with a layer 11 made of a semiconductor material, e.g. silicon. By means of said cutting to length, e.g. sawing, the strips 8', which are coated (on two sides), of the actual window material are obtained, said strips being provided, on two opposite side faces, with the layer 11 made of the semiconductor material, e.g. silicon, and forming a so-called window stack.

As depicted in substep S5-6a/b (first alternative) of FIG. 3e, the coated window components 8' may be configured such that the layer 11 (coating) made of the semiconductor material, e.g. silicon, is arranged on different opposing side faces of the window components 8' and has essentially identical thicknesses and/or areal extent.

If, therefore, a low-melting glass material such as Borofloat® glass, for example, or a different window material, is used for the window component 8 instead of a higher-melting glass (cf. FIG. 3a), said low-melting glass material may be provided with silicon supports 11 so that it is kept in its shape during the tempering step, as illustrated by means of S4-6b. In embodiments, the silicon supports 11 may be bonded.

Since the silicon supports 11 do not fully cover the window component 8 on both sides, one may achieve, in the subsequent tempering operation (see substep S5-11), that the circumferential undercuts 52 of the side walls are formed.

Substep S5-6a/b (first alternative) thus comprises cutting to length (sawing) the strips of the actual window material in the form of a triple stack from an Si-glass-Si material (Borofloat). Prior to dicing (cutting to length or sawing), however, the silicon supports 11 were structured such that following dicing of the Si-glass-Si strips, the silicon coatings, or silicon supports, 11 are removed in the support region on the (adjacent to the) carrier substrate 9 (silicon wafer) (see also substep S5-8).

In substep S5-6a/b (second alternative), the strips of the actual window material, i.e. of the window components 8, are higher-melting glass as compared to the glass material of the cover substrate, which exhibits similar, ideally identical, thermal expansion coefficients, however.

Thus, the high-melting glass material is etched in on both sides so as to obtain, adjacently to said regions etched away, heightening and/or broadening of the window components 8 within the region of the "mounting surface" thereof.

The window structures of substep S5-6a/b (second alternative) are then inserted, between the island regions 5, 6, into the recesses such that said broadenings, or edge regions, will be arranged adjacently to the arranged carrier substrate 9 (silicon wafer), e.g. within the chamfers 50 (not shown in FIG. 3e).

Suitable higher-melting glass materials are, e.g., "AF 32"® (Schott), or, as in this example, "Eagle XG"® (Corning®).

A step S5-6a/b (first alternative) comprises rotating the coated window components 8' to the side, for example by 90°, so that the optically suitable faces end up in a position that is favorable in relation to the cover substrate 4 in terms of flatness and roughness of the window component 8'. Moreover, the coated window components 8' are aligned such that the semiconductor layers 11 provided on both sides of the window components 8' are aligned in parallel with the side faces of the lateral island regions 5, 6.

A step S5-6a/b (second alternative) comprises rotating the window components 8 to the side, for example by 90°, so that the optically suitable faces end up in a position that is favorable in relation to the cover substrate 4 in terms of flatness and roughness of the window component 8. Moreover, the broadenings 52 of the window components 8 are aligned such that they ideally (in substep S5-8) adjoin, or abut, the arranged carrier substrate 9 (silicon wafer).

Subsequently, the cover substrate 4 is assembled (loaded) (substep S5-7—not shown in FIG. 3e) in that the glass strips of S5-6a/b (first and second alternatives) are inserted, the silicon structures, i.e. the island regions 5, 6, being used like a plugboard, so that the window surfaces, i.e. the window components 8, 8', perfectly fit into the structures in lateral terms. The lateral island regions 5, 6 thus serve as "stops" for the window components 8. Thus, in some embodiments of the invention the window components 8 abut the island regions 5, 6 in an almost flush manner (in a manner not entirely free from gaps). Only a small gap ranging from about 5 µm to 50 µm should remain between the glass inserts, i.e. the window components 8, and the semiconductor structures, i.e. the first and second island regions 5, 6. The hot glass mass is still very viscous and can enter into said gaps to a small extent only. However, a certain distance facilitates introduction of the window components 8 into the semiconductor structures.

A step S5-8 comprises, in accordance with FIG. 3e, placing of a further silicon wafer, in other words placing of a carrier substrate 9.

According to the first alternative, substep S5-6a/b comprises rotating the coated window components 8' to the side, for example by 90°, so that the coated window components 8' are aligned such that the semiconductor layers 11 provided on both sides of the window components 8' are aligned in parallel with the side faces of the lateral island regions 5, 6.

According to the second alternative of substep S5-6a/b, the broadenings 52 of the window components 8 are aligned such that they ideally (in substep S5-8) adjoin, or abut, the arranged carrier substrate 9 (silicon wafer) (not shown in FIG. 3e).

A step S5-9 comprises turning around the wafer stack, i.e. the stack comprised of the cover substrate 4, the carrier substrate 9 and intermediate first island regions 5 and second island regions 6 of the mold substrate 2, in this case by 180°, placing of a load ring (stress ring) 12 onto the cover substrate 4, in this case to an edge region of the cover substrate 4, and evacuating the recesses 7 located between the cover substrate 4 and the carrier substrate 9. The load ring 12 is coated to avoid gluing to the cover substrate 4. A step S5-10 comprises vacuum tempering, which includes hermetically sealing the wafer and subsequently removing the pressure support, i.e. the load ring 12. A step S5-11 comprises tempering under atmospheric pressure. In this context, the glass mass, i.e. the glass material of the cover substrate 4, is pressed into the large gaps, the recesses 7, but not into narrow ones such as between the window components 8 and the first island regions 5 and second island regions 6, for example, which surround the window surfaces during glass flowing and protect same from getting into contact with the glass mass of the glass wafer.

The (exposed) (glass material of the low-melting) window component 8 is at least partially pressed, in the tempering operation in substep S5-11, into the chamfers 50, shown in step S5-11, of the island regions 5, 6. In other words, this means that the glass material of the window components 8 that is not covered by the lateral coatings 11 (Si strips) is at least partially pressed, or at least partially flows, into the provided chamfers 50 of the island regions 5, 6 during the tempering operation (substep S5-11).

A step S5-12 then comprises selectively etching off the silicon structures toward the glass structures, in this case by means of KOH. In the cap substrate 1, which is obtained in this manner, the glass material of the cover substrate 4 and the glass material of the window components 8 are thus integrally bonded even though in the embodiment described they are glass masses which differ from each other in terms of chemistry. The improved cap substrate 1 is a prerequisite for producing improved packaged radiation-emitting devices.

The glass material that is at least partially pressed, or at least partially flows, into the chamfers 50 during the tempering operation (substep S5-11) now forms the extensions 52 (undercuts) on the cap substrate 1.

The arrangement, obtained in substep S5-12, of the cap substrate 1 with the (circumferential) extensions 52 may also be obtained when the window components 8 employed are those window components 8 which are presented in substep S5-6a/b (second alternative) and comprise the broadenings 52.

Figure 3F:
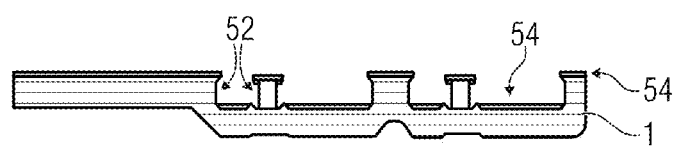
Figure 3F:
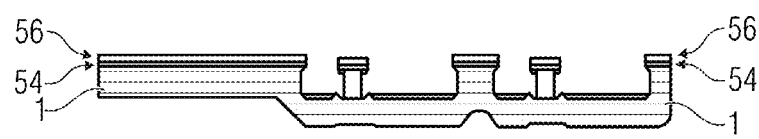
Figure 3F:
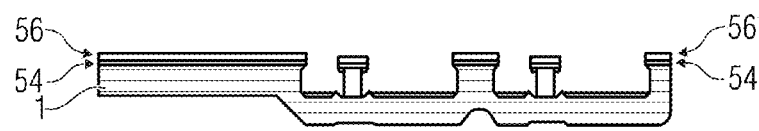
Figure 3F:
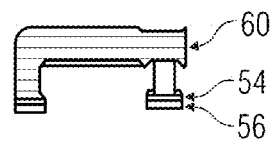

By means of FIG. 3f, embodiments of further processing of the cap substrate 1 obtained in substep S5-12 of FIG. 3e will be described below.

As depicted in substep S5-14, the cap substrate 1 is metalized, across its entire surface, starting from that side of the cap substrate 1 that faces the window elements 8. The resulting metalization 54 is performed across the entire surface, for example by means of vapor deposition or sputtering. The extensions 52 (undercuts) obtained on the cap substrate 1 prevent (undesired) metal layers from becoming attached to the (perpendicular) side faces, or side walls, of the cap substrate 1 during the metalization operation. Thus, the metalization 54 takes place essentially on the horizontal side faces (support faces for further processing) of the cap substrate 1 (from the top in the representation of FIG. 3f—substep S5-14). Thus, the metalization 54 of the cap substrate 1 is located at positions provided for attaching the cap substrate 1 to a further device substrate (not shown), where the radiation and/or light-emitting devices (LEDs, lasers, etc.) may be located, for example.

As is shown in substep S5-15a, the metalization layer 54 (i.e. the metalization of the support faces of the cap substrate 1) can be galvanically coated (electroplated) (by means of an galvanization (electrodeposition) operation) across its entire surface to obtain the additional coating 56. The additional coating 56 may be deposited, e.g., as a soldering system (e.g. AuSn) or may alternatively implement additional reinforcement with a noble metal layer.

In the alternative embodiment shown in substep S5-15b, the additional coating 56 may be obtained as a solder material layer (solder) in that the (upper) support faces coated with the metalization 54 are immersed into a liquid solder (solder bath), so that the solder is applied to the wettable metal layer 54. Thus, a solder material 56 may be applied to the wettable metal layers 54 extremely easily by means of a technical process.

In the embodiment depicted in substep S5-15c, said electrodeposition of the layer 56 or said soldering with a liquid solder may also be effected following dicing of the cap substrate 1, i.e. of a individual cap substrate element 60, as an individual chip.

It shall once again be pointed out in this context that the production methods presented by means of FIGS. 3a-e may be similarly adapted in accordance with the alternative methods presented in FIGS. 1c and d in that in the process sequence, the mold substrate 2 (semiconductor wafer) is initially bonded to the carrier substrate 9 (semiconductor wafer) by means of wafer bonding, while in a later production step, the cover wafer 4 is applied to the island structures 5, 6, which are formed from the mold substrate 2 and are firmly bonded to the carrier substrate 9. The production methods depicted by means of FIGS. 3a-e may be adapted and/or rearranged accordingly so as to apply the process sequence, which is presented there, in accordance with the approach of FIGS. 1c and d. The remaining process steps of the process sequence may be maintained essentially unchanged. By means of the firm bonding of the mold substrate 2 and of the carrier substrate 9, e.g. by means of wafer bonding, one achieves that the resulting island regions 5, 6 are also firmly bonded to the carrier substrate 9, so that during the further method steps and in particular during tempering (temperature treatment) of the bonded substrates one can prevent that the island regions 5, 6 formed from the mold substrate 2 can laterally move or be slightly shifted in relation to the cover substrate 4 and/or the carrier substrate 9. Thus, the resulting window components can be manufactured with extremely high precision and, thus, very small manufacturing tolerances.

Different embodiments of the production method of a cap substrate 1 were described above by means of FIGS. 3a-f.

The embodiments described above were aimed, by way of example, at producing the cover substrate 1 having a multitude of individual cap substrate elements 60 and subsequently providing the cap substrate having the multitude of individual cap substrate elements 60 (at the wafer level), for example as a glass cap wafer for further processing. However, it should further become clear in this respect that the individual cap elements 60, too, are provided for "individual" further processing. In this context, the individual cap elements 60 may in turn be employed on device substrates (e.g. at the wafer level) or for assembly with individual packages on individual chips or ceramic substrates.

With regard to the cap substrates 1 shown by means of FIGS. 3a-f it shall further be noted that an individual cap element 60 may also comprise several window elements 8, e.g. opposing window elements 8, as a microcuvette. Production of double-sided window surfaces for an individual cap element 60 may readily be obtained by specifically implementing and processing the mold substrate 2 and/or the resulting island regions 5 and 6 and the intermediate recess 7. In order to obtain a double-sided window surface one may only provide two opposing recesses 7 rather than the one recess 7 provided in FIGS. 3a-f presented above.

Figure 4:
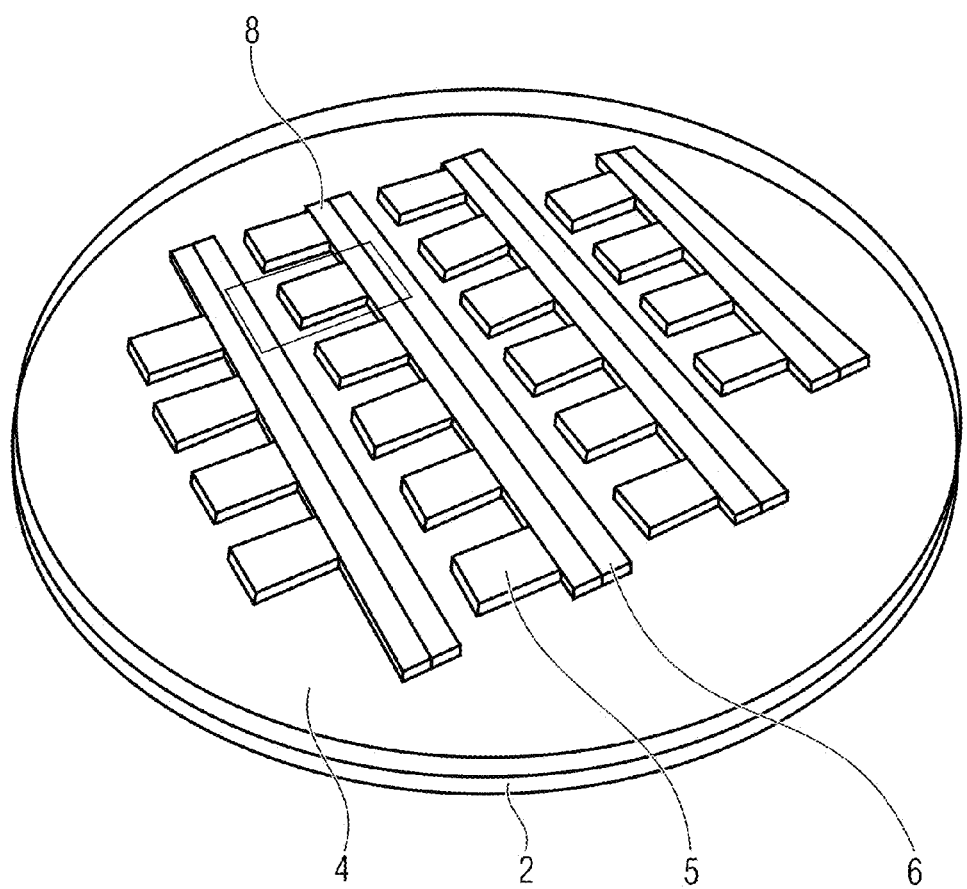
FIG. 4 shows an exemplarily glass cap wafer bonded to a mold substrate, the glass cap wafer comprising sunk window components.

FIG. 4 shows a glass cap wafer 1 bonded to a mold substrate 2, said glass cap wafer 1 comprising sunk window components 8. FIG. 4 is a schematic view of a glass cap wafer made of Borofloat® glass with sunk glass windows (in accordance with FIG. 3a-e, S#-11). An individual package is drawn with a border. The first and second island regions 5, 6 consist of a semiconductor material, in this case silicon, and are removed by wet-chemical etching, for example, in the course of the production process. Window components 8 are arranged between the first island regions 5 and the associated adjacent second island regions 6, respectively.

Figure 5A:
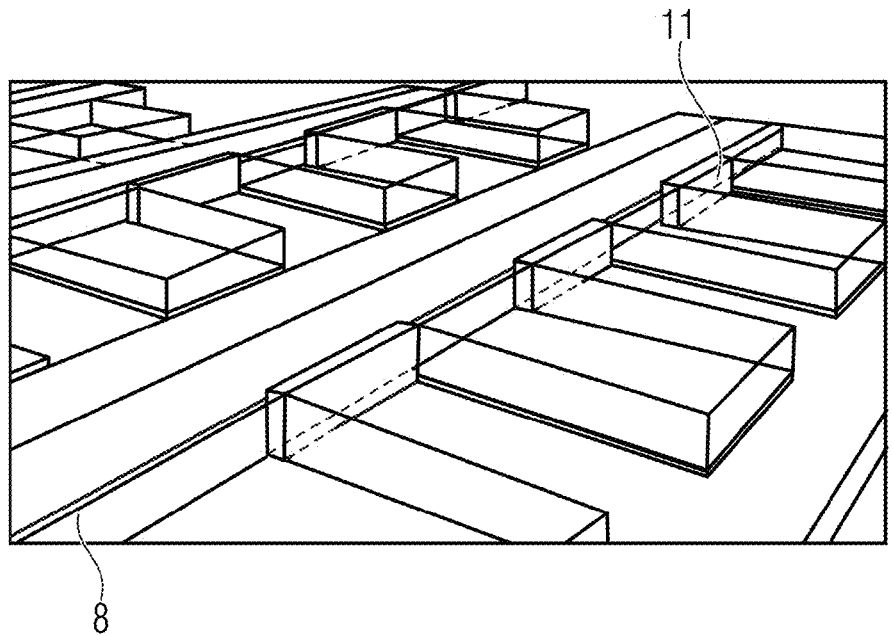
FIGS. 5a-b show detailed views of an exemplary glass cap wafer.
Figure 5B:
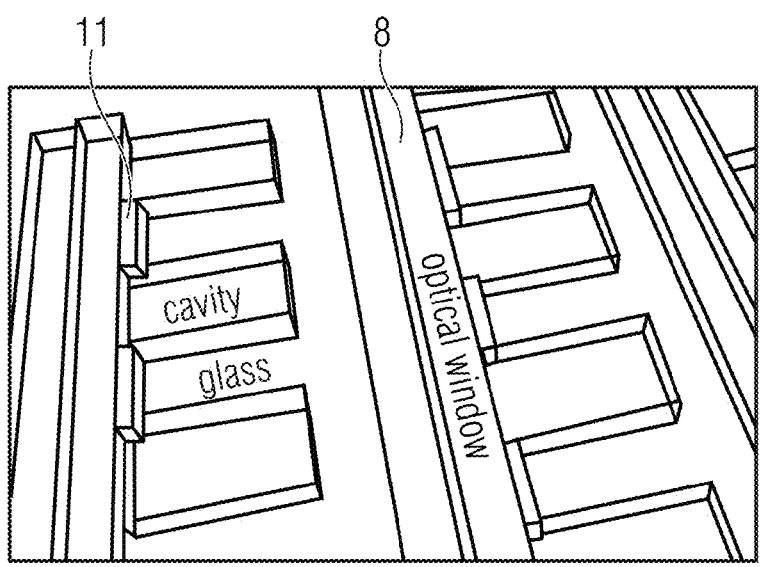

FIGS. 5a and 5b show detailed views of a glass cap wafer 1. If glass silicon elements are to be employed for the window surfaces, the silicon of the inside of the cavities, i.e. those free spaces in which the radiation-emitting devices are to be arranged at a later point in time, is to be structured such that the silicon remains merely within the area of the cavity (e.g. within the area of the actual window). Otherwise, a silicon strip 11 will also cut through the side walls of the individual packages, as shown in FIGS. 5a and 5b.

Figure 6:
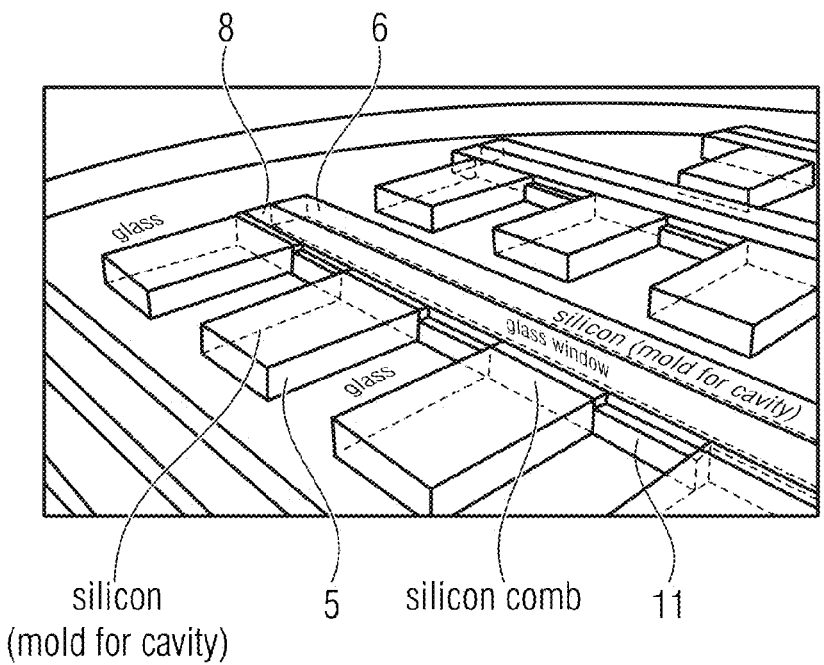
FIG. 6 shows an exemplary glass cap wafer with silicon combs.

FIG. 6 shows a glass cap wafer 1 comprising silicon combs 11. What is shown is the situation present before the silicon is etched off. The silicon substrate, i.e. the mold substrate 2, has been omitted in this representation. What is represented are the first island regions 5 and the second island regions 6, i.e. the silicon island structures, and the silicon which defines the window surfaces. While in the area of the optical apertures to be, i.e. the optical output windows, the silicon extends up to the surface, in the area of the package walls, the silicon structures 11 are arranged somewhat lower down and do not enter into direct contact at any position with the silicon wafer, i.e. the mold substrate 2, and/or are covered by glass on the surface (once the Si wafer has been removed).

Figure 7:
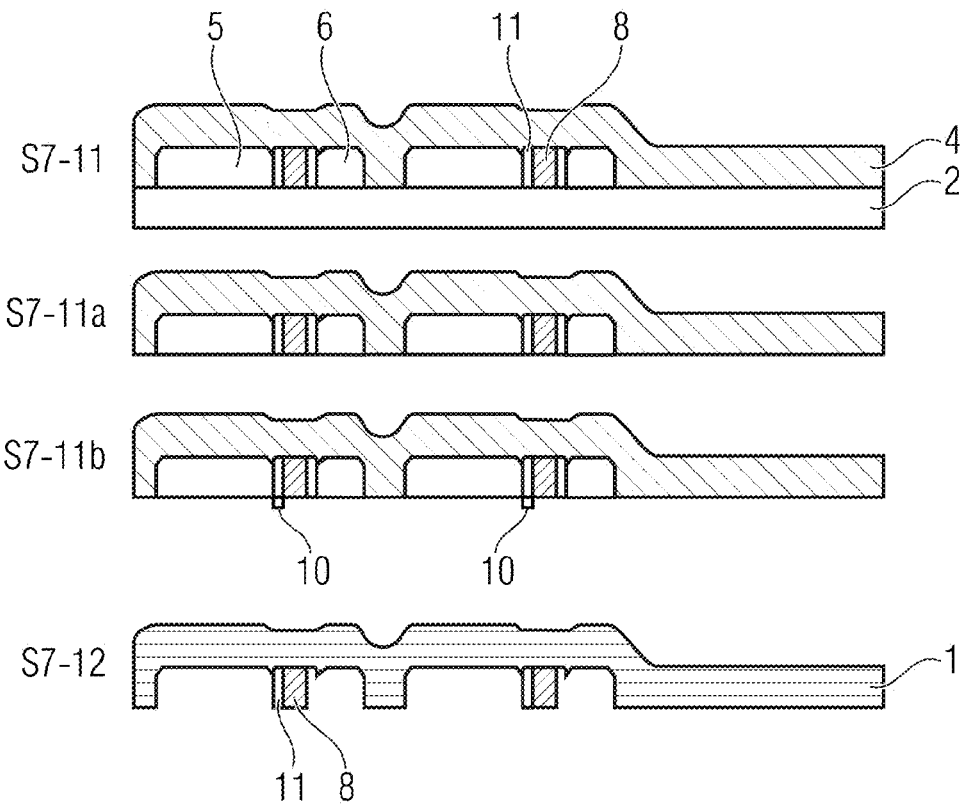
FIG. 7 illustrates a process variant wherein silicon structures remain within a package wall of the cap substrate.

FIG. 7 illustrates a process variant wherein silicon structures 11 remain within a package wall of the cap substrate 1. Therefore, local passivation of silicon structures 11, which remain within the package wall, takes place. In a substep S7-11, tempering under atmospheric pressure takes place, the glass mass, i.e. the glass material of the cover substrate 4, being pressed into the large gaps, i.e. the recesses 7. Grinding takes place in a substep S7-11a. A substep S77-11b comprises applying the passivation 10 and structuring the passivation 10. In a substep S7-12, selective etching off of the silicon structures toward the glass structures and of the passivation on the Si areal by means of KOH takes place.

Figure 8A:
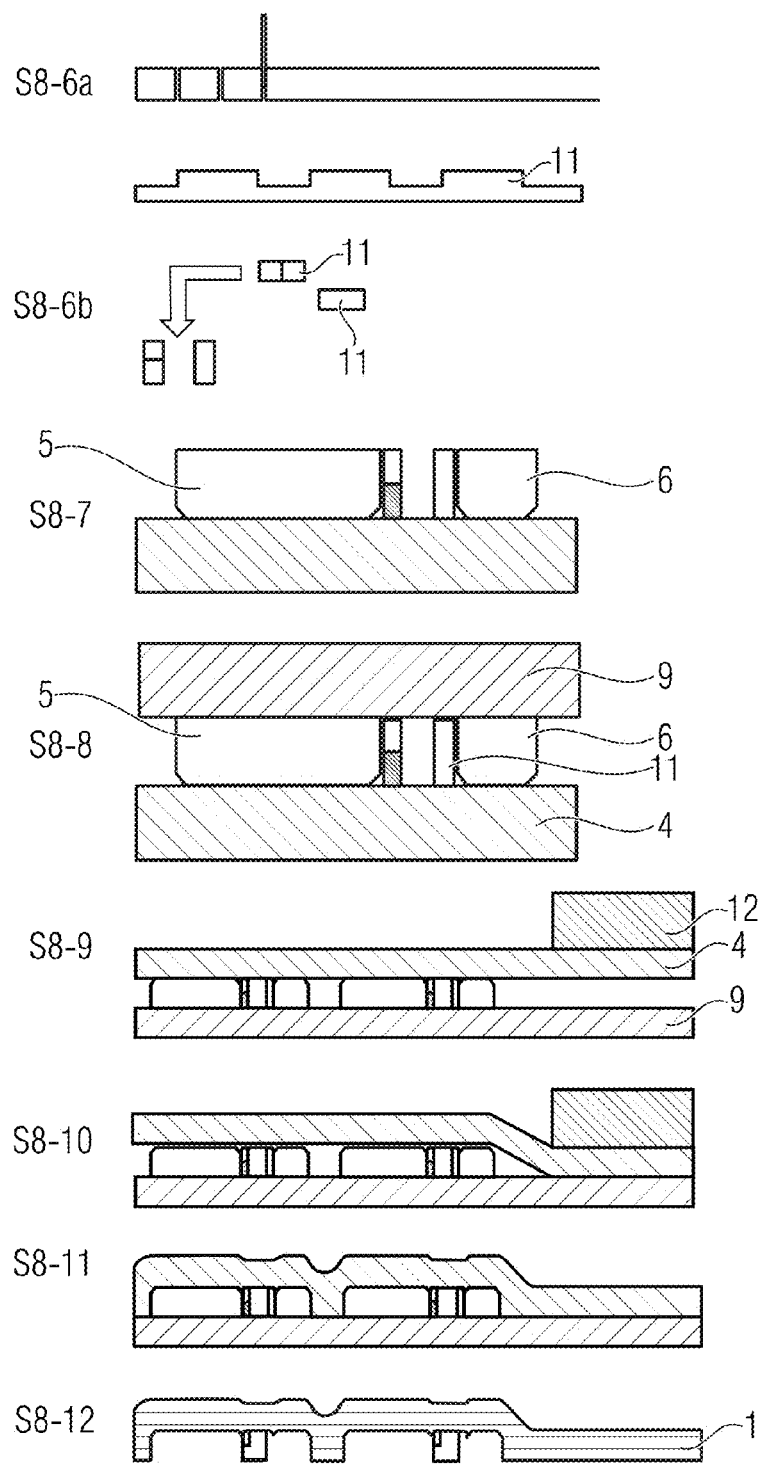
FIGS. 8a-c show a process variant in accordance with a third method wherein two parallel silicon strips are used for defining window surfaces.

FIG. 8a shows a process variant in accordance with the third method wherein two parallel silicon strips 11 are used for defining window surfaces. When silicon strips that are bonded onto a Borofloat® glass strip can be used for defining the optical window surfaces it is also possible to simply place two parallel silicon strips such that a gap between them results within which the glass mass flowing in will later on form the window during the process itself. In this case, the entire mold except for the glass wafer will consist entirely of silicon. It is obvious that this causes quite similar problems as were previously in the utilization of silicon glass silicon elements. In this case, the approach wherein the silicon is formed in the shape of a comb structure which directly adjoins the cavities is particularly advantageous. A substep S8-6a comprises cutting to length (sawing) of strips of silicon, the "exterior" is a simple Si strip, whereas the "inner" strip is manufactured from a wafer with openings, so that a comb-shaped sequence of silicon surfaces results. In accordance with S8-6b, rotating and assembling (loading) will then take place; in embodiments, additional adjustment structures facilitate said precise loading and secure the structures against slipping out of position and falling over during the process. Substep S8-7 comprises inserting the Si strips of S8-6b; the silicon structures, i.e. the first and second island regions 5, 6, are used like a plugboard, so that the window surfaces will perfectly fit into the structures at a later point in time. The lateral islands 5, 6 thus serve as "stops". A substep S8-8 comprises placing a further silicon wafer 9. A substep S8-9 comprises turning around the wafer stack, placing a load ring 12 which is coated so as to avoid gluing to glass, and evacuating. Substep S8-10 comprises vacuum tempering, the wafer is hermetically sealed, and the pressure support is removed. Substep S8-11 comprises tempering under atmospheric pressure, the glass mass, i.e. the glass material of the cover substrate 4, being pressed into the large gaps, i.e. the recesses 7. The glass mass flows around the Si comb structure 11. In process management care is to be taken to ensure that on the one hand, the glass mass completely flows around the Si structures, but on the other hand enters into the gaps between the abutting Si strips and the island structures, i.e. the first and second island regions, in the upper region only. Therefore, the gap dimensions should be selected to be clearly smaller than 50 μm, for example from 5 μm to 50 μm. Substep S8-12 then comprises selectively etching off the silicon structures toward the glass structures, typically by means of KOH. The silicon present within the package walls is protected by the lower glass surface.

According to FIG. 8a, a third method of producing a cap substrate 1 comprising the following steps is thus provided: providing a mold substrate 2 comprising a structured surface region 3, arranging a cover substrate 4 on the structured surface region 3 of the mold substrate 2, the cover substrate 4 comprising a glass material, and connecting the cover substrate 4 to the mold substrate 2, the structured surface 3 of the mold substrate 2 being brought into contact with a surface of the cover substrate 4 in such a way that they at least partially overlap, forming first island regions 5 and respectively associated adjacent second island regions 6 from the mold substrate 2, a recess 7 being provided between the first island regions 5 and the respectively associated adjacent second island regions 6; arranging semiconductor strips 11 in the recess 7, respectively, located between a first island region 5 and the associated adjacent second island region 6, so that the semiconductor strips 11 with one of their surfaces at least partially overlap respective lateral surfaces of the island regions 5, 6 perpendicularly to the cover substrate 4, and so that semiconductor strips 11 are located opposite one another with regard to the recess 7 and that a distance, which corresponds to a remaining recess 7, is formed between the semiconductor strips 11, arranging a carrier substrate 9 on the first island regions 5 and on the second island regions 6, which are formed from the mold substrate 2, so that the first island regions 5 and the second island regions 6 are located between the carrier substrate 9 and the cover substrate 4, tempering the bonded substrates such that the glass material of the cover substrate 4 is caused to flow into the remaining recesses 7 located between the island regions, and removing the cover substrate 4 from the mold substrate 2 and from the carrier substrate 9 so as to obtain the structured cap substrate 1.

Figure 8B:
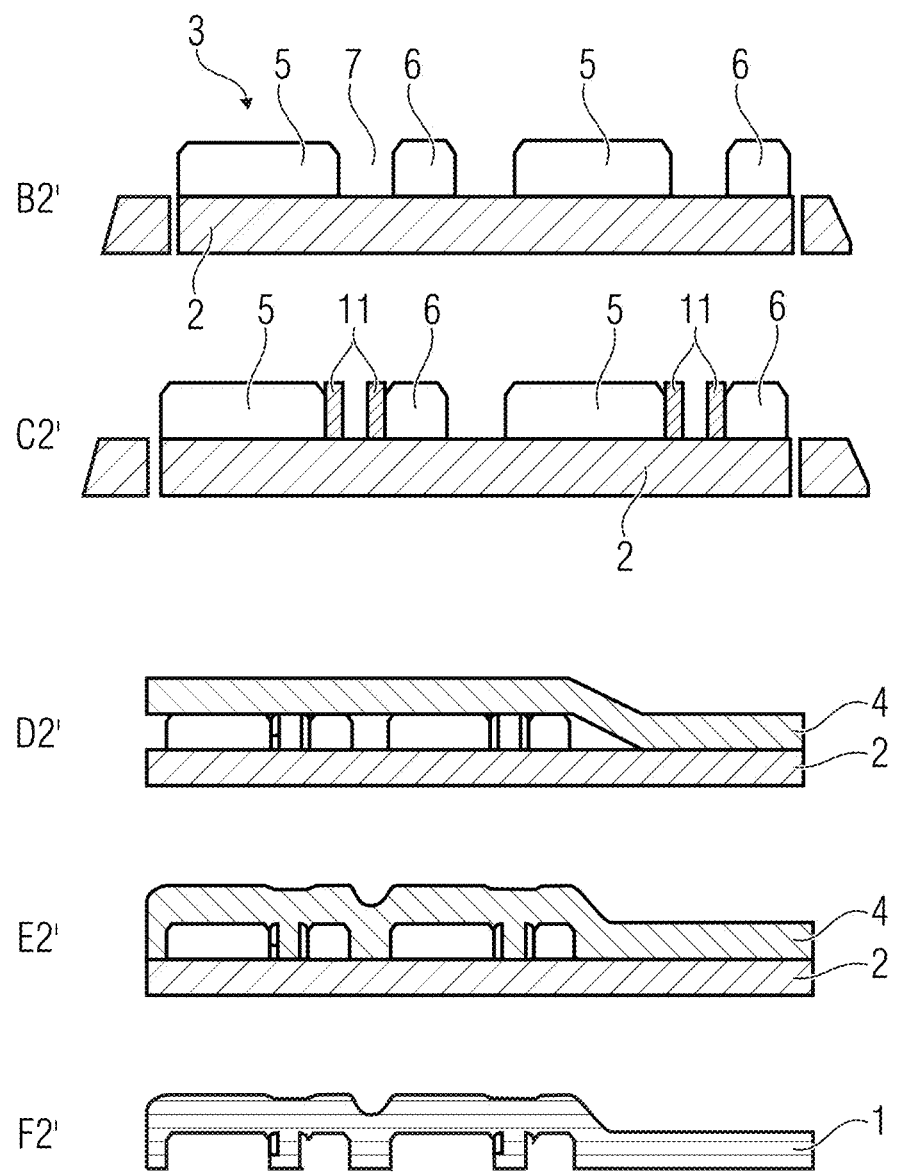

FIG. 8*b* now shows a process variant in accordance with the second method of producing a cap substrate while using a reusable tool, wherein two parallel silicon strips 11 are used for defining window surfaces (instead of arranging a window component 8 on the reusable tool). The process variant depicted above by means of FIG. 8*a* thus is applicable accordingly to the second method, depicted by means of FIGS. 2*a-b*, of producing a cap substrate while using a reusable tool. The above explanations given by means of FIGS. 2*a-b* and FIG. 8*a* are also applicable accordingly to the process sequence depicted below by means of FIG. 8*b*; one merely has to take into account that in the process of FIG. 8*b*, two parallel silicon strips 11 are used for defining window surfaces instead of arranging a window component 8 on the reusable tool (cf. FIGS. 2*a-b*).

The method of producing the cap substrate 1 while using a reusable tool includes the following steps.

Initially, a reusable tool is provided as the mold substrate 2 (step B2'), first island regions 5 and respectively associated adjacent second island regions 6 being formed on a surface 3 of the reusable tool. The mold substrate 2 is effective as a negative structure for a cap structure, a recess being provided within the reusable wafer between the first island regions 5 and the respectively associated adjacent second island regions 6. Subsequently, semiconductor strips 11 are arranged in the recess 7, respectively, located between a first island region and the associated adjacent second island region 6 (step C2'), so that the semiconductor strips 11 with one of their surfaces at least partly overlap respective lateral surfaces of the island regions 5, 6 perpendicularly to the cover substrate 4, and so that semiconductor strips 11 are located opposite one another with regard to the recess 7 and so that a distance, which corresponds to a remaining recess 7, is formed between the semiconductor strips 11.

In addition, a cover substrate 4 is arranged on the island regions 5, 6 of the reusable tool 2 (step D2'), the cover substrate 4 comprising a glass material. In this context, the surface 3 of the reusable tool is brought into contact with a surface of the cover substrate in such a way that they at least partially overlap.

The bonded substrates are tempered (step E2') such that the glass material of the cover substrate 4 is caused to flow into the recesses 7 located between the island regions 5, 6. The cover substrate 4 is separated, or removed, from the mold substrate 2 so as to obtain the structured cap substrate 1.

Figure 8C:
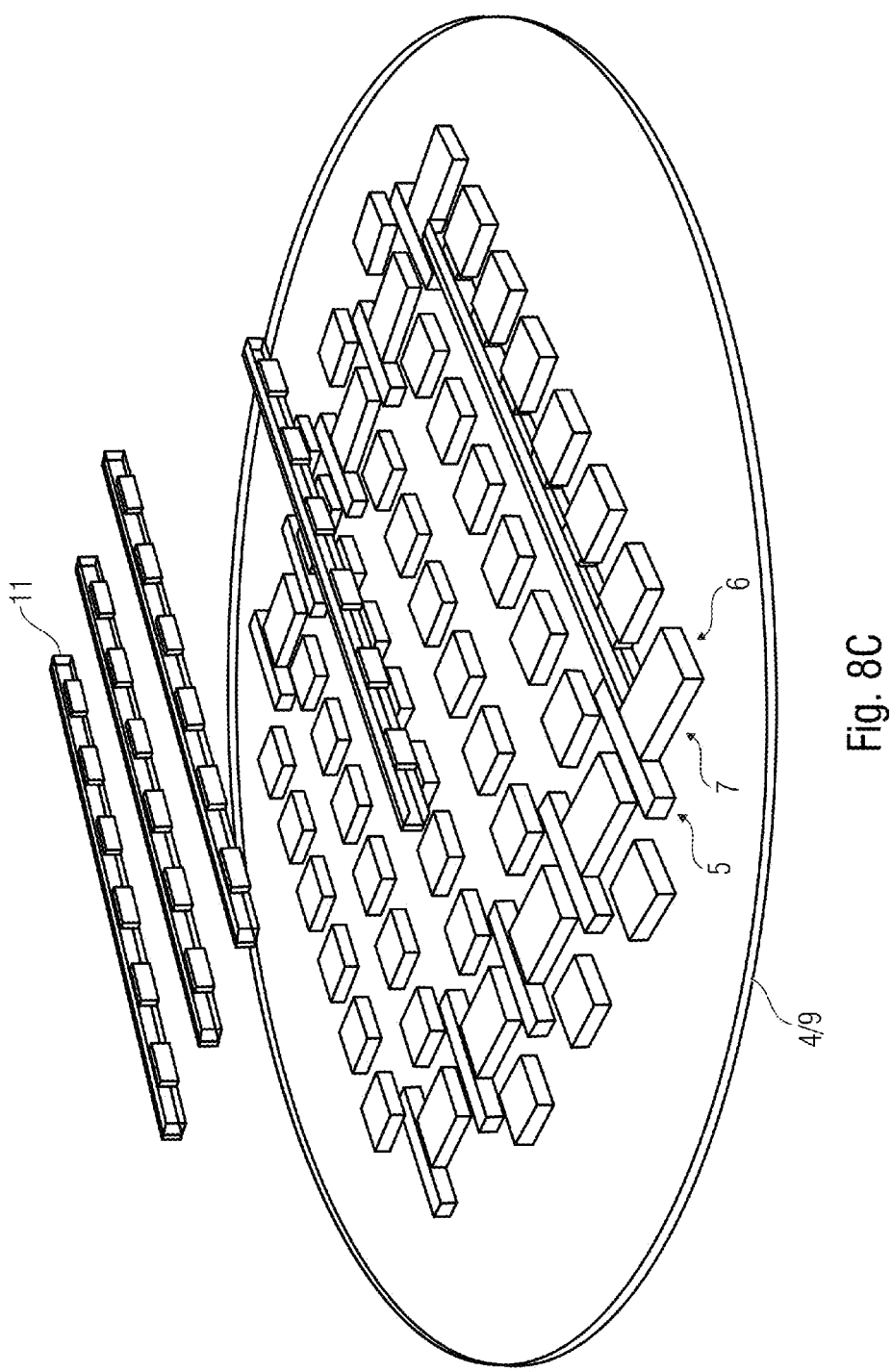

FIG. 8*c* shows insertion of the strips 11, i.e. arranging of semiconductor strips 11 in the recess 7, respectively, located between a first island region 5 and the associated adjacent second island region 6 on the cover substrate 4 and/or carrier substrate 9.

Figure 9:
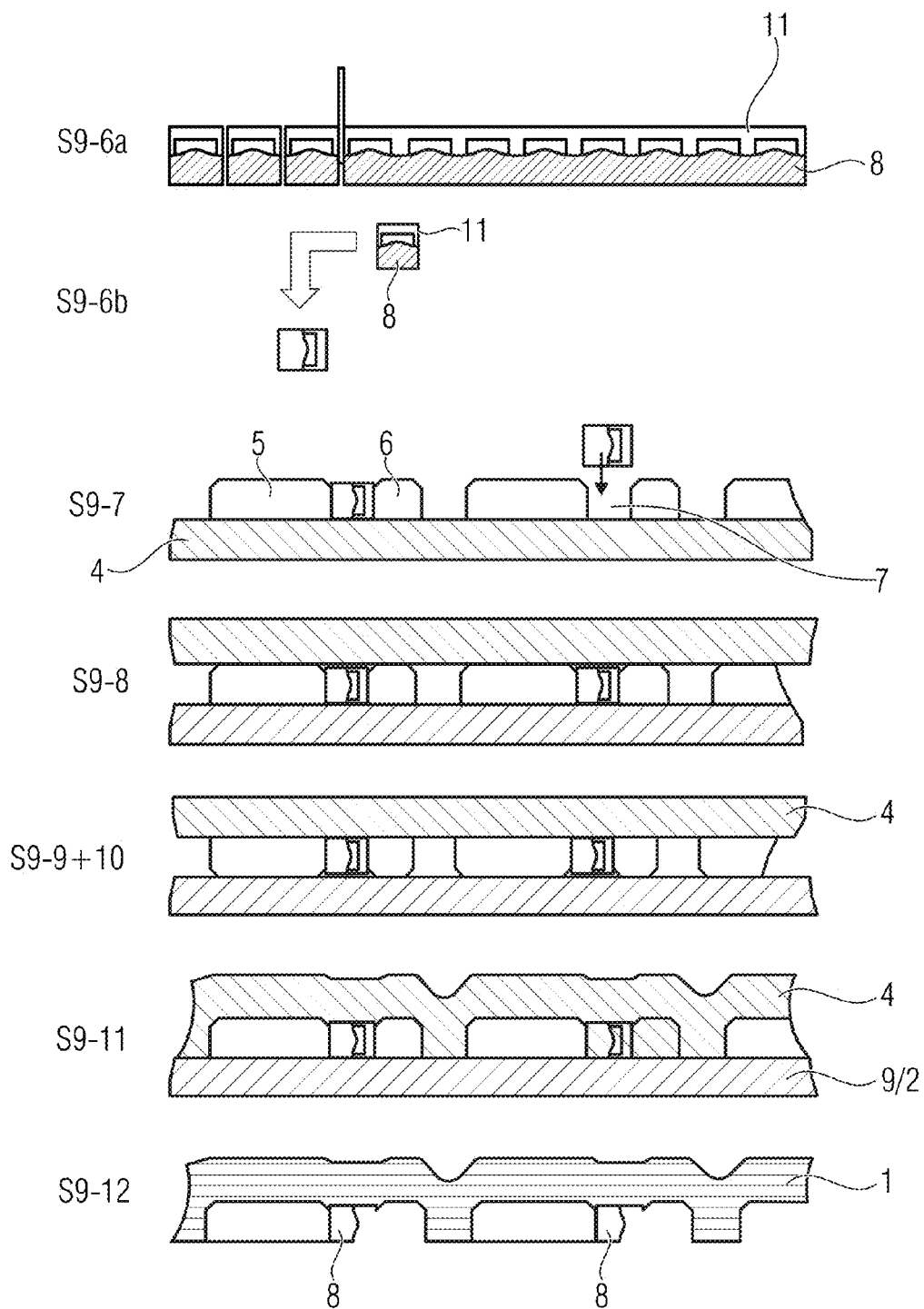
FIG. 9 shows a process variant wherein optical lenses made of glass are installed instead of a planar window component.

FIG. 9 shows a process variant wherein optical lenses made of glass are installed instead of a planar window component 8. This process variant is possible both for the first and for the second methods. In embodiments, arranging the window component will then include the following step: cutting to length of strip-shaped window components from a lens array in each case. In principle, it is also possible to embed a lens element, rather than a simple planar window, into the glass of the package. Said lens function may consist, e.g., either of a number of lenses (i.e. linear lens array) or one single cylinder lens when the latter is oriented in parallel with the alignment of the glass strip. Unlike the planar glass elements employed for producing the planar glass windows, however, it is useful to additionally protect the non-planar sides of the lenses by an additional protective element 13 made of a semiconductor material, e.g. silicon, against direct contact with the glass mass, i.e. the glass material of the cover substrate 4. Said protective structure 13 bridges the lens surface, on the one hand, and ensures optimum fitting with the silicon structures placed on the glass wafer, on the other hand, so as to avoid uncontrolled flowing of the glass into this gap here as well. The simplest way of forming such lens array silicon elements by means of the glass flowing technique already mentioned is to use a higher-melting glass, e.g. "AF 32"® or "Eagle XG"®). with a thermal expansion coefficient adapted to silicon and/or Borofloat® glass. In principle, using this technique is also possible when using biconvex or biconcave lenses. In this case, both sides of the lenses are protected against direct contact with the glass by corresponding silicon structures 13. Substep S9-6*a* comprises cutting to length, here sawing, of strips from a lens array bonded onto silicon structures spanning the inner lens surfaces. Substep S9-6*b* shows that rotating to the side by 90° along the longitudinal axis of the strip and assembling (loading) takes place; additional adjustment structures may facilitate said precise loading and may secure the structures against slipping out of position and falling over during the process.

In accordance with substep S9-7, the lens strips of S9-6*b* are inserted, the silicon structures being used like a plugboard, so that the window surfaces will perfectly fit into the structures. The lateral islands thus serve as "stops". In accordance with substep S9-7, a further semiconductor wafer, i.e. a carrier wafer, which in this case is a silicon wafer, is placed. The further semiconductor wafer is placed onto the first island regions and the second island regions, so that it will cover the recesses 7 wherein the lens strips, i.e. the window components, are arranged. Substeps S9-9 and S9-10 comprise turning around the wafer stack, placing a load ring 12, vacuum tempering, wherein the wafer is hermetically sealed, and removing the pressure support 12. In accordance with substep S9-11, tempering is then also performed under atmospheric pressure, as a result of which the glass mass flows into the large gaps. Eventually, substep S9-12 comprises selectively etching off the silicon structures toward the glass structures, typically by means of KOH, as is also the case in this specific embodiment.

Figure 11:
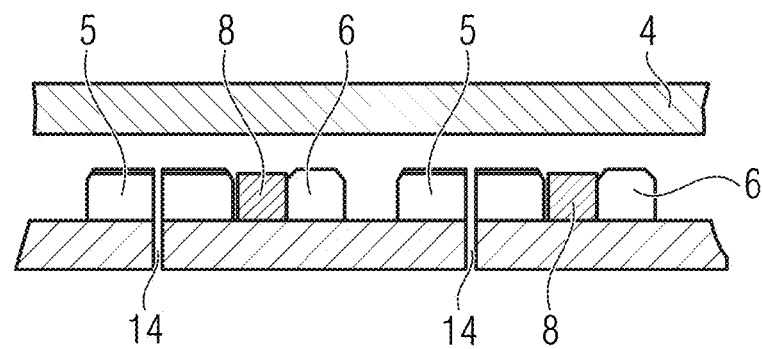
FIG. 11 shows, inter alia, an exemplary reusable mold substrate, which comprises vacuum channels, for the second method.

In the following, the second method of FIGS. 2*a* and 2*b* will be addressed in more detail. The first method described in detail above eventually employs semiconductor structures, e.g. silicon structures, as lost molds for shaping the glass. As is the case in the second method, however, it is basically also possible to produce molds that can be used many times for processing the cap wafer. For this purpose, of course only such materials or coatings may be considered which, as was already mentioned, do not enter into an intimate bonding with the glass and can be easily separated from the glass. To this end, a basic mold 2, which is made of graphite, for example, may thus be provided with first and second island regions and, quite by analogy with the first method of FIG. 1, glass strips 8 rotated by 90° may be inserted into the structures. Subsequently, a glass wafer, i.e. a cover substrate 4, is placed, the entire assembly is heated up and is eventually drawn into the reusable mold, for example the graphite mold, by means of negative pressure, for example. Accordingly, the method may include the following step during tempering: applying a negative pressure to the bonded substrates so as to draw the glass material into the remaining recesses located between the island regions. To this end, suitable access ports and channels, which ensure complete removal of the air from between the glass wafer and the mold, are provided within the reusable mold 2, for example the graphite mold. For example, the reusable molds 2 shown in FIGS. 10 and 11 are designed accordingly. Subsequently, the glass wafer 1 with the embedded glass strips, i.e. the window components 8, is lifted off from the mold 2 and is separated.

It is apparent that the same process variants as were used in the first method can be derived here as well, i.e. instead of the glass strips made of higher-melting glasses, Si-glass-Si strips or may be only two parallel silicon strips may also be considered again here. Here, too, it is useful to structure those silicon strips or supports that are inserted on the side of the cavity beforehand, quite by analogy with the first method, such that the silicon structures passing through the package wall will not cause any holes, during final etching of the silicon, in the package walls or will cause any deep trenches to form within the area of the bonding frames (i.e., for example, comb structures when using the Si strips, comb structures and strips in case of the Si-glass-Si elements).

In contrast to the above-described process comprising embedded glass strips, the glass wafer is etched again, when using silicon structures, so as to remove the silicon in the area of the window surface (process comprising a partially lost mold). In this context, however, the process time during etching should be adapted such that the silicon will not be removed in the area of the package walls.

As an alternative to a mold 2 which fully consists of graphite, other materials may basically also be considered for producing such a mold for the second method, among others temperature-resistant steels and ceramics (e.g. SiC, glassy carbon), in particular when said molds are additionally provided with a coating which prevents adhesion of the glass mass (e.g. graphite or, even better, boron nitride (BN)). As was already mentioned, such a mold may also be manufactured of silicon, in principle, by applying such a glass-repellent protective layer.

FIG. 10 illustrates substeps of the second method of producing a cap substrate by means of sketches. Substep S10-1 comprises providing the mold, an example used here being a mold made of graphite. Substep S10-1a comprises cutting to length (sawing) strips of the actual window material 8 (higher-melting glass, ideally a material having thermal expansion coefficients identical to those of "AF 32"® (Schott) or "Eagle XG"® (Corning®). Substep S10-1b comprises rotating to the side and assembling (loading). S10-b II may comprise employing Borofloat® glass (low-melting glass) instead of a higher-melting glass material, said Borofloat® glass being kept in its mold by means of two silicon supports. Substep S10-2 comprises inserting the glass strips of S10-1, the structures being used like a plugboard, so that the window surfaces will perfectly fit into the structures (lateral islands as stops). Substep S10-3 comprises placing a glass wafer, i.e. a cover substrate. In this embodiment, it consists of Borofloat® glass. Substep S10-4 comprises heating, i.e. tempering, until the glass softens, building up a negative pressure, drawing the glass into the structures, and thus embedding the glass strips into the glass matrix of the Borofloat® glass of the cover substrate 4. Substep S10-5 then comprises disassembling (unloading) the mold, i.e. removing the cap wafer 1 with integrated window surfaces 8, i.e. optical output windows. A substep S10-6, which is not shown, may possibly comprise a finishing process if silicon structures were used, in particular on surfaces of the window components, i.e. etching off of the silicon in the areas of the window surfaces.

Accordingly, the second method may comprise the following features, for example:
1. Using a mold for deep-drawing of glass, said mold supporting island-like structures, which serve as a plugboard, and including vacuum access ports and vacuum channels.
2. The mold consists of a high-temperature resistant material that either does not enter into contact with the hot glass itself (e.g. graphite, glassy carbon, SiC, BN, ceramics) or has been coated with such a material.
3. Insertion of glass or glass silicon structures, arranged in a strip shape (see S10-1b II), into said structures.
4. Rotating said glass or glass silicon structures by, e.g., 90° during insertion so as to vertically align the "good" optical surfaces.
5. Utilization of said structures as protective structures so as to avoid direct contact, on the optical surfaces, with the glass mass of the glass wafer, i.e. with the glass material of the cover layer, which involves correspondingly small dimensions of gaps (approx. 50 µm or smaller, for example 20 µm to 50 µm; strictly speaking, the aspect ratios are decisive since the glass mass takes very long to be able to fill very small gaps; as experience has shown, channels having widths of only few 10 µm cannot be filled up. Therefore, distances of 10 µm should be able to be achieved by the glass to a very limited extent only.).
6. Drawing in the glass mass by applying a negative pressure on the side of the mold
7. or, alternatively, applying a pneumatic or mechanical pressure on the side of the placed glass plate, or of the glass wafer, i.e. of the cover substrate.

Among other things, FIG. 11 shows a reusable mold substrate 2, which comprises vacuum channels 14, for the second method. Ideally, the vacuum ports and channels should be arranged such that the glass which flows into said structures, if superficially, does not impair the functions of the packages. In particular, one should avoid that elevations are formed within the area of a bonding frame 15. This is why it is useful to integrate the vacuum feeds 14 into the island structures 5, 6 and, in order to facilitate improved removal of the remaining occlusions of gas by suction, to additionally introduce narrow channels into the surfaces of said island structures. This means that vacuum feeds 14 and channels should be arranged in uncritical areas. In particular, the formation of undesired elevations, for example caused by the glass mass penetrating into vacuum openings, should absolutely be avoided. Vacuum feeds 14 and channels should therefore be integrated into the islands, as illustrated in FIG. 11, since their surfaces will no longer have any critical function in the package later on.

Eventually, the cap substrate 1 is designed to be still suitable for further use, which includes exposing the optical access and/or the optical output window. Following the actual production of the cap wafer in accordance with the first method or the second method or their variations, a dereflection layer, also referred to as an ARC (antireflection coating) layer, may also be applied. Since the relevant optical surfaces are arranged vertically, CVD (chemical vapor deposition) processes may be used for this purpose, for example, since PVD (physical vapor deposition, evaporation coating or sputtering) processes typically can coat vertical surfaces only to a very incomplete extent. CVD processes, in contrast, allow conformal deposition of the layer sequences that may be used for this purpose. Optical surfaces coated in this manner are shown by way of example in FIGS. 15, 16 and 19.

Eventually, the cap wafer 1 is provided with the bonding frame 15 in the area of the package supports where it is to be bonded to a device substrate 16. Said frame 15 typically consists of a solderable material, i.e. for example either of a low-melting glass solder or a metallic solder, however, at least of a solderable metalization. Hermetic encapsulation should advantageously be performed with a metallic bonding system at temperatures below 300° C. so as not to change the positioning of already existing components below the cap.

Radiation-emitting devices, for example laser diodes including submounts (substructures serving as spacers and heat sinks), are soldered onto the prepared soldering surfaces on a semiconductor substrate serving as a device substrate 16 which comprises corresponding soldering surfaces, conductor tracks, connection pads and bonding frames, e.g. a silicon substrate. The device substrate 16 advantageously is to consist of silicon so as to ensure a high level of heat dissipation and a low level of thermal expansion.

In the process, radiation-emitting devices 17, for example green or blue laser diodes, are oriented toward the wafer 16 such that their exit surfaces will be located opposite the optical windows of the cap wafer, i.e. of the cap substrate 1. Subsequently, the contacts are placed both upon the laser diode and upon its submount by means of wire bonding and are connected to the corresponding conductor tracks.

Once the device substrate 16 has been fully assembled (loaded), the wafer can subsequently also be bonded, still at the wafer level, to the cap wafer, i.e. the cap substrate 1. In this manner, hermetic sealing of all of the packages on the wafer is achieved in one single process. To ensure a controlled internal atmosphere within the individual packages, the bonding process takes place, in embodiments, under a defined atmosphere within a specific wafer bonder.

Once all of the packages have been hermetically sealed, one will make the window surfaces accessible again. This is most conveniently achieved by sawing into the recess of the glass wafer outside the package cavities. To this end, in embodiments, two parallel cuts are placed such that the strip-shaped glass element resulting therefrom will simply fall out, which is referred to as "cap dicing". In this process, the bond pads of the next chip may also be exposed. Once said glass elements have been removed, the entire wafer may therefore be subject to electrical tests, which is particularly advantageous since wafer testers which are suitable for this purpose are commercially available (improved logistics due to testability at the wafer level, which clearly simplifies automated electric measurements). At the very end, the wafer is fully diced on the wafer saw.

What was described above thus results in a method of producing a packaged radiation-emitting device 17 at the wafer level, comprising: producing a cap substrate 1, providing a device substrate 16 in the form of a wafer comprising a multitude of radiation-emitting devices 17, arranging the substrates one above the other, so that the substrates are bonded along an intermediate bonding frame 16, and dicing the packaged radiation-emitting devices 17. In addition, the method may include the following steps: producing the cap substrate 1 in accordance with the first method that has just been described or the second method, and dicing the packaged radiation-emitting devices, a dicing pathway having been formed within the cap substrate 1 through the second island regions 6. Moreover, the method of producing a packaged radiation-emitting device at the wafer level may be performed such that the substrates are arranged under a predefined atmosphere. The method of producing a packaged radiation-emitting device at the wafer level will become more apparent when looking at FIG. 12.

Figure 12:
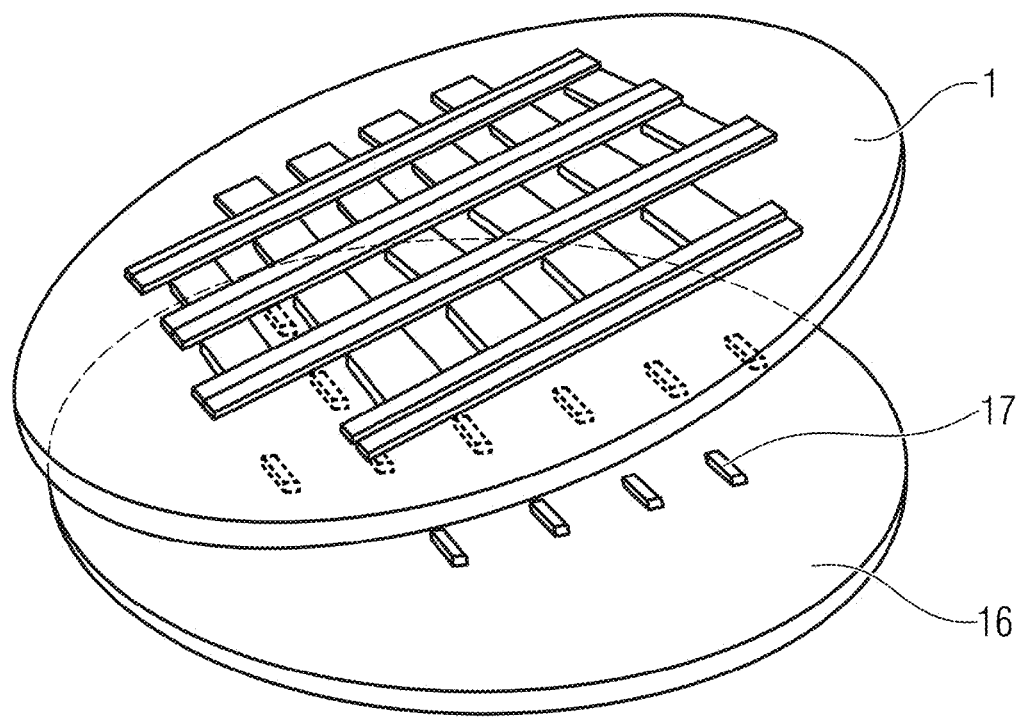
FIG. 12 shows a sketch illustrating a substep of a method of producing a packaged radiation-emitting device at the wafer level.

FIG. 12 shows a sketch illustrating a substep of a method of producing a packaged radiation-emitting device at the wafer level. The completed glass cap 1 is positioned, for encapsulating the assembled laser diodes, such that the laser diodes including their substructures are immersed into the cavities of the cap wafer, i.e. of the cap substrate 1. What is not drawn in in FIG. 12 are the bonding frames 15 around the individual edges of the cavities; it is said bonding frames that guarantee hermetic sealing of the packages. To simplify things, the wirings of the laser diodes and the connection pads are not shown either.

Figure 13:
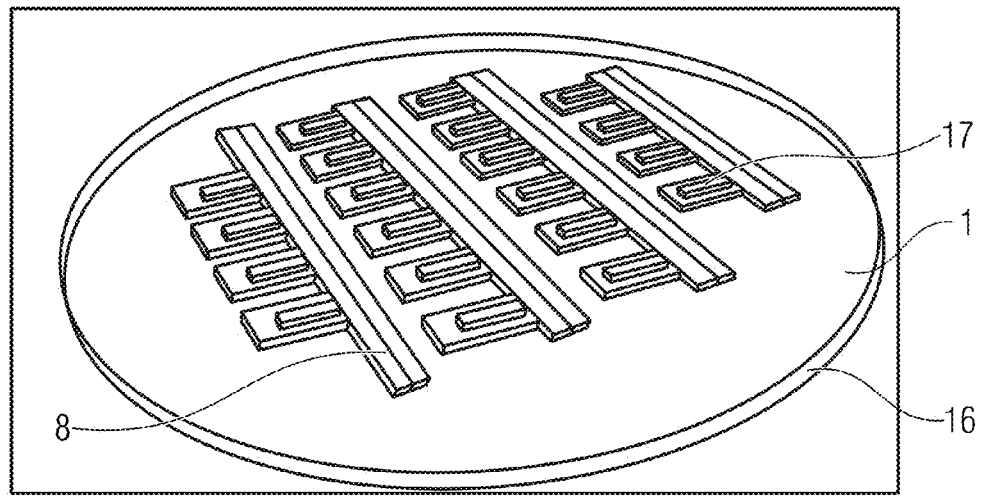
FIG. 13 shows an exemplary wafer comprising a multitude of packaged radiation-emitting devices.
Figure 14:
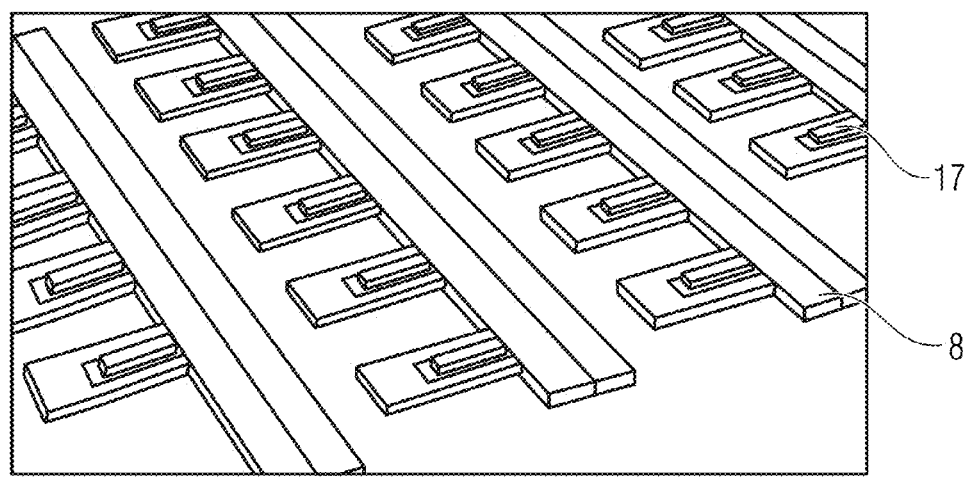
FIG. 14 shows a detail of the wafer of FIG. 13.

FIG. 13 shows a wafer comprising a multitude of packaged radiation-emitting devices. The assembly includes a cap substrate 1 and a device substrate 16. FIG. 14 shows a detail of the wafer of FIG. 13. The optical exit surfaces of the laser diodes 17, which are arranged on the device substrate, are directed to the optical output window 8, as can be seen more clearly here.

Figure 15A:
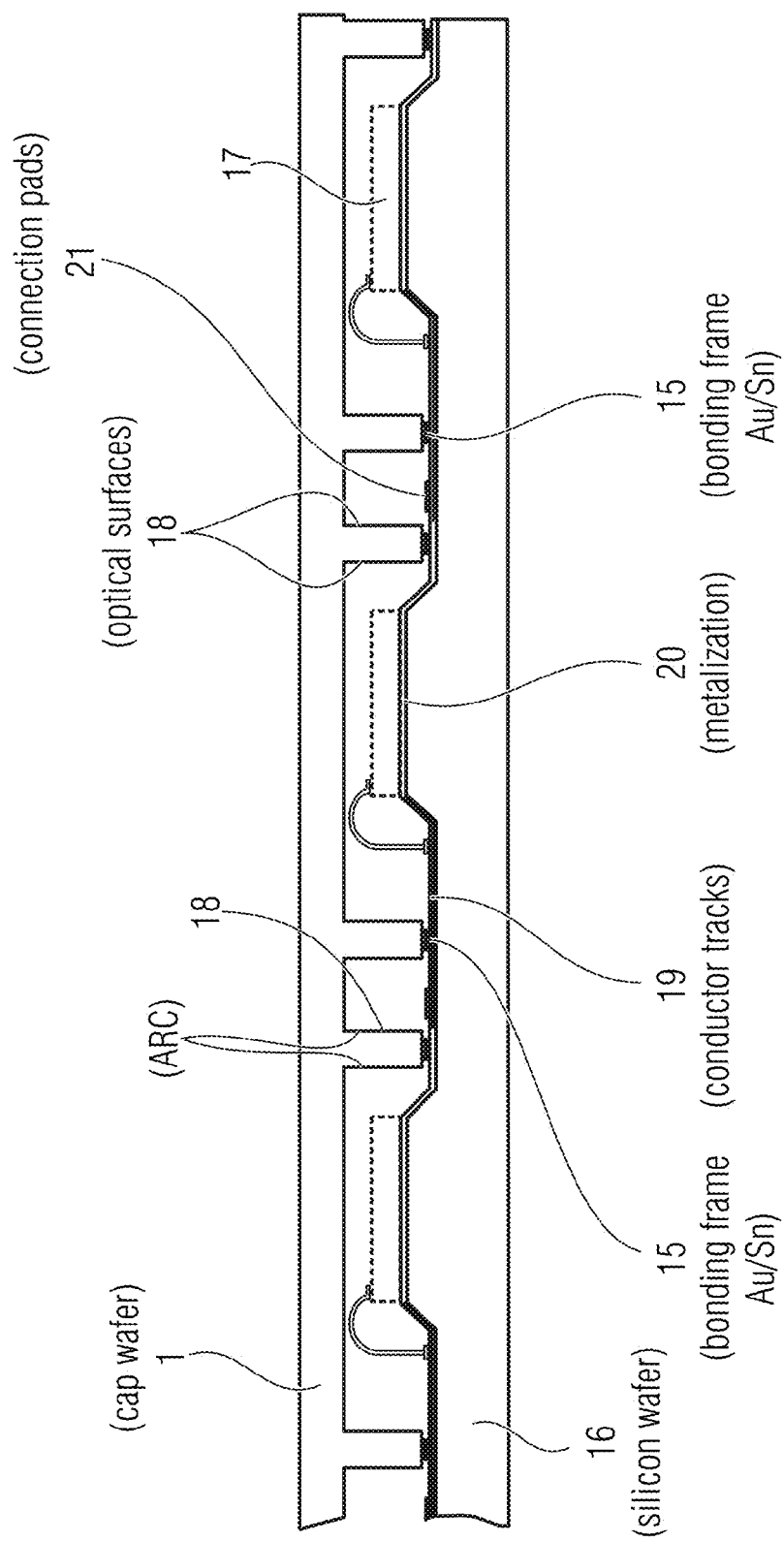
FIGS. 15a-c shows an exemplary dicing method for a wafer of FIG. 13.
Figure 15B:
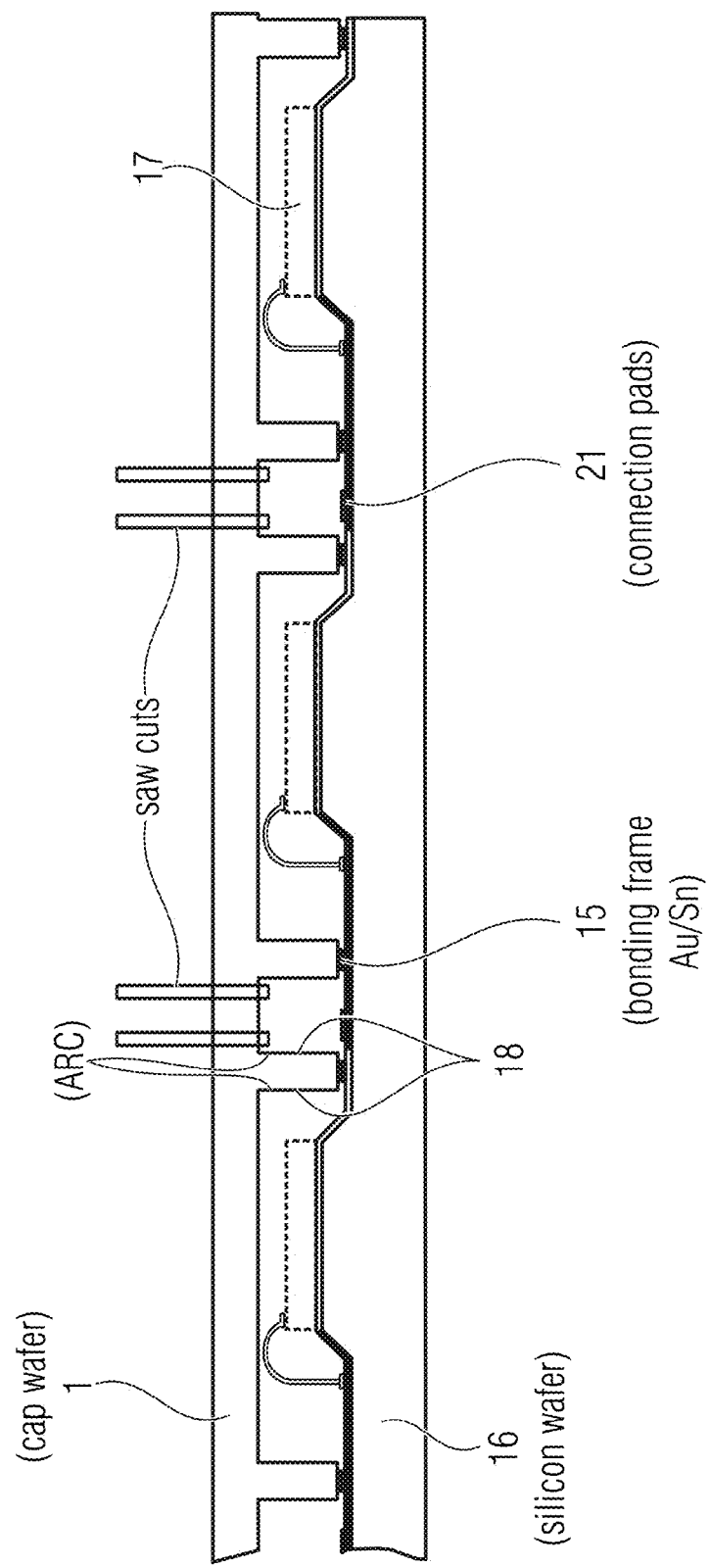
Figure 15C:
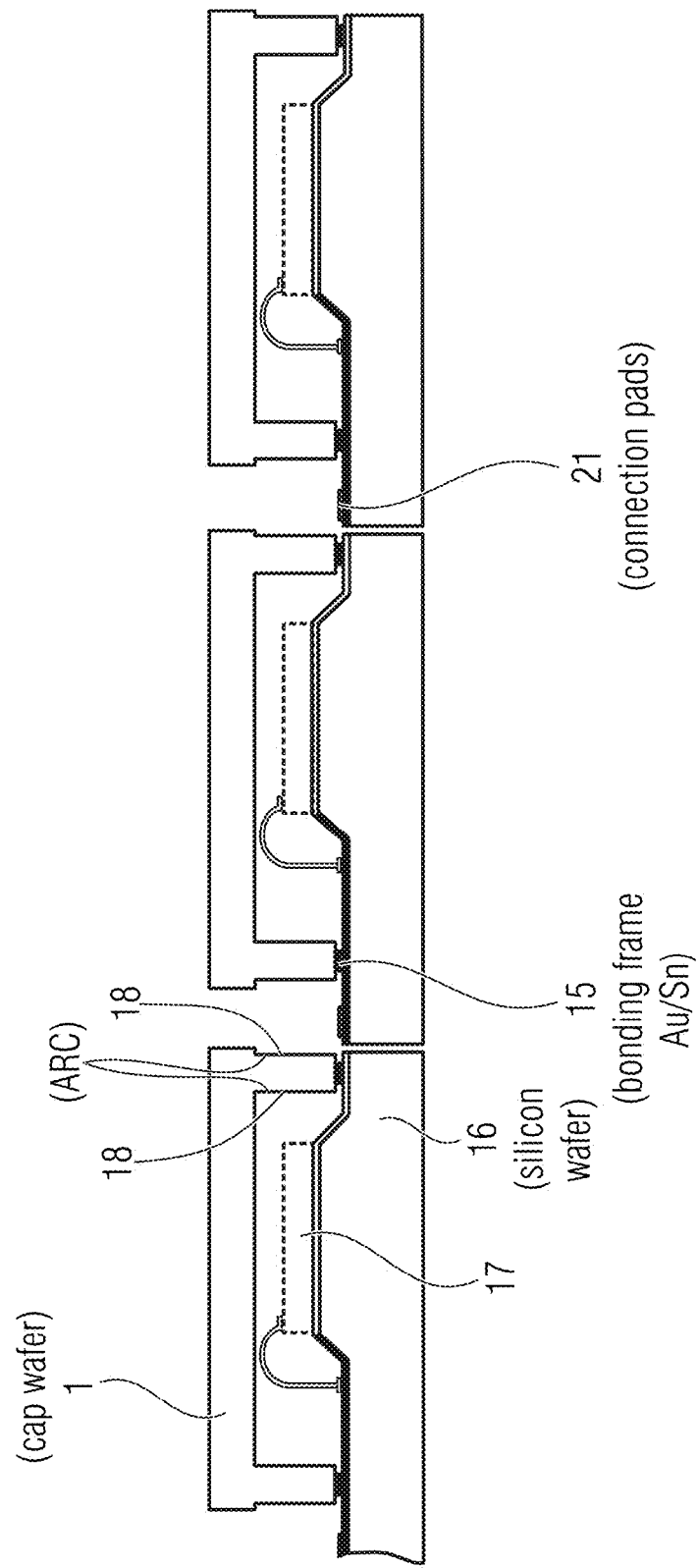

FIGS. 15a to 15c illustrate a dicing method for a wafer of FIG. 13. FIG. 15a shows a cross-section through a wafer the assembly and bonding of which has been completed. What is shown are optical surfaces 18, some of which are antireflection-coated, conductor tracks 19, a metalization 20, a silicon substrate as a device substrate 16, a cap wafer 1, connection pads 21 and bonding frames 15 made of Au/Sn. As shown in FIG. 15b, the regions located above the connection pads may be exposed by sawing into them in parallel. In this context, the regions of the outer window surfaces are also made accessible. The strips that are formed, between the two sawing cuts, by means of the sawing become fully detached during the sawing. At this stage, electrical tests may be performed, still at the wafer level, on a wafer prober, as described above. Subsequently, the device substrate 16 is diced by means of sawing, as can be seen in FIG. 15c. The invention thus provides a wafer array comprising a multitude of packaged radiation-emitting devices 17, as shown in cross-section in FIG. 15a or in a plan view in FIG. 13, and comprising the following features: a device substrate 16 in the form of a wafer that is configured as a shared device substrate 16 for the radiation-emitting devices 17 arranged thereat, and a shared cap substrate 1 comprising the cap substrates 1 for the radiation-emitting devices 17, the substrates 1, 16 being arranged at one another such that the cap substrate 1 and the device substrate 16 are bonded along an intermediate bonding frame 15.

In this manner, one obtains an improved packaged radiation-emitting device produced in accordance with the above-mentioned method. Various embodiments of such packaged devices are shown in FIGS. 16 to 18.

Figure 16A:
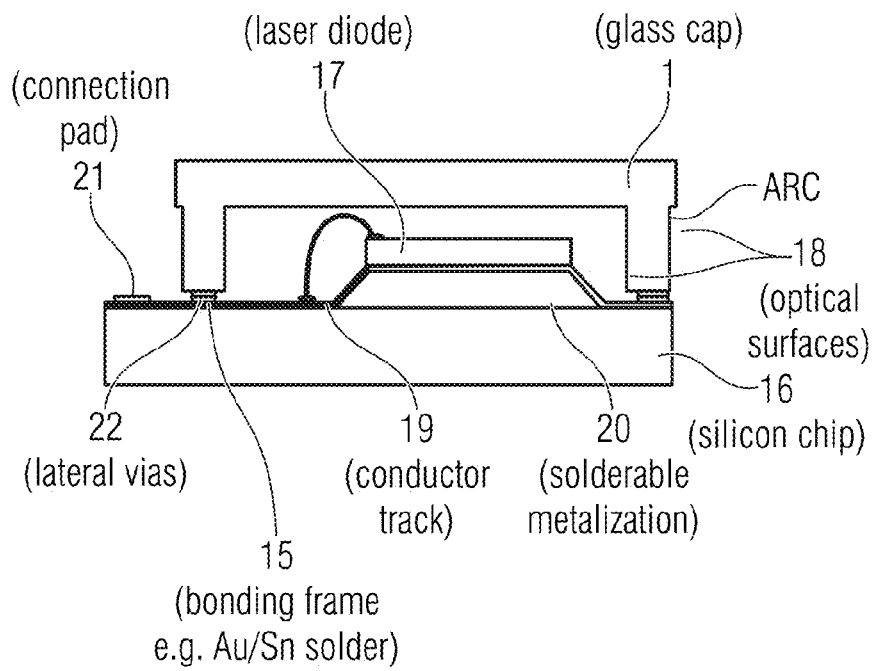
FIGS. 16a-b show exemplary first and second embodiments of packaged radiation-emitting devices having been produced by means of an inventive method.
Figure 16B:
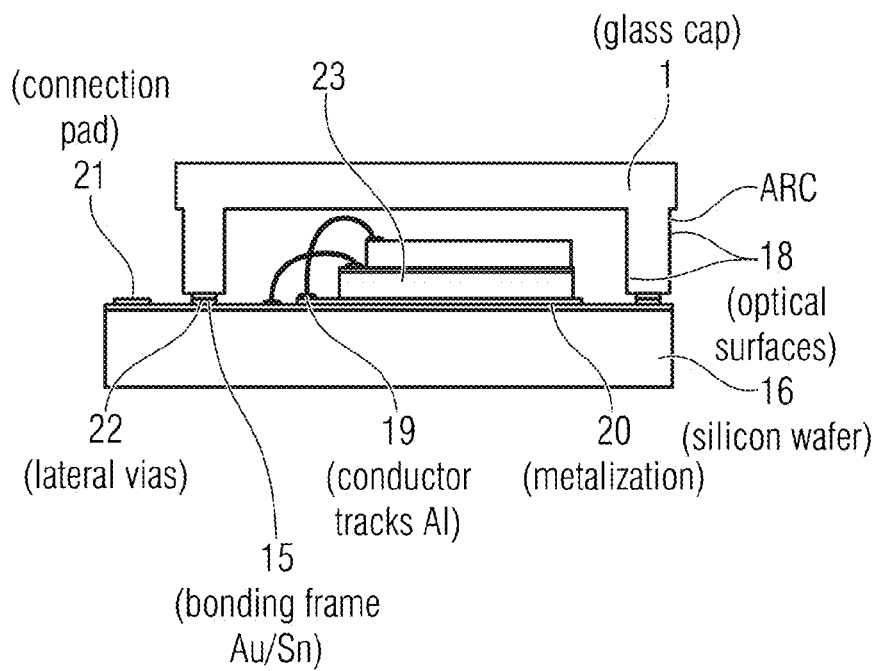

FIGS. 16 a and b show first and second embodiments of packaged radiation-emitting devices that have been produced by means of an inventive method. In accordance with FIG. 16a, the radiation-emitting device 17 is arranged directly on the device substrate 16 by means of a solderable metalization 20. The metalization 20 enables improved thermal coupling and, thus, good heat dissipation to the device substrate 16. The radiation-emitting device 17 is electrically connected to a conductor track 19. A lateral via 22 connects the conductor track 19 to a connection pad 21 located outside that cavity wherein the radiation-emitting device 17 is arranged. The lateral via 22 is formed between the cap substrate and the device substrate 17 in the region of the bonding frame 15, which in turn is an Au/Sn bonding frame. The optical output window of the glass cap is provided with antireflection-coated optical surfaces 18. FIG. 16b shows a variation of the embodiment of FIG. 16a wherein a subcarrier 23 is arranged between the radiation-emitting device 17 and the device substrate 16, which may have an effect on thermal coupling. As shown in FIGS. 16a and 16b, for example, the invention thus provides a packaged radiation-emitting device comprising the following features: a radiation-emitting device 17, which is arranged at a device substrate 16, and a cap substrate 1 providing a hermetically sealed cavity for the radiation-emitting device 17, within which cap substrate 1 the radiation-emitting device 17 is packaged, the cap substrate 1 comprising, in a side face, an optical output window made of a material transparent to the radiation of the radiation-emitting device 17, the optical output window of the cap substrate 1 and the radiation-emitting device 17 being arranged, in relation to each other, such that the radiation emitted during operation of the radiation-emitting device 17 leaves the package in an emission direction in a manner that is parallel with the surface of the device substrate 16 and/or that is perpendicular to the side face of the cap substrate 1. The packaged radiation-emitting device in this embodiment is configured such that the device substrate 16 serves as a package header and as a bearing surface for the radiation-emitting device 17, the cap substrate 1 cooperating with the package header to hermetically seal the cavity of the package. In this embodiment of FIG. 16a and FIG. 16b, the packaged radiation-emitting device additionally is configured such that a package header has been formed from a header wafer which includes several package headers, and that the cap substrate 1 has been formed from a cap wafer which includes several cap substrates 1. Specifically, dicing has been performed on the basis of a wafer stack of FIG. 13. In addition, the packaged radiation-emitting device is configured such that the cap substrate 1 comprises one or several planar wall portions as (a) side face(s), so that either a planar wall portion comprises the optical output window or that the optical output window forms a planar wall portion of the cap substrate 1. The latter can be seen by means of the planar optical surfaces 18 in FIGS. 16a and 16b. Moreover, the packaged radiation-emitting device is configured such that the optical output window is firmly bonded to the cap substrate 1. This results from the fact that the window component 8 has been bonded to the cover substrate 4 accordingly.

In FIG. 16b, the packaged radiation-emitting device additionally is configured such that a subcarrier 24 for the radiation-emitting device 17 is arranged between the device substrate 16 and the radiation-emitting device 17, so that the device substrate 16 indirectly carries the radiation-emitting device 17. The packaged radiation-emitting device 17 additionally is configured such that the device substrate 16 and the cap substrate 1 are attached to each other by means of a bonding frame 15 comprising a metallic solder material, in this case Au/Sn. Furthermore, the packaged radiation-emitting device is configured such that the optical output window is formed from a first glass material and the cap substrate 1 is formed from a second glass material, the second class material having a viscosity lower than that of the first glass material. In addition, in the embodiments of FIGS. 16a and 16b, the packaged radiation-emitting device 17 is configured such that a conductor track 19 is arranged for electrically connecting the radiation-emitting device 17 on the part of the device substrate 16 and that the conductor track 19 is led out of the cavity in the location between the cap substrate 1 and the device substrate 16. In FIGS. 16a and 16b, the packaged radiation-emitting device is thus configured such that the cavity has an inert atmosphere and the cavity contains exclusively inorganic substances.

Figure 17:
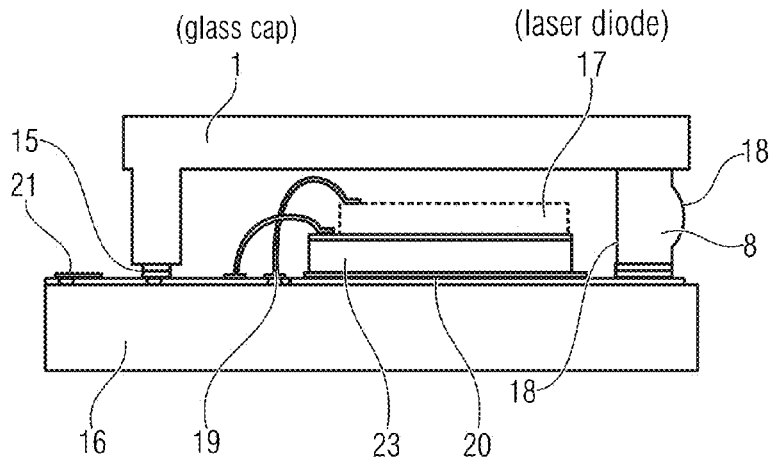
FIG. 17 shows a third exemplarily embodiment for packaged radiation-emitting devices having been produced by means of an inventive method.

FIG. 17 shows a third embodiment of packaged radiation-emitting devices that have been produced by means of an inventive method. Said embodiment is a hermetic laser package having an integrated lens as an optical surface 18. Again, a radiation-emitting device 17 is mechanically connected to a device substrate 16 via a subcarrier 23 and is connected to a connection pad 21 outside the cavity via conductor tracks 19.

As already explained above, the invention relates to a structural design (assembly) technology and a hermetic encapsulation concept for radiation-emitting devices, for example LD and laser diodes. As is described, the novelty particularly lies in integrating a vertical optical window which is an integral part of the cap and allows lateral beam extraction. A further very important aspect is the fact that a multitude of packages are sealed in parallel and simultaneously during a one-time wafer bonding process, which also involves only a one-time adjustment operation.

Due to the fact that many packages can be produced in parallel and simultaneously processed on one wafer, substantial cost advantages as compared to the established TO38 packages can be achieved. The radiation-emitting device 17, for example a laser diode, is soldered onto a device substrate 16, for example a semiconductor substrate such as a silicon wafer, either directly (FIG. 16a) or via a subcarrier (FIG. 16b), the so-called submount, which ensures optimum heat distribution and is soldered onto the semiconductor substrate, and said radiation-emitting device 17 is placed such that the laser exit surface is located opposite the optical window, as can be seen in FIGS. 16-18. The contact of the laser diode with the device substrate 16, i.e. the silicon substrate or silicon chip, for example, ensures optimum cooling of the chips. Mounting on the silicon substrate guarantees optimum thermal coupling.

The fact that the glass cap 1 is bonded onto the bonding frame 15 gives rise to a hermetically tight cavity above the previously assembled laser diodes. Typically, this bonding frame 15 consists of a metallic solder, in this example a gold-tin alloy (Au/Sn). Additional metallic layers below and/or above the frame structure both on the device carrier and on the cap substrate may ensure good wetting of the solder, which may be a decisive prerequisite for permanent hermetical sealing of the package. Metallic conductor tracks for the electrical connections of the laser diode to the electrical connection pads located outside the package extend within the package. To avoid any short-circuits said conductor tracks are covered by suitable dielectric passivations, e.g. PECVD SiO2 (Plasma Enhanced Chemical Vapor Deposition) at least below the bonding frame (=lateral via).

One aspect in this structural (assembly) concept is that all of the components and materials within the package may be entirely free from any organic substances which otherwise might impair the radiation-emitting devices, e.g. laser diodes, in terms of their life cycles due to potential degassing that might occur at a later point in time. Advantageously, the cavity has dry air, nitrogen or any other inert atmosphere contained therein. However, a negative pressure or even a complete vacuum may fundamentally also be established and be additionally maintained even over long time periods by introducing specific getter layers.

Figure 18A:
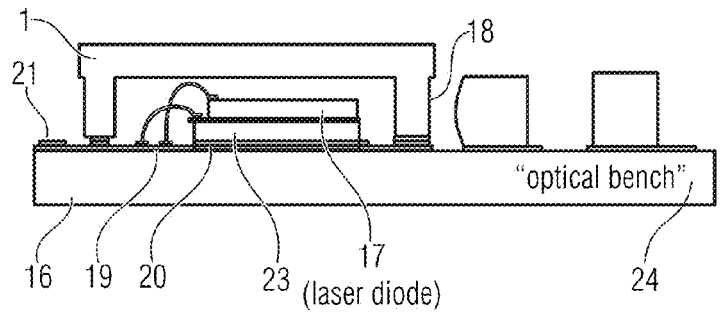
FIGS. 18a-e show further exemplary embodiments for packaged radiation-emitting devices having been produced by means of an inventive method and comprising optical benches.
Figure 18B:
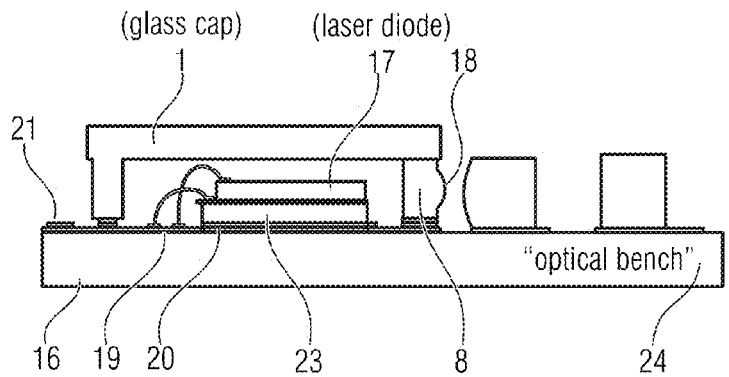

Optionally, the device substrate 16 may also be equipped with an elongation located outside the cavity, which elongation may later on serve as an optical bench for assembling optical components outside the hermetically tight package. What may be particularly advantageous about this arrangement is the fact that all of the optical components may be placed outside the hermetically tight package, so that there is nothing to be said against utilizing organic materials such as polymer lenses or polymer-on-glass lenses or adhesive connections. Thus, the optical functionality may be completely separate from the hermetic tightness of the package. FIGS. 18*a* and 18*b* show fourth and fifth embodiments of packaged radiation-emitting devices which have been produced by means of an inventive method and comprise such optical benches 24. The optical bench 24 is formed as an extension of the device substrate 16, so that the optical surface 18 may have further optically effective elements provided upstream from it outside the cavity wherein the radiation-emitting device is arranged. In accordance with FIG. 18*b*, an integrated lens is provided again as the optical surface 18 within the cap substrate 1, while the optical surface 18 of FIG. 18*b* comprises an optical surface 18 that has been produced from a simple strip-shaped window component without any lens function. FIG. 18*b* also shows an embodiment wherein the optical output window includes an optical lens. In principle, as described above, it is also possible to integrate some of the optical functions into the window, for example by integrating a cylinder lens instead of a simple window. Said cylinder lens may also serve as a so-called fast axis collimator (FAC), i.e. may parallelize the beam of the laser diode, which is highly divergent to different degrees in both axes, in the highly divergent axis—the fast axis. In the case of FIG. 18*b* which is shown here, the function of the FAC, however, is split up both into the cylinder lens located inside the window and to a further cylinder lens located outside the package. This has the advantage that the second lens enables, by means of adjustment, being able to compensate for any errors in accurate positioning of the lens in relation to the laser diode. Accordingly, two further optically effective elements are connected upstream from the optical surface 18 on the optical bench 24 in each case in accordance both with FIG. 18*a* and with FIG. 18*b*.

Figure 18C:
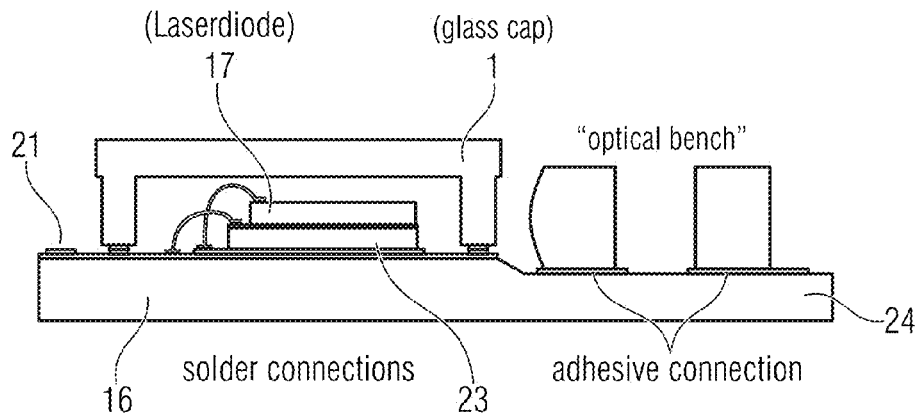
Figure 18D:
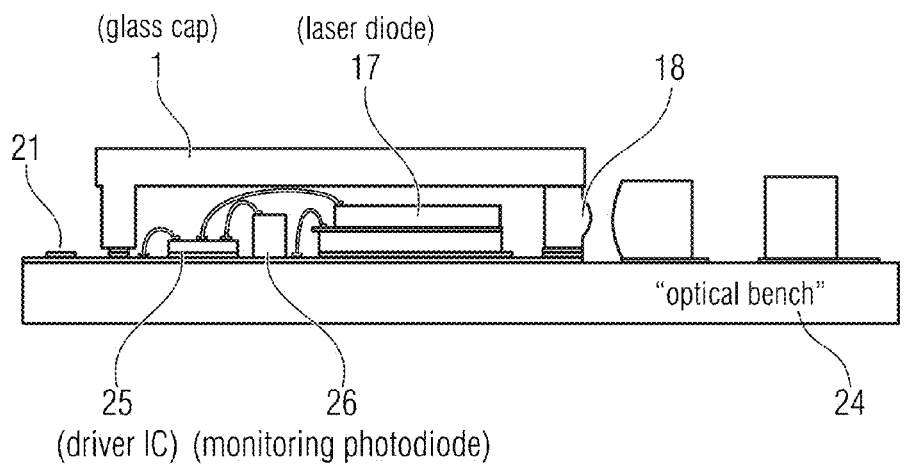
Figure 18E:
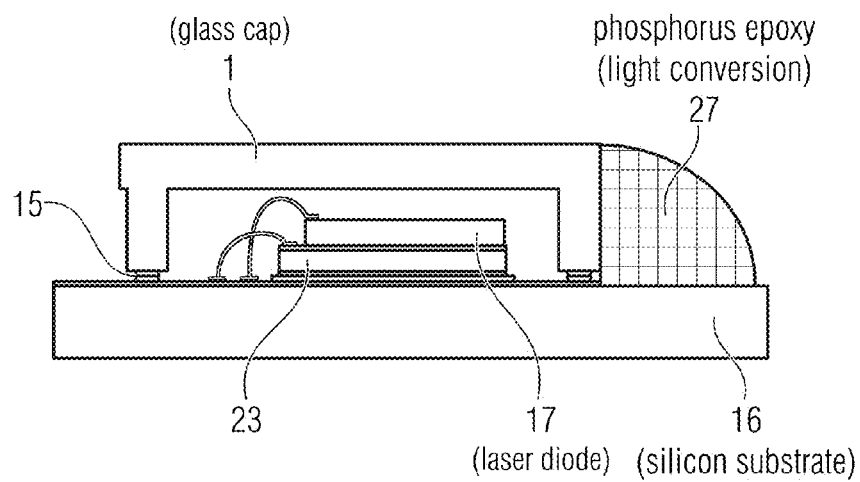

FIG. 18*c* shows a further hermetically tight laser package with a connected optical bench 24. The semiconductor substrate, i.e. silicon substrate, for example, is configured such that an additional offset (landing) is produced by means of the cap dicing, which offset may be used as a mounting surface for optical components, as was described above. FIG. 18*c* thus shows an embodiment wherein the device substrate 16, in this case a silicon substrate chip, has been lowered by means of etching in the areas of the optical systems so as to thus provide more vertical installation space for the optical systems. In this context, the optical systems are arranged on the optical bench by means of adhesive connections. FIG. 18*d* shows an embodiment wherein further electronic components are integrated into the laser package, i.e. into the cavity, which is advantageous for some applications. Specifically, these may be, e.g., additional photodiodes for monitoring the performance of the radiation-emitting device 17, for example of the laser, or driver circuits for the laser diode. In the figure, a driver IC 25 and such a monitoring photodiode 26 are shown to be located within the cavity. FIG. 18*d* thus shows an embodiment wherein an electronic driver circuit is arranged within the cavity. FIG. 18*e* shows an embodiment comprising a conversion medium which may be mounted, when using a short-wave laser diode as the radiation-emitting device 17, within the cavity formed by the cap substrate 1 and the device substrate 16. As in this case, an additional epoxide resin 27, which includes corresponding phosphori, may be applied outside the hermetically tight laser package. The packaged radiation-emitting device of FIG. 18*c* thus is configured such that it comprises an element 27 effective to perform light color conversion of the emitted light, so that the optical output window is arranged between the effective element 27 and the radiation-emitting device 17. Thus, as can be seen in FIGS. 18*a*-18*e*, the packaged radiation-emitting device is configured such that an optical bench 24 is connected upstream from the optical output window on the part of the device substrate 16, so that the optical output window is arranged between the optical bench 24 and the radiation-emitting device 17. In the embodiments shown, the packaged radiation-emitting device is configured such that the optical bench 24 is arranged on the device substrate 16 and is located in the emission direction of the radiation-emitting device 17. According to FIGS. 18*b* and 18*d*, the packaged radiation-emitting device is configured such that the optical output window includes an optical lens.

Figure 19:
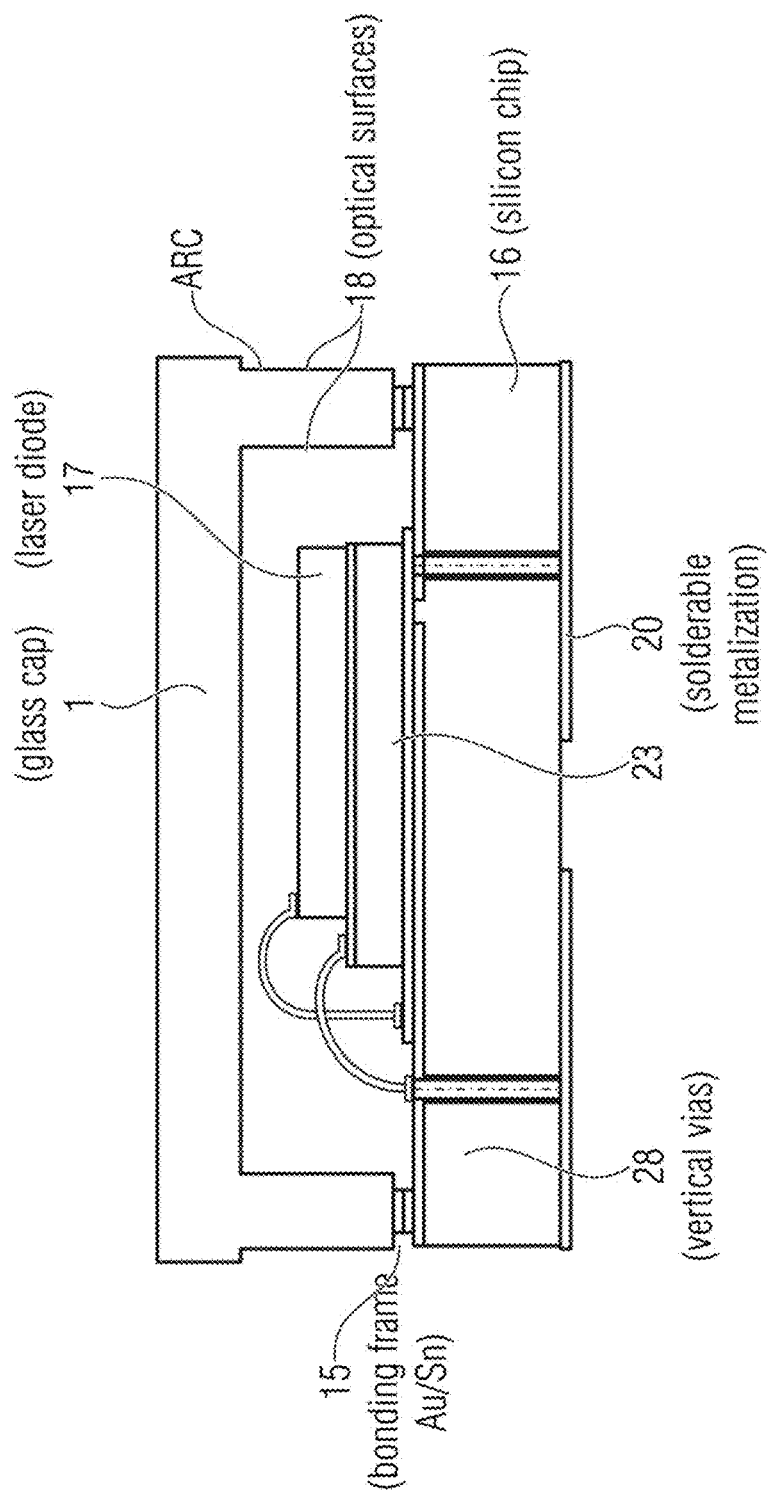
FIG. 19 shows an exemplary embodiment comprising particularly advantageous electrical contacting.

FIG. 19 shows an embodiment comprising particularly advantageous electrical contacting. For a particularly compact design of the laser diode package, i.e. of the packaged radiation-emitting device, it is advantageous to guide the electrical connections through the device substrate 16 in the form of vertical vias 28. On the rear side, the connection pads that may be used can be provided with solderable metalization 20, as shown in FIG. 19. If said connection areas are configured in a manner that involves a large amount of surface area, said areas will also be suitable to ensure cooling of the package. Apart from that, in the embodiment of FIG. 19, the cap substrate 1, i.e. the glass cap, and the device substrate 16, in this case a silicon chip, are again bonded to each other by means of a bonding frame 16, so that a hermetic cavity is provided for a radiation-emitting device 17, in this case a laser diode. The optical surfaces 18 are again provided with dereflection (ARC=antireflection coating).

FIG. 20 shows an embodiment comprising several radiation-emitting devices 17 within the same package. This is an example of a configuration of assembling several laser diodes within a package, e.g. an RGB laser source. The three radiation-emitting devices 17 each are mechanically connected to the device substrate 16 via subcarriers 23. In this manner, favorable heat dissipation is achieved. The radiation-emitting devices 17 each are electrically connected by means of conductor tracks 19 and lateral vias 22 that are led out of the cavity through a hermetically tight bonding frame 15. It may be advantageous for the respective optical components for beam processing (beam conditioning) to be placed outside the hermetically tight package and upstream from the optical window, i.e. the optical surfaces 18, as shown here. Said optical surfaces may be cylinder lenses or other kinds of lenses, for example. In this case, said optical components may also include substances that are undesired within the hermetically sealed cavity, for example organic substances.

In accordance with the above explanations, the invention enables providing various embodiments of the apparatus, for example:

1. Encapsulating individual laser diodes on a submount within a hermetically tight package, provided by bonding a cap comprising integrated vertical optical window surfaces (FIG. 16*b*).
2. Encapsulating individual laser diodes directly onto a substrate within a hermetically tight package, provided by bonding a cap comprising integrated vertical optical window surfaces (FIG. 16*a*).
3. Encapsulating individual laser diodes within a hermetically tight package, provided by bonding on a cap comprising integrated vertical optical apertures having a lens function (FIG. 17).
4. Encapsulating individual laser diodes within a hermetically tight package, provided by bonding on a cap comprising integrated vertical optical windows or apertures having a lens function (FIG. 17).
5. Encapsulating one or several laser diodes with fast focus collimation by an optical exit window configured as a shared cylinder lens, optionally each comprising a further lens or a shared cylinder lens for slow axis collimation outside the hermetic package (FIG. 18*b*).
6. Encapsulating laser diodes on a submount with an electronic driver circuit within the hermetic package (FIG. 18*d*).
7. Encapsulating one or several laser diodes with fast focus collimation by individual lenses per optical path, optionally each comprising a further lens or a shared cylinder lens for slow axis collimation outside the hermetic package (FIG. 20).
8. Encapsulating one or several laser diodes with or without fast focus collimation and light color conversion by an externally arranged phosphorus body that is fixed as a shaped body or is dispensed and hardened as a phosphorus bound in an epoxide or silicon matrix (FIG. 18*e*).
9. The externally arranged, optically active devices may be soldered or be fixed by means of adhesion since organic degassing processes do not cause any cloudiness within the beam exit (FIG. 18*c*)
10. The devices arranged within the cavity and the encapsulation itself are advantageously joined, advantageously by metallic joining processes such as soldering, eutectic AuSn soldering, etc., for example, so as to avoid any organic degassing within the package. Fluxing agents are not employed (FIG. 18*d*).

The described features of the invention may be essential to the subject matter of the invention either individually or in any combination.

According to a first aspect, a method of producing a cap substrate 1 may comprise providing a mold substrate 2 comprising a structured surface region 3; arranging a cover substrate 4 on the structured surface region 3 of the mold substrate 2, the cover substrate 4 comprising a glass material, and connecting the cover substrate 4 to the mold substrate 2, the structured surface 3 of the mold substrate 2 being brought into contact with a surface of the cover substrate 4 in such a way that they at least partially overlap; forming first island regions 5 and respectively associated adjacent second island regions 6 from the mold substrate 2, a recess 7 being provided between the first island regions 5 and the respectively associated adjacent second island regions 6; arranging a window component 8; 8' within the recess 7 located between a first island region 5 and the associated adjacent second island region 6; arranging a carrier substrate 9 on the first island regions 5 and on the second island regions 6, which are formed from the mold substrate 2, so that the first island regions 5 and the second island regions 6 are located between the carrier substrate 9 and the cover substrate 4; tempering the bonded substrates such that the glass material of the cover substrate 4 is caused to flow into the remaining recesses 7 located between the island regions; and removing the cover substrate 4 from the mold substrate 2 and the carrier substrate 9 so as to obtain the structured cap substrate 1.

According to a second aspect when referring back to the first aspect, in the method of producing a cap substrate 1 said providing of the mold substrate 2 may further include providing a semiconductor wafer 2 comprising a passivation layer 10 on a surface 3; lithographing the passivation layer 10 so that the passivation layer 10 will remain on the surface 3 wherever the first island regions 5 and the second island regions 6 are provided; etching the surface 3 of the semiconductor wafer 2 with regard to the lithographed regions, so that a thickness of the semiconductor wafer 2 is reduced perpendicularly to the lithographed regions of the surface so as to structure the surface region 3 and to thus specify positions for the first island regions 5 and the second island regions 6; and completely removing the passivation layer 10.

According to a third aspect when referring back to at least one of the first to second aspects, in the method of producing a cap substrate 1 said arranging and connecting of the cover substrate 4 may include anodically bonding, region by region, the structured surface region 3 of the mold substrate 2 with a surface region of the cover substrate 4.

According to a fourth aspect when referring back to the third aspect, in the method of producing a cap substrate 1 said forming of island regions 5, 6 from the mold substrate 2 may include sawing into the first island regions 5 and the second island regions 6 in the mold substrate 2 following said region-by-region anodic bonding; and removing those portions of the mold substrate 2 that are separate from the bonded regions 5, 6 following the sawing.

According to a fifth aspect, a method of producing a cap substrate 1 may comprise providing a mold substrate 2 comprising a structured surface region 3; arranging a carrier substrate 9 on the structured surface region 3 of the mold substrate 2 and connecting the carrier substrate 9 to the mold substrate 2, the structured surface 3 of the mold substrate 2 being brought into contact with a surface of the carrier substrate 9 in such a way that they at least partially overlap; forming first island regions 5 and respectively associated adjacent second island regions 6 from the mold substrate 2, a recess 7 being provided between the first island regions 5 and the respectively associated adjacent second island regions 6; arranging a window component 8; 8' within the recess 7 located between a first island region 5 and the associated adjacent second island region 6; arranging a cover substrate 4 on the first island regions 5 and on the second island regions 6, which are formed from the mold substrate 2, so that the first island regions 5 and the second island regions 6 are located between the carrier substrate 9 and the cover substrate 4, the cover substrate 4 comprising a glass material; tempering the bonded substrates such that the glass material of the cover substrate 4 is caused to flow into the remaining recesses 7 located between the island regions; and removing the cover substrate 4 from the mold substrate 2 and the carrier substrate 9 so as to obtain the structured cap substrate 1.

According to a sixth aspect when referring back to the fifth aspect, in the method of producing a cap substrate 1 said providing of the mold substrate 2 may comprise providing a semiconductor wafer 2 comprising a passivation layer 10 on a surface 3; lithographing the passivation layer 10 so that the passivation layer 10 will remain on the surface 3 where the first island regions 5 and the second island regions 6 are provided; etching the surface 3 of the semiconductor wafer 2 with regard to the lithographed regions, so that a thickness of the semiconductor wafer 2 is reduced perpendicularly to the lithographed regions of the surface so as to structure the surface region 3 and to thus specify positions for the first island regions 5 and the second island regions 6; and completely removing the passivation layer 10.

According to a seventh aspect when referring back to at least one of the fifth to sixth aspects, in the method of producing a cap substrate 1 said arranging and connecting of the cover substrate 4 may include connecting, region by region, the structured surface region 3 of the mold substrate 2 to a surface region of the carrier substrate 9, the mold substrate 2 and the carrier substrate 9 comprising a semiconductor material.

According to an eighth aspect when referring back to the seventh aspect, in the method of producing a cap substrate 1 said forming of island regions 5, 6 from the mold substrate 2 may comprise sawing into the first island regions 5 and the second island regions 6 in the mold substrate 2 following said region-by-region anodic bonding; and removing those portions of the mold substrate 2 that are separate from the bonded regions 5, 6 following the sawing.

According to a ninth aspect, a method of producing a cap substrate 1 may comprise providing a reusable tool as the mold substrate 2, first island regions 5 and respectively associated adjacent second island regions 6 being formed on a surface 3 of the reusable tool, which is effective as a negative structure for a cap structure, a recess being provided, in the reusable wafer, between the first island regions 5 and the respectively associated adjacent second island regions 6; arranging a window component 8 on the reusable tool in the recess 7, respectively, located between a first island region 5 and the associated adjacent second island region 6; arranging a cover substrate 4 on the island regions 5, 6 of the reusable tool, the cover substrate 4 comprising a glass material; wherein the surface 3 of the reusable tool is brought into contact with a surface of the cover substrate in such a way that they at least partially overlap; tempering the bonded substrates such that the glass material of the cover substrate 4 is caused to flow into the recesses 7 located between the island regions 5, 6; and separating the cover substrate 4 from the mold substrate 2 so as to obtain the structured cap substrate 1.

According to a tenth aspect when referring back to at least one of the first to ninth aspects, in the method of producing a cap substrate 1 said arranging of the window component 8 in each case may include providing several strip-shaped window components 8; and inserting the strip-shaped window components 8 into the recesses 7 located between the first island regions 5 and the second island regions 6, so that surfaces of the window components 8 that are provided as surfaces of optical output windows are located opposite surfaces of the island regions 5, 6 that are formed from the mold substrate 2.

According to an eleventh aspect when referring back to the tenth aspect, in the method of producing a cap substrate 1 said providing of strip-shaped window components 8 may include providing a window component wafer; and cutting to length of the strip-shaped window components 8 from the window component wafer.

According to a twelfth aspect when referring back to at least one of the first to eleventh aspects, in the method of producing a cap substrate 1 said arranging of the respective window component 8 may include inserting semiconductor strips 11 into the recesses 7 prior to inserting the strip-shaped window components 8 into the recesses, so that the semiconductor strips 11 are arranged between surfaces of the window components 8 that are provided as surfaces of optical output windows, and surfaces of the island regions 5, 6 that are formed from the mold substrate 2.

According to a thirteenth aspect when referring back to at least one of the first to twelfth aspects, in the method of producing a cap substrate 1 said arranging of the respective window component 8 may include providing one or more strip-shaped window elements coated with semiconductor material 11.

According to a fourteenth aspect when referring back to the thirteenth aspect, in the method of producing a cap substrate 1 said providing of a window element coated with semiconductor material may include coating surfaces of the window component 8 by bonding semiconductor strips 11 onto them.

According to a fifteenth aspect when referring back to at least one of the first to fourteenth aspects, in the method of producing a cap substrate 1 said arranging of the window component 8 may include cutting to length of strip-shaped window components 8 from a lens array in each case.

According to a sixteenth aspect when referring back to at least one of the ninth to fifteenth aspects, in the method of producing a cap substrate 1 said tempering may include applying a negative pressure to the bonded substrates so as to draw the glass material into the remaining recesses 7 located between the island regions.

According to a seventeenth aspect when referring back to at least one of the first to sixteenth aspects, in the method of producing a cap substrate 1 the first and second island regions 5, 6 may comprise edge chamfers 50 in a region adjacent to the carrier substrate 9, and the step of tempering may comprise the glass material of the window component 8, 8' flowing into the region located between the chamfers 50 and the carrier substrate 9 so as to form a circumferential protrusion 52 from the glass material.

According to an eighteenth aspect when referring back to at least one of the first to seventeenth aspects, in the method of producing a cap substrate 1 said providing of the mold substrate 2 may further include removing, in the step of lithographing the passivation layer 10, the passivation layer 10 from the surface 3 where channel structures 40 are provided within the first and second island regions 5, 6, and, during etching of the surface 3 of the semiconductor wafer 2 with regard to the lithographic regions, additionally etching channels 42 into the mold substrate 2 within the first and second island regions 5, 6.

According to a nineteenth aspect, a method of producing a cap substrate 1 may comprise providing a mold substrate 2 comprising a structured surface region 3; arranging a cover substrate 4 on the structured surface region 3 of the mold substrate 2, the cover substrate 4 comprising a glass material, and connecting the cover substrate 4 to the mold substrate 2, the structured surface 3 of the mold substrate 2 being brought into contact with at least one surface of the cover substrate 4 in such a way that they at least partially overlap; forming first island regions 5 and respectively associated adjacent second island regions 6 from the mold substrate 2, a recess 7 being provided between the first island regions 5 and the respectively associated adjacent second island regions 6; arranging semiconductor strips 11 in the recess 7, respectively, located between a first island region 5 and the associated adjacent second island region 6, so that the semiconductor strips 11 with one of their surfaces at least partially overlap respective lateral surfaces of the island regions 5, 6 perpendicularly to the cover substrate 4, and so that semiconductor strips 11 are located opposite one another with regard to the recess 7 and that a distance, which corresponds to a remaining recess 7, is formed between the semiconductor strips 11; arranging a carrier substrate 9 on the first island regions 5 and on the second island regions 6, which are formed from the mold substrate 2, so that the first island regions 5 and the second island regions 6 are located between the carrier substrate 9 and the cover substrate 4; tempering the bonded substrates such that the glass material of the cover substrate 4 is caused to flow into the remaining recesses 7 located between the island regions; and removing the cover substrate 4 from the mold substrate 2 and from the carrier substrate 9 so as to obtain the structured cap substrate 1.

According to a twentieth aspect, a method of producing a cap substrate 1 may comprise providing a reusable tool as the mold substrate 2, first island regions 5 and respectively associated adjacent second island regions 6 being formed on a surface 3 of the reusable tool, which is effective as a negative structure for a cap structure, a recess being provided, within the reusable wafer, between the first island regions 5 and the respectively associated adjacent second island regions 6; arranging semiconductor strips 11 in the recess 7, respectively, located between a first island region 5 and the associated adjacent second island region 6, so that the semiconductor strips 11 with one of their surfaces at least partially overlap respective lateral surfaces of the island regions 5, 6 perpendicularly to the cover substrate 4, and so that semiconductor strips 11 are located opposite one another with regard to the recess 7 and that a distance, which corresponds to a remaining recess 7, is formed between the semiconductor strips 11; arranging a cover substrate 4 on the island regions 5, 6 of the reusable tool, the cover substrate 4 comprising a glass material; wherein the surface 3 of the reusable tool is brought into contact with a surface of the cover substrate in such a way that they at least partially overlap; tempering the bonded substrates such that the glass material of the cover substrate 4 is caused to flow into the recesses 7 located between the island regions 5, 6; and separating the cover substrate 4 from the mold substrate 2 so as to obtain the structured cap substrate 1.

According to a twenty-first aspect, a method of producing a packaged radiation-emitting device at the wafer level may comprise producing a cap substrate 1; providing a device substrate 16 in the form of a wafer comprising a multitude of radiation-emitting devices 17; arranging the substrates one above the other, so that the substrates are bonded along an intermediate bonding frame 15; and dicing the packaged radiation-emitting devices.

According to a twenty-second aspect when referring back to the fifteenth aspect, the method may include producing the cap substrate 1 in accordance with the first, fifth or thirteenth aspects; and dicing the packaged radiation-emitting devices, a dicing pathway having been formed through the second island regions 6 within the cap substrate 1.

According to a twenty-third aspect when referring back to at least one of the twenty-first to twenty-second aspects, the substrates may be arranged under a predefined atmosphere.

According to a twenty-fourth aspect, a packaged radiation-emitting device may have been produced in accordance with a method of any of the twenty-first to twenty-third aspects. According to a twenty-fifth aspect, a packaged radiation-emitting device may comprise a radiation-emitting device 17 arranged on a device substrate 16; and a cap substrate 1 providing a hermetically sealed cavity for the radiation-emitting device 17 within which the radiation-emitting device 17 is packaged, said cap substrate 1 comprising, in a side face, an optical output window made of a material transparent to the radiation of the radiation-emitting device 17, said optical output window of the cap substrate 1 and the radiation-emitting device 17 being arranged in relation to each other such that the radiation emitted during operation of the radiation-emitting device 17 leaves the package in an emission direction in a manner that is parallel with the surface of the device substrate 16 and/or that is perpendicular to the side face of the cap substrate 1.

According to a twenty-sixth aspect when referring back to the twenty-fifth aspect, in the packaged radiation-emitting device the device substrate 16 may serve as a package header and as a bearing surface for the radiation-emitting device 17, and the cap substrate 1 may cooperate with the package header to hermetically seal the cavity of the package.

According to a twenty-seventh aspect when referring back to the twenty-sixth aspect, in the packaged radiation-emitting device the package header may be formed from a header wafer which includes several package headers and/or the cap substrate 1 may be formed from a cap wafer which includes several cap substrates 1.

According to a twenty-eighth aspect when referring back to at least one of the twenty-sixth to twenty-seventh aspects, in the packaged radiation-emitting device the cap substrate 1 may comprise one or several planar wall portions as (a) side face(s), so that either a planar wall portion comprises the optical output window or that the optical output window forms a planar wall portion of the cap substrate 1.

According to a twenty-ninth aspect when referring back to at least one of the twenty-fifth to twenty-eighth aspects, in the packaged radiation-emitting device the optical output window may be bonded to the cap substrate 1 in a firmly bonded manner or as one piece.

According to a thirtieth aspect when referring back to at least one of the twenty-fifth to twenty-ninth aspects, in the packaged radiation-emitting device a subcarrier 23 for the radiation-emitting device 17 may be arranged between the device substrate 16 and the radiation-emitting device 17, so that the device substrate 16 indirectly carries the radiation-emitting device 17.

According to a thirty-first aspect when referring back to at least one of the twenty-fifth to thirtieth aspects, in the packaged radiation-emitting device the device substrate 16 and the cap substrate 1 may be attached to each other by means of a bonding frame 15 comprising a metallic solder material.

According to a thirty-second aspect when referring back to at least one of the twenty-fifth to thirty-first aspects, in the packaged radiation-emitting device the optical output window may be formed from a first glass material and the cap substrate 1 may be formed from a second glass material and the second glass material may have a viscosity lower than that of the first glass material.

According to a thirty-third aspect when referring back to at least one of the twenty-fifth to thirty-second aspects, in the packaged radiation-emitting device a conductor track 19 may be arranged for electrically connecting the radiation-emitting device 17 on the part of the device substrate 16, and the conductor track 19 may be led out of the cavity in the location between the cap substrate 1 and the device substrate 16.

According to a thirty-fourth aspect when referring back to at least one of the twenty-fifth to thirty-third aspects, in the packaged radiation-emitting device the optical output window may have an optical bench 24 located upstream from it on the part of the device substrate 16, so that the optical output window is arranged between the optical bench 24 and the radiation-emitting device 17.

According to a thirty-fifth aspect when referring back to the thirty-fourth aspect, in the packaged radiation-emitting device the optical bench 24 may be arranged on the device substrate 16 and may be located in the emission direction of the radiation-emitting device 17.

According to a thirty-sixth aspect when referring back to at least one of the twenty-fifth to thirty-fifth aspects, in the packaged radiation-emitting device the optical output window may include an optical lens.

According to a thirty-seventh aspect when referring back to at least one of the twenty-fifth to thirty-sixth aspects, the packaged radiation-emitting device may further comprise an element 27 effective for light color transformation of the emitted light, so that the optical output window is arranged between the effective element 27 and the radiation-emitting device 17.

According to a thirty-eighth aspect when referring back to at least one of the twenty-fifth to thirty-seventh aspects, in the packaged radiation-emitting device the cavity may comprise an inert atmosphere and/or the cavity may contain exclusively inorganic substances.

According to a thirty-ninth aspect when referring back to at least one of the twenty-fifth to thirty-eighth aspects, in the packaged radiation-emitting device the cavity may have an electronic driver circuit arranged therein.

According to a fortieth aspect, a wafer array may comprise a multitude of packaged radiation-emitting devices of any of the twenty-fifth to thirty-ninth aspects and may comprise a device substrate 16 in the form of a wafer that is configured as a shared device substrate 16 for the radiation-emitting devices 17 arranged thereat, a shared cap substrate 1 comprising the cap substrates 1 for the radiation-emitting devices 17, the substrates 1, 16 being arranged at each other such that the cap substrate 1 and the device substrate 16 are bonded along an intermediate bonding frame 15.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

LIST OF REFERENCE NUMERALS

| | |
|---|---|
| A1, A2 | first step of the method |
| B1, B2 | second step of the method |
| C1, C2 | third step of the method |
| D1, D2 | fourth step of the method |
| E1, E2 | fifth step of the method |
| F1, F2 | sixth step of the method |
| G1 | seventh step of the method |

-continued

| | |
|---|---|
| 1 | cap substrate |
| 2 | mold substrate |
| 3 | surface region |
| 4 | cover substrate |
| 5 | first island region |
| 6 | second island region |
| 7 | recess |
| 8, 8' | window component |
| 9 | carrier substrate |
| 10 | passivation |
| 11 | silicon support/semiconductor strip/silicon comb |
| 12 | load ring |
| 13 | protective element |
| 14 | vacuum channel |
| 15 | bonding frame |
| 16 | device substrate |
| 17 | radiation-emitting device |
| 18 | optical surface |
| 19 | conductor track |
| 20 | metalization |
| 21 | connection pad |
| 22 | lateral via |
| 23 | subcarrier |
| 24 | optical bench |
| 25 | driver IC |
| 26 | monitoring photodiode |
| 27 | epoxy resin |
| 28 | vertical via |
| 40 | channel structures |
| 42 | channels |
| 44 | stop structure |
| 50 | chamfering |
| 52 | protrusion/undercutting |
| 54 | metalization |
| 56 | coating |
| 60 | individual cap element |

LIST OF LITERATURE

[1] DE 199 56 654 A1
[2] DE 199 56 654 B4
[3] DE 101 18 529 C1
[4] DE 102 41 390 B3
[5] DE 102 59 890 A1
[6] DE 103 13 889 B3
[7] DE 10 2008 012 384 A1

The invention claimed is:

1. A method of producing a cap substrate, comprising:
providing a mold substrate comprising a structured surface region;
arranging a cover substrate on the structured surface region of the mold substrate, the cover substrate comprising a glass material, and connecting the cover substrate to the mold substrate,
the structured surface of the mold substrate being brought into contact with a surface of the cover substrate in such a way that they at least partially overlap;
forming first island regions and respectively associated adjacent second island regions from the mold substrate, recesses being provided between the first island regions and the respectively associated adjacent second island regions;
arranging a window component within a recess of the recesses located between a first island region and the associated adjacent second island region;
arranging a carrier substrate on the first island regions and on the second island regions, wherein the first island regions and the second island regions are formed from the mold substrate, so that the first island regions and the second island regions are located between the carrier substrate and the cover substrate;

tempering the bonded substrates such that the glass material of the cover substrate is caused to flow into the remaining recesses located between the island regions; and removing the cover substrate from the mold substrate and the carrier substrate so as to achieve the structured cap substrate comprising the window component on a side face of the cap substrate.

2. The method as claimed in claim 1, wherein said providing of the mold substrate further comprises:

providing a semiconductor wafer comprising a passivation layer on a surface;

lithographing the passivation layer so that the passivation layer will remain on the surface wherever the first island regions and the second island regions are provided;

etching the surface of the semiconductor wafer with regard to the lithographed regions, so that a thickness of the semiconductor wafer is reduced perpendicularly to the lithographed regions of the surface so as to structure the surface region and to thus specify positions for the first island regions and the second island regions; and completely removing the passivation layer.

3. The method as claimed in claim 1, wherein said arranging and connecting of the cover substrate comprises:

anodically bonding, region by region, the structured surface region of the mold substrate with a surface region of the cover substrate.

4. The method as claimed in claim 1, wherein said arranging of the window component in each case comprises:

providing several strip-shaped window components; and inserting the strip-shaped window components into the recesses located between the first island regions and the second island regions, so that surfaces of the window components that are provided as surfaces of optical output windows are located opposite surfaces of the island regions that are formed from the mold substrate.

5. The method as claimed in claim 1, wherein said arranging of the respective window component comprises:

inserting semiconductor strips into the recesses prior to inserting the strip-shaped window components into the recesses, so that the semiconductor strips are arranged between surfaces of the window components that are provided as surfaces of optical output windows, and surfaces of the island regions that are formed from the mold substrate.

6. The method as claimed in claim 1, wherein said arranging of the respective window component comprises:

providing one or more strip-shaped window elements coated with semiconductor material.

7. The method as claimed in claim 1, wherein said arranging of the window component comprises:

cutting to length of strip-shaped window components from a lens array in each case.

8. The method as claimed in claim 1, wherein the first and second island regions comprise edge chamfers in a region adjacent to the carrier substrate, said tempering comprising the glass material of the window component flowing into the region located between the chamfers and the carrier substrate so as to form a circumferential protrusion from the glass material.

9. The method as claimed in claim 2, wherein said providing of the mold substrate further comprises:

wherein, in lithographing the passivation layer, the passivation layer is further removed from the surface where channel structures are provided within the first and second island regions, wherein during etching of the surface of the semiconductor wafer with regard to the lithographic regions, channels are etched, in addition, into the mold substrate within the first and second island regions.

10. A method of producing a cap substrate, comprising:

providing a mold substrate comprising a structured surface region;

arranging a carrier substrate on the structured surface region of the mold substrate and connecting the carrier substrate to the mold substrate, the structured surface of the mold substrate being brought into contact with a surface of the carrier substrate in such a way that they at least partially overlap;

forming first island regions and respectively associated adjacent second island regions from the mold substrate, recesses being provided between the first island regions and the respectively associated adjacent second island regions;

arranging a window component within a recess of the recesses located between a first island region and the associated adjacent second island region;

arranging a cover substrate on the first island regions and on the second island regions, wherein the first island regions and the second island regions are formed from the mold substrate, so that the first island regions and the second island regions are located between the carrier substrate and the cover substrate, the cover substrate comprising a glass material;

tempering the bonded substrates such that the glass material of the cover substrate is caused to flow into the remaining recesses located between the island regions; and removing the cover substrate from the mold substrate and the carrier substrate so as to achieve the structured cap substrate comprising the window component on a side face of the cap substrate.

11. The method as claimed in claim 10, wherein said providing of the mold substrate comprises:

providing a semiconductor wafer comprising a passivation layer on a surface;

lithographing the passivation layer so that the passivation layer will remain on the surface where the first island regions and the second island regions are provided;

etching the surface of the semiconductor wafer with regard to the lithographed regions, so that a thickness of the semiconductor wafer is reduced perpendicularly to the lithographed regions of the surface so as to structure the surface region and to thus specify positions for the first island regions and the second island regions; and completely removing the passivation layer.

12. The method as claimed in claim 10, wherein said arranging and connecting of the cover substrate comprises:

connecting, region by region, the structured surface region of the mold substrate to a surface region of the carrier substrate, the mold substrate and the carrier substrate comprising a semiconductor material.

13. The method as claimed in claim 10, wherein said arranging of the window component in each case comprises:

providing several strip-shaped window components; and inserting the strip-shaped window components into the recesses located between the first island regions and the second island regions, so that surfaces of the window components that are provided as surfaces of optical output windows are located opposite surfaces of the island regions that are formed from the mold substrate.

14. The method as claimed in claim 10, wherein said arranging of the respective window component comprises:
inserting semiconductor strips into the recesses prior to inserting the strip-shaped window components into the recesses, so that the semiconductor strips are arranged between surfaces of the window components that are provided as surfaces of optical output windows, and surfaces of the island regions that are formed from the mold substrate.

15. A method of producing a cap substrate, comprising:
providing a reusable tool as the mold substrate, first island regions and respectively associated adjacent second island regions being formed on a surface of the reusable tool, which is effective as a negative structure for a cap structure, recesses being provided, in the reusable wafer, between the first island regions and the respectively associated adjacent second island regions;
arranging a window component on the reusable tool in a recess of the recesses, respectively, located between a first island region and the associated adjacent second island region;
arranging a cover substrate on the island regions of the reusable tool, the cover substrate comprising a glass material;
wherein the surface of the reusable tool is brought into contact with a surface of the cover substrate in such a way that they at least partially overlap;
tempering the bonded substrates such that the glass material of the cover substrate is caused to flow into the recesses located between the island regions; and
separating the cover substrate from the mold substrate so as to achieve the structured cap substrate comprising the window component on a side face of the cap substrate.

16. The method as claimed in claim 15, wherein said arranging of the window component in each case comprises:
providing several strip-shaped window components; and
inserting the strip-shaped window components into the recesses located between the first island regions and the second island regions, so that surfaces of the window components that are provided as surfaces of optical output windows are located opposite surfaces of the island regions that are formed from the mold substrate.

17. The method as claimed in claim 15, wherein said arranging of the respective window component comprises:
inserting semiconductor strips into the recesses prior to inserting the strip-shaped window components into the recesses, so that the semiconductor strips are arranged between surfaces of the window components that are provided as surfaces of optical output windows, and surfaces of the island regions that are formed from the mold substrate.

18. The method as claimed in claim 15, wherein said arranging of the respective window component comprises:
providing one or more strip-shaped window elements coated with semiconductor material.

19. The method as claimed in claim 15, wherein said arranging of the window component comprises:
cutting to length of strip-shaped window components from a lens array in each case.

20. The method as claimed in claim 15, wherein said tempering comprises:
applying a negative pressure to the bonded substrates so as to draw the glass material into the remaining recesses located between the island regions.

21. The method as claimed in claim 15, wherein the first and second island regions comprise edge chamfers in a region adjacent to the carrier substrate, said tempering comprising the glass material of the window component flowing into the region located between the chamfers and the carrier substrate so as to form a circumferential protrusion from the glass material.

22. A method of producing a cap substrate, comprising:
providing a mold substrate comprising a structured surface region;
arranging a cover substrate on the structured surface region of the mold substrate, the cover substrate comprising a glass material, and connecting the cover substrate to the mold substrate, the structured surface of the mold substrate being brought into contact with at least one surface of the cover substrate in such a way that they at least partially overlap;
forming first island regions and respectively associated adjacent second island regions from the mold substrate, recesses being provided between the first island regions and the respectively associated adjacent second island regions;
arranging semiconductor strips in a recess of the recesses, respectively, located between a first island region and the associated adjacent second island region, so that the semiconductor strips with one of their surfaces at least partially overlap respective lateral surfaces of the island regions perpendicularly to the cover substrate, and so that semiconductor strips are located opposite one another with regard to the recess and that a distance, which corresponds to a remaining recess, is formed between the semiconductor strips;
arranging a carrier substrate on the first island regions and on the second island regions, which are formed from the mold substrate, so that the first island regions and the second island regions are located between the carrier substrate and the cover substrate;
tempering the bonded substrates such that the glass material of the cover substrate is caused to flow into the remaining recesses located between the island regions; and
removing the cover substrate from the mold substrate and from the carrier substrate so as to achieve the structured cap substrate comprising the window component on a side face of the cap substrate.

23. method of producing a cap substrate, comprising:
providing a reusable tool as the mold substrate, first island regions and respectively associated adjacent second island regions being formed on a surface of the reusable tool, which is effective as a negative structure for a cap structure, recesses being provided, within the reusable wafer, between the first island regions and the respectively associated adjacent second island regions;
arranging semiconductor strips in a recess of the recesses, respectively, located between a first island region and the associated adjacent second island region, so that the semiconductor strips with one of their surfaces at least partially overlap respective lateral surfaces of the island regions perpendicularly to the cover substrate, and so that semiconductor strips are located opposite one another with regard to the recess and that a distance, which corresponds to a remaining recess, is formed between the semiconductor strips;

arranging a cover substrate on the island regions of the reusable tool, the cover substrate comprising a glass material;

wherein the surface of the reusable tool is brought into contact with a surface of the cover substrate in such a way that they at least partially overlap;

tempering the bonded substrates such that the glass material of the cover substrate is caused to flow into the recesses located between the island regions; and separating the cover substrate from the mold substrate so as to achieve the structured cap substrate comprising the window component on a side face of the cap substrate.

24. The method as claimed in claim 1, wherein tempering the bonded substrates causes the glass material of the cover substrate to flow into the remaining recesses located between the island regions, so that the glass material of the cover substrate and the glass material of the window component are integrally bonded.

25. A method of producing a packaged radiation-emitting device, comprising:

providing a cap substrate with the method of producing a cap substrate according to claim 1;

providing a device substrate, wherein a radiation-emitting device is arranged on the device substrate; and bonding the cap substrate to the device substrate for providing a hermetically sealed cavity for the radiation-emitting device within which the radiation-emitting device is packaged, said cap substrate comprising, in a side face, the window component made of a material transparent to the radiation of the radiation-emitting device, said window component of the cap substrate and the radiation-emitting device being arranged in relation to each other such that the radiation emitted during operation of the radiation-emitting device leaves the package in an emission direction in a manner that is parallel with the surface of the device substrate and/or that is perpendicular to the side face of the cap substrate.

26. The method of producing a packaged radiation-emitting device as claimed in claim 25, wherein the window component is formed from a first glass material and the cap substrate is formed from a second glass material and wherein the second glass material exhibits a viscosity lower than that of the first glass material; and wherein tempering the bonded substrates causes the glass material of the cover substrate to flow into the remaining recesses located between the island regions, so that the glass material of the cover substrate and the glass material of the window component are integrally bonded.

* * * * *